United States Patent [19]
Gau et al.

[11] 3,971,926
[45] July 27, 1976

[54] SIMULATOR FOR AN OIL WELL CIRCULATION SYSTEM
[75] Inventors: Gerald S. Gau; Mario Zamora, both of Houston, Tex.
[73] Assignee: Halliburton Company, Duncan, Okla.
[22] Filed: May 28, 1975
[21] Appl. No.: 581,464

[52] U.S. Cl................................ 235/184; 175/50; 235/151
[51] Int. Cl.².................. G06F 15/46; E21B 47/04
[58] Field of Search.................. 235/184, 151, 152; 444/1; 175/24, 25, 38, 40, 48, 50, 58, 65, 422; 166/250, 53, 64, 65 R, 66; 73/155; 340/172.5

[56] References Cited
UNITED STATES PATENTS

| | | | |
|---|---|---|---|
| 3,106,638 | 10/1963 | Braun | 235/184 X |
| 3,602,322 | 8/1971 | Gorsuch | 175/48 |
| 3,726,136 | 4/1973 | McKean et al. | 175/48 X |

OTHER PUBLICATIONS
Payne et al., "Drilling Well Simulator Teaches Blowout Control", World Oil, Mar. 1972.

*Primary Examiner*—Joseph F. Ruggiero
*Attorney, Agent, or Firm*—John H. Tregoning; Floyd A. Gonzalez

[57] ABSTRACT

An apparatus is presented which simulates the circulation system through which a fluid is circulated in an oil well. The apparatus includes manually adjustable control means which simulate the circulation system controls used in the circulation of fluid through the oil well. The controls are interfaced with, and drive a digital programmable calculator which calculates the pressure and volume of fluid at a plurality of points in the oil well. The calculator in turn is interfaced with display means which simulate the circulation system instrumentation during the simulated circulation process. The apparatus additionally includes means for calculating a formation pressure which is randomly higher than the fluid pressure at the depth of the formation. Responsive to this increased formation pressure, the apparatus simulates the invasion of formation fluid into the well bore and simulates the reaction of the circulation system as the formation fluid is circulated to the surface. If the formation fluid is gas, the apparatus simulates the expansion of the gas as it is circulated to the surface. The apparatus further includes means for automatically, randomly changing a characteristic of the circulation system such as when a failure occurs at a point in the circulation system, thus simulating the action of the circulation system during such a failure. A time multiplier means is included to compress the time required to effect circulation of the fluid in the oil well. Audio means are provided to simulate the sound of the fluid pump, gas escaping from the circulation system, and to sound an error alarm in the event a pressure limit of the circulation system has been exceeded, or a blowout condition exists. An apparatus results which is particularly useful in training oil well personnel in the circulation of a fluid in an oil well, control of an oil well during drilling, circulating out a kick of formation fluid while preventing a blowout, and in recognizing a failure of a component of the circulation system during circulation of a drilling fluid.

45 Claims, 23 Drawing Figures

SIMULATOR FOR AN OIL WELL CIRCULATION SYSTEM

BACKGROUND AND SUMMARY OF THE INVENTION

The invention disclosed in this application pertains to the simulation of a physical system for use in the training and study of the operation of the system. It more particularly deals with the simulation of a fluid circulation system of an oil well.

One of the most feared and dangerous conditions in the drilling of an oil well is a blowout. In this condition formation fluid, which can be oil, gas or water, escapes from the oil well directly into the atmosphere in an uncontrolled manner. The force of the escaping fluid can be so great that equipment is destroyed, rig personnel can be injured or killed, and, in the case of oil or gas, uncontrolled fires can result which are difficult, expensive, and hazardous to extinguish.

The initiation of a blowout condition starts with the introduction of formation fluid into the well bore. This normally occurs when the well is being drilled, or during a trip when the drill pipe is being pulled out of the well. This introduction of formation fluid is known as a well kick. If the initiation of a well kick is recognized in its early stages, corrective measures can be taken and the kick can be controlled before a dangerous condition develops.

Unfortunately, indications that a well kick has started can be very subtle, and may not be recognized. Therefore, it is important that drilling personnel be trained in the detection and control of well kicks to prevent blowouts. This is particularly important in offshore drilling operations where, if a blowout occurs, there is no place to go to escape the accompanying destruction and fire.

In the past, drilling personnel have been trained at special wells using actual equipment. Usually a kick of inert gas is introduced into the well through a tubing placed into the well for that purpose. It can be seen that such an installation is expensive, limited to the condition of that well, and requires that the students come to the well location for training. Also, because of the time required to circulate out a kick, the number of students who can be trained is limited.

A drilling well simulator, as reported in the March, 1972, issue of WORLD OIL, has been developed to train drilling personnel in the prevention of blowouts. However, this device is a complicated device which requires an experienced operator to initiate and control the progression of a well kick based on the student's actions by changing at least one parameter at an operator's panel during the training session. In addition, the device is limited, and cannot simulate all well circulation applications.

Computer programs have been written to calculate pressures and volumes in oil wells, but they will not create a real time display responsive to changes of simulated controls, and additionally must be run on large digital computers. Thus they can only be used where computer facilities are available.

The present invention is an apparatus for simulating the circulation system of an oil well and includes: manually adjustable control means for simulating the controls of the circulation system of an oil well; digital, programmable calculating means responsive to the adjustable control means for calculating the fluid pressure at a plurality of points in the circulation system; and display means for displaying the calculated pressures for selected points in the circulation system thereby simulating the operation of the circulation system. The calculator of the invention includes means for automatically calculating the pressure of an intersected formation to include a selected fractional portion of a time dependent, unrelated real number such that a sufficiently high pressure will be simulated in the formation to cause formation fluid to invade the well bore thus providing a well kick.

The display means responds to the invading fluid and the student's adjustment of the control means for simulating the response of an oil well during a well kick. Thus, the invention is capable of being used to train drilling personnel in the operation of a circulation system of an oil well during the normal drilling of an oil well, and also for the well during the receiving of a well kick. If the well kick is not handled properly, the simulator contains warning means to indicate that a blowout would have resulted, or that a physical limit of the system would have been exceeded had the oil well being simulated been operated in a similar manner. By altering the programming of the programmable calculator, the invention may simulate receiving a well kick while making a trip with the drill pipe, or may simulate a circulation system used for treating an oil well, such as in fracturing or acidizing the well.

The invention additionally includes automatic means for randomly simulating the failure of one or more of a plurality of components in the circulation system. The simulated failure may occur either independent from the well kick, or during the course of the well kick in order that the student may be trained in the recognition of a circulation system component failure, and the handling of a well kick in conjunction with a component failure.

The invention provides for the easy change of the data used by the programmable calculator in actual units of measure, and represented by digital values, thus providing a simulator which simulates a particular well and a given configuration of circulation system in that well. This allows the student to be trained to operate a given circulation system in a given well. The invention also provides a simulator which may be used to evaluate the optimum method for the circulation system configuration for a particular application in a particular oil well.

The invention also includes audio means to simulate the sounds of selected components of the circulation system, thereby adding realism to the simulation.

The programmable calculator of the invention includes calculating means which simulate the introduction of formation fluid from the formation into the well bore; and the expansion, if gas, and flow rate of the fluid as it is circulated in the oil well. Calculation means are also included which simulate the introduction of a subsequent volume of formation fluid if the circulation system is not utilized properly in the circulating out of the first volume of fluid.

The invention's use of a digital programmable calculating means provides a simulator which is inexpensive, is compact and portable, and which may be available for other purposes.

THE DRAWINGS

A brief description of the appended drawings follows:

FIG. 1 presents a schematic diagram of a typical circulation system in an oil well which the disclosed invention simulates.

FIG. 2 presents a choke control panel of the invention which contains the choke controls, mud weight control, standpipe and casing pressure gauges, cumulative pump stroke and pit volume change displays, and time frame, error alarm, and system control switches.

FIG. 3 presents a driller's control panel which contains the pump, kelly, annular preventer, and hydraulically controlled relief valve controls, and the penetration, relative flow rate guages, and a second standpipe pressure gauge.

FIG. 4 presents an electrical schematic diagram of the choke control of the invention.

FIG. 5 presents an electrical schematic diagram of the pump control of the invention.

FIG. 6 presents an electrical schematic diagram of a switch suitable for use as the kelly, annular preventer, and hydraulic controlled relief valve of the invention.

FIG. 7 presents a diagram of the communication interface system network between the programmable calculator and the choke and driller's panels of the invention.

FIGS. 8a, 8b and 8c, joined at connector points A, B and C, present a flow diagram of calculator routine BOSS-O which calculates flow constants and gradients, based on specified input data, for later use by the main simulation routine.

FIGS. 9a, 9b and 9c, joined at connector points A, B, C and D, present a flow diagram of calculator routine BOSS-M which controls the input and output of data between the choke control and driller's control panel for simulating the well circulation system represented by the data input into the BOSS-O routine of FIG. 8.

FIGS. 10a, 10b and 10c, joined at connector points A and B, present a flow diagram of a subroutine of routine BOSS-M for calculating the pressures at a plurality of points in the circulation system being simulated.

FIG. 11 presents a schematic representation of an array of data registers in the calculator of the invention for accounting the volumes of the fluids in the drill string and annulus of the circulation system being simulated.

FIG. 12 presents an embodiment of the pulse shaping circuit of FIG. 4.

FIG. 13 presents an embodiment of the up/down counter of FIG. 4.

FIG. 14 presents an embodiment of the binary-to-BCD converter of FIG. 4.

FIG. 15 presents an embodiment of the digital counter of FIG. 5 for periodically reading pulses from a voltage controlled amplifier.

FIG. 16 presents an embodiment of the latch of FIG. 5.

FIG. 17 presents an embodiment of a digital-to-analog converter and smoothing circuit for converting a digitally represented value output by the calculator to an analog signal for display on a gauge, and whose amplitude changes smoothly from one value to another.

THE CIRCULATION SYSTEM TO BE SIMULATED

At this point it is appropriate to discuss the circulation system to be simulated. The purpose of the circulation system illustrated in FIG. 1 is to circulate drilling fluid, known as mud, through the oil well. The mud has several functions. Among other functions, the mud cleans the bottom of the hole and carries the cuttings made by the bit to the surface, it cools and lubricates the bit as the bit drills, and it controls the formation pressure by its own hydrostatic pressure thus holding formation fluids in the formation.

In FIG. 1, the well 10 is being drilled by bit 13 of the drill string. The drill string includes drill collar 14 and drill pipe 15. The drill string is rotated from the surface to cause the bit 13 to drill in response to the rotary action and the weight of the drill collars. A portion of the well is cased by casing 11 which has been cemented into place.

Mud is normally pumped down the center of the drill string, and through nozzles (not shown) in the bit 13 and back up to the surface in the well annulus 12 between the drill string and the walls of the well bore. The annulus 12 can be divided into two sections, the annulus in the open hole 4, and the annulus in the cased hole 3.

The mud is pumped from a mud pit 32 through a suction line 33 by mud pump 30, and into a standpipe 29. From the standpipe 29, the mud goes through a flexible kelly hose 28, into a swivel 27 which funnels the mud into a central passageway of the kelly 26. The kelly 26 is connected to the top section of drill pipe 15 such that the mud will flow through the kelly 26, into the drill pipe 15, and then into the oil well as described above.

The kelly 26 is a large, square or hexagonal pipe which transmits rotary torque from the rotary equipment of the rig to the drill string. When the kelly reaches the bottom of its stroke, it is disconnected from the drill pipe 15, and raised by lifting on the bail of the swivel 27. A new section of drill pipe is then added to the drill string, the kelly is connected to the new section, and drilling is resumed by again applying torque to the kelly. The swivel 27 is designed to provide a fluid tight seal between the kelly hose 28 and the kelly 26, while allowing the kelly to rotate.

The drill string extends through a blowout preventer stack, to be discussed later, and into the well bore. During normal drilling or circulating, mud travels up the annulus 12, flows through the blowout preventer stack, and out a mud return line 24 into a shale shaker 31. The shale shaker 31 separates the formation cuttings from the mud. The mud then returns to pit 32 for reuse.

The blowout preventer stack is many times topped with a bell nipple 23 to make insertion of the drill string easier. Fill line 22 is used to pump additional mud into the well to keep the hole full when the drill string is being removed, such as when the bit is replaced.

If the fluid pressure in the formation at any time during the drilling of an oil well exceeds the hydrostatic pressure of the mud, the well receives a well kick. For instance, if the bit cuts into a formation which contains fluid, such as gas, oil or salt water, whose pressure is higher than the hydrostatic pressure of the mud in the well bore 10, the formation fluid may begin to flow into the well bore 10. This is known as a well kick.

In most cases, the formation fluid will be lighter than the drilling fluid, and as more formation fluid displaces the drilling mud, the hydrostatic head will become less. This lower pressure will allow more formation fluid into the well bore and, unless remedial action is taken, will lead to a blowout condition in which formation fluid escapes uncontrolled from the formation and up the oil well to the surface.

A blowout condition can also occur as the drill string is removed from the well. If sufficient mud is not added to the oil well to replace the volume of the pipe being removed, the hydrostatic head of the mud can be lowered sufficiently to result in a blowout. Also, as the pipe is withdrawn, a lower pressure may result at the bottom of the hole because of the piston effect of the drill string moving in the hole. This condition is known as swabbing out the hole. If the pressure is reduced sufficiently, formation fluid will flow into the hole.

When a kick condition is detected, protective equipment in the blowout preventer stack is actuated to seal off the well annulus 12 to maintain control of the well. Seals in the pump 30 are provided to prevent back flow of the mud up the interior of the drill string.

An annular type blowout preventer 21 is provided near the top of the blowout preventer stack. This type of preventer can be imagined as a large rubber stopper with a hole in the center to provide for the passing of the drill string. When it is actuated, the stopper is hydraulically shoved into the annular space around the drill pipe 15 to seal off the well annulus.

Below the annular type preventer is located one or more ram type preventers 16 and 20. In this type preventer, rams converge on one another from opposite sides. Ram preventers may either have pipe rams or blind rams. In pipe rams, the head of the rams is designed with a concave face such that when they are closed, the pipe is gripped by the rams, and a fluid tight seal is established. Blind rams form a fluid tight seal against one another in case the pipe is not in the well when the kick is detected, or in case the pipe parts.

Below ram type preventer 20, is a drilling spool 17 which allows the connection of kill line 18 and choke line 19 into the stack. The kill line is provided to insert fluid into the well annulus 12 under high pressure after the blowout preventers above it are closed.

Choke line 19 has a hydraulically controlled valve 40 and a choke 41. Valve 40 is normally closed, and is opened when it is desired to maintain the annulus under pressure. The choke 41 maintains the well pressure with a variable opening that allows mud and formation fluid to be bled off. A gas separator 42 removes gas from the mud, and the mud is circulated through mud line 44 to the shale shaker 31, and then into the mud pit 32 for reuse. The gas separated from the mud flows through the gas line 43 and is removed from the rig site and disposed of safely.

When a well kick is detected, corrective action must be taken to prevent a blowout. When a well kick is detected, drilling is stopped, and the blowout preventers are closed. The well is now under control. The pressure in the well annulus will rise until the bottom hole pressure is equal to the formation pressure. At this point, no more formation fluid will flow into the hole.

By measuring the pressure in the well annulus by means of a gauge 47, and the standpipe by means of a gauge 46, the cause of the kick may be determined. If the hydrostatic pressure of the mud column in the well is not sufficient to contain the formation fluids, additives may be mixed with the mud to make it denser and thus increase the hydrostatic pressure of the mud at the bottom of the hole. This is known as weighting the mud. To control the well, the denser mud must be circulated into the well, and the original mud and formation fluid in the annulus must be removed to provide a continuous column of mud in the well with sufficient density to maintain the formation fluid in the formation.

This circulation procedure is known as circulating out a kick. If the formation fluid is gas, it must be allowed to expand as it rises. If the gas does not expand, its pressure at the surface will be equal to the pressure at the bottom of the hole, and will exceed the pressure limits of the surface equipment.

One method of circulating out a kick is known as the Driller's Method. In this method, the pump speed and choke are adjusted to maintain sufficient pressure in the borehole to control the well. The formation fluid is then circulated out. Denser mud is then mixed, and a second circulation is made to maintain control of the well.

Another method is the Wait-and-Weight Method. In this method, the denser mud is first mixed in the pit. When the mud is ready, only one circulation is needed to remove the formation fluid and the lower density mud from the well, and to replace the mud with the denser mud required to control the well.

When the well is again under control, the blowout preventers may be opened, and drilling may continue.

During normal drilling, or in the circulation out of a kick, a number of components of the circulation system could fail. Some of these conditions can include the plugging of the nozzles in the bit 13 restricting the normal circulation of mud, a washout in the drill pipe in which the drill pipe 15 develops a leak, and a malfunction in the pump 30 during the circulation out of a kick such that the pump will not maintain the pressure or volume needed to control the well.

Other circulation systems which might be used in an oil well include a cementing system, in which cement is pumped down the inside of the casing and up the annulus between the casing and the well bore to cement the casing in place; a treating system, in which various chemicals and fluids are pumped into the well and forced out into the formation to change its characteristics and production abilities; and, a production system, for removing the formation fluid during commercial production.

DESCRIPTION OF THE PREFERRED EMBODIMENT

Figure 2:
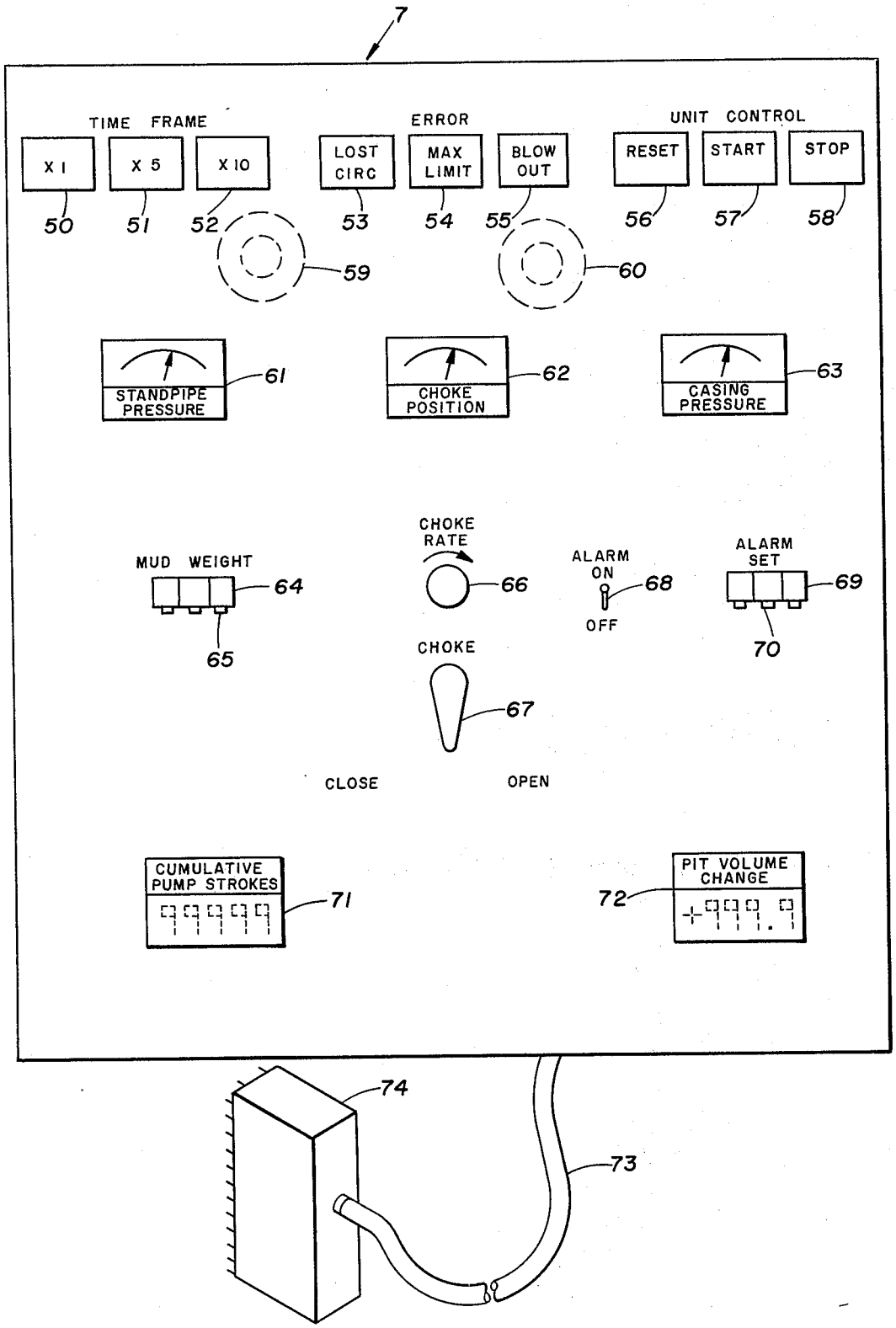

FIG. 2 illustrates the choke panel 7 of the preferred embodiment. Push buttons 50, 51 and 52 represent time frame controls. Button 50 provides for running the invention at real time. Buttons 51 and 52 provide for a time factor of five times real time and ten times real time respectively. The buttons are illuminated so as to give a visual indication of the time frame of the simulation.

Error lights 53, 54, and 55 are illuminated when error conditions are sensed. Error light 53 is illuminated when the hydrostatic pressure of the mud is sufficiently high to cause the formation to break down, such as when the mud is too dense. The resulting condition is known as lost circulation. Error light 54 is illuminated when a maximum allowable pressure limit of the surface equipment has been exceeded.

Error light 55 is illuminated when a well kick has not been handled properly and a blowout would occur in the system being simulated. Loudspeaker 60 sounds a beeping sound when an error condition is sensed.

Gauge 61 displays the standpipe pressure calculated by the invention and simulates the pressure gauge 46 in the simulated system. Gauge 63 displays the casing pressure and simulates the pressure gauge 47 in the simulated system.

Gauge 62 displays the degree of opening of the choke and is responsive to the adjustment of choke rate control 66 and choke control switch 67. When choke control switch 67 is held at the open position, the choke simulation is opened at the rate set by rate control 66. When the choke control switch 67 is held at the closed position, the choke simulation is closed at the rate set by rate control 67.

Mud weight control 64 is used to change the density of the mud. The change is made by appropriate means such as knobs 65.

Cumulative pump strokes display means 71 displays a digital number representing a total number of pump strokes. The display is reset back to zero by pushing reset switch 56. Resetting display means 71 indicates to the programmable calculator of the invention that a circulation of a changed density of mud has started. The cumulative pump strokes displayed will then be an indication of the volume of new mud, pumped in this circulation.

The pit volume change display 72 displays the calculated change in volume in the mud in the pit. A change in volume is an indication that formation fluid is displacing mud in the well annulus. An alarm set value is placed in alarm set control 69 by knobs 70, and if alarm switch 68 is in the on position, a buzzer alarm will sound when the pit volume change exceeds the alarm set value.

Stop button 58 will freeze the simulator action, and start button 57 will restart the simulation at the same point.

A circuit is provided to play a noise signal over loudspeaker 59 when a gas bubble is being circulated through the choke.

Cable 73 and connector 74 connect the circuitry of choke panel 7 with appropriate circuitry to interface with the programmable calculator of the invention.

Figure 3:
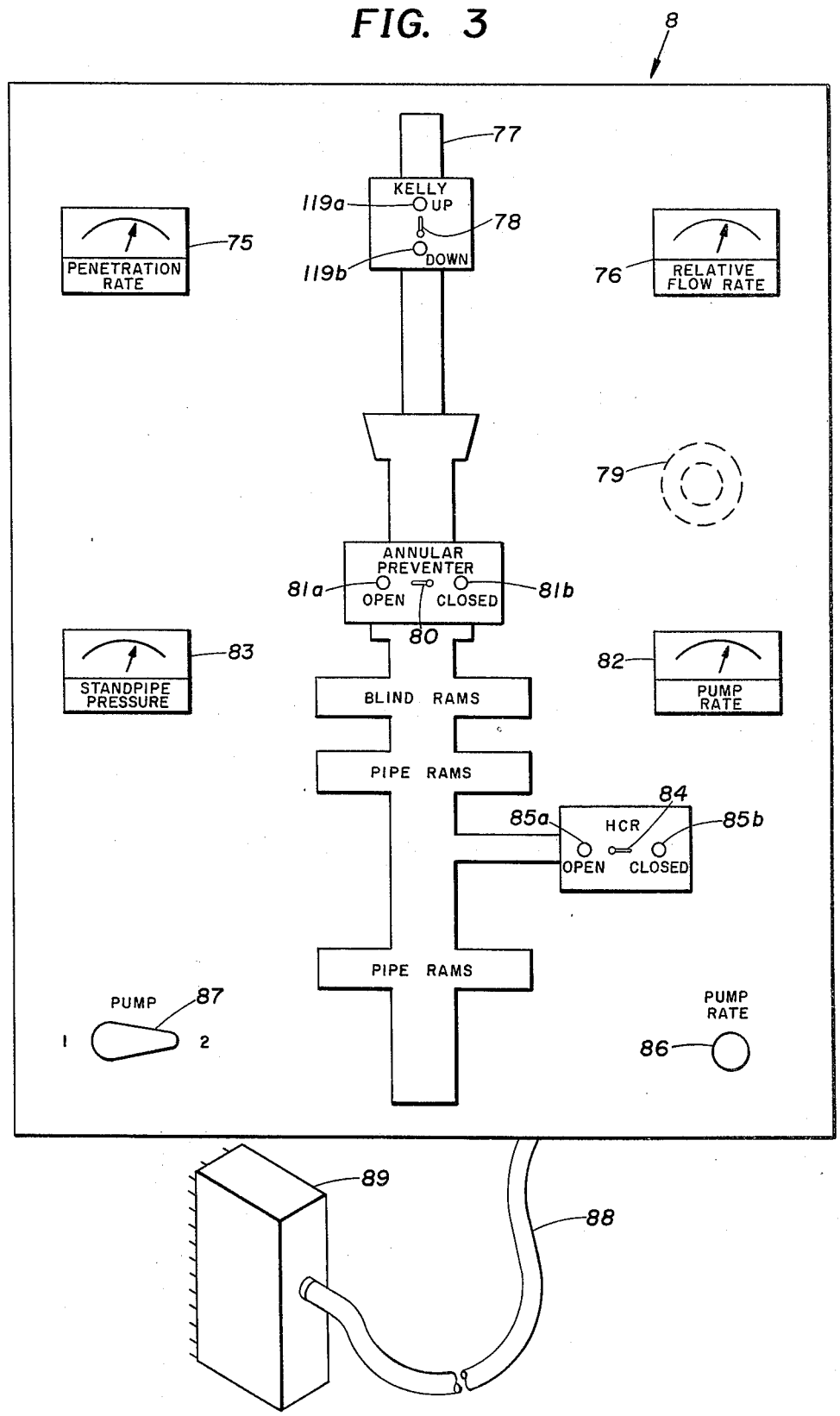

FIG. 3 illustrates the driller's panel 8 of the invention. A silhouette 77 of a blowout preventer stack is provided to orient the student as to the location of the devices being controlled.

A kelly switch 78 has an up and down position to indicate the position of the kelly. A delay is built into the switching function to simulate the actual delay in moving from one position to another. Small lights or light emitting diodes 119a and 119b are lighted to indicate whether the kelly is in the up or down position.

An annulus preventer switch 80 and a hydraulically controlled relief valve 84 are also provided. Switching delays are likewise provided in these switches to simulate the actual delays needed to move the annulus preventer and valve from one position to another. Lights such as light emitting diodes 81a, 81b, 85a and 85b are provided to give a visual presentation of the position of the preventer and valve.

A simulated penetration rate is displayed on gauge 75. An increase in penetration rate, known as a drilling break, is one of the first signs that the well is taking a kick. The relative flow rate gauge 76 displays the rate of the mud in the flow line 24 illustrated in FIG. 1, as calculated by the calculator of the invention.

The standpipe pressure gauge 83 displays the same pressure as displayed by gauge 61 on the choke panel. A pump rate control 86 is used to simulate the throttle of the mud pump 30 of FIG. 1. The gauge 82 displays the pump rate. Since the pump 30 is pumping against the pressure in standpipe 29, any increase in standpipe pressure will cause a decrease in the pump rate of the pump 30. The electronics of the pump control are designed to reflect this reaction.

Pump switch 87 reflects which pump unit is being used during the simulation. If the invention simulates a failure in one pump unit, the student, after recognizing a pump failure, can simulate switching to an auxiliary pump by changing switch 87. A thumper circuit is also controlled by pump rate control 86, and creates a thumping sound which is played over loudspeaker 79 to add realism to the simulation. An increase in the rate setting of control 86 causes a corresponding increase in the rate of the thumping sounds.

The cumulative pump stroke display 71 of the choke panel 7 counts the simulated pump strokes of the pump control circuit. The time frame switches 50, 51 and 52 multiplies the number of counts in display 71, but does not affect the pump rate. Thus the programmable calculator calculates the volume of mud of the multiplied pump strokes at the unmultiplied pump rate. This has the effect of reducing the time needed to complete a circulation.

The electronics of the driller's panel 8 is connected to the electronics of the choke panel 7 and the programmable calculator by appropriate means as illustrated by cable 88 and connector 89.

Figure 4:
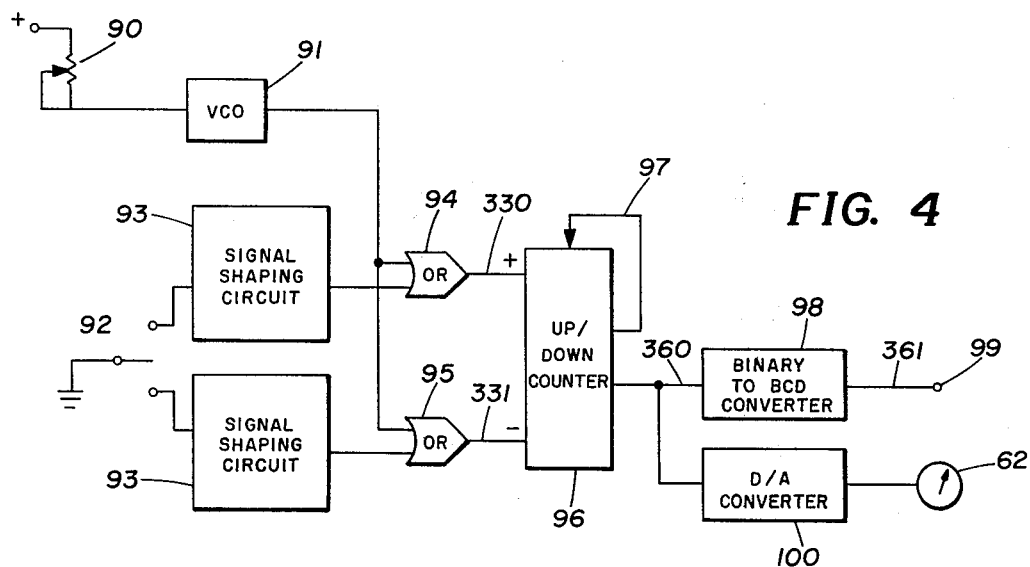

FIG. 4 presents a circuit diagram of the choke controls of choke gates, 7 of FIG. 2. Potentiometer 90 is adjusted by the choke rate control 66, and varies the input voltage to a voltage controlled oscillator 91. The pulses generated by the oscillator 91 in response to the voltage across potentiometer 90 are supplied to gates 94 and 95. Gates 94 and 95 are shown as OR gates; but, could be AND gates, depending on the design of signal shaping circuits 93. In the embodiment shown in FIG. 4, signal shaping circuits 93 supply a low signal level to the gate control line of the OR gates when the circuits 93 are grounded through switch 92. When signal shaping circuits 93 are ungrounded, a high signal level is supplied to the gate control line of the OR gates. If gates 94 and 95 were AND gates the signal shaping circuits 93 would supply a high signal level when grounded, and a low signal level when ungrounded.

Manual switch 92 represents the choke control 67 of the choke panel 7. When the switch is in the up position, which represents the open position of control 67, the gate control input of OR gate 94 will be low, and the data input will be receiving pulses from the voltage controlled oscillator 91. With switch 92 in the up position, the gate control input of OR gate 95 will be high, and the gate data input will be receiving pulses from the voltage controlled oscillator 91. It can then be seen that when the switch 92 is in the up position, pulses will be passed by gate 94 to the up/down counter 96 and gate 95 will be inhibited.

It can likewise be seen that when switch 92 is in the down position, which represents the close position of control 67, pulses will be passed by gate 95 to the up/down counter and gate 94 will be inhibited. Switch 92 is spring loaded such that when it is not manually held in either the up or down position, it will move to the middle position shown in FIG. 4 such that neither gate 94 nor 95 will pass pulses.

Gate 94 passes pulses to the positive terminal 330 of counter 96, causing the counter to count up. Gate 95 passes pulses to the negative terminal 331 of counter 96, causing the counter to count down.

Conductor 97 represents a reset path which prevents the counter from counting above a maximum number representing a fully open choke or below zero representing a fully closed choke.

It can thus be seen that adjusting rate control 66 adjusts potentiometer 90 which controls the rate at which up/down counter 96 counts. Holding choke control 67 in either the open or close position controls switch 92, thereby determining whether counter 96 will count up or down.

If counter 96 holds the count as a binary number, a suitable binary-to-BCD converter 98 may be used to supply a binary coded decimal output to output terminal 97 for use by the calculator of the invention. It will be understood that data lines 360 and 361 are multi-conductor lines for the transmission of binary data. A suitable digital-to-analog converter 100 converts the decimal number of the up/down counter 96 to an analog voltage for display on choke position gauge 62.

Figure 5:
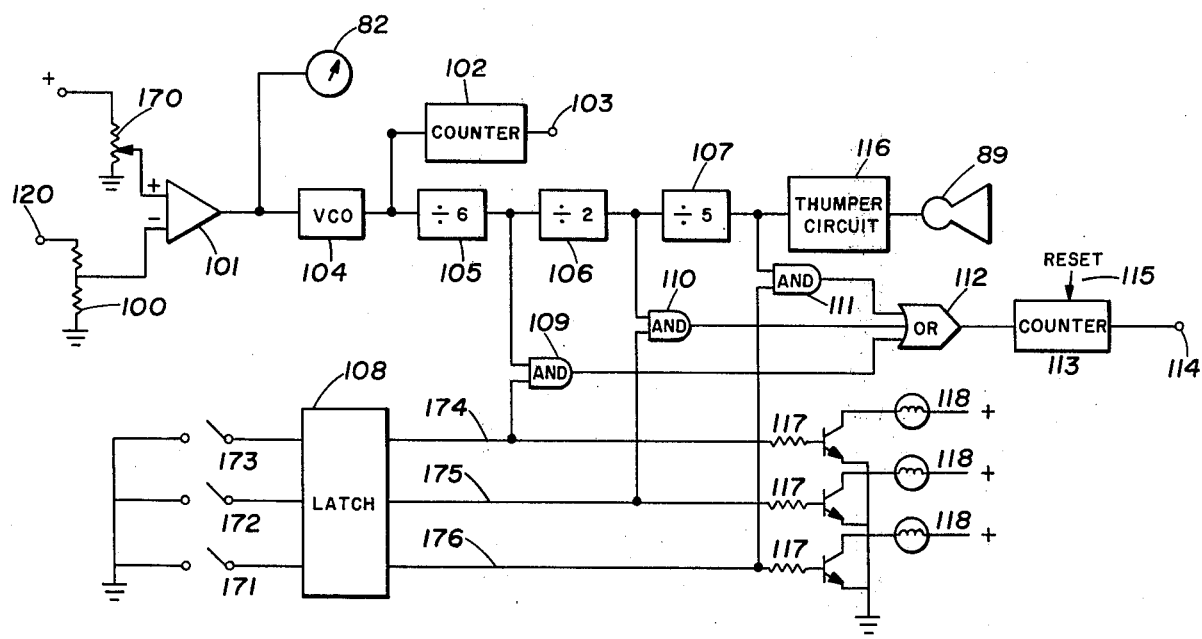

FIG. 5 presents a diagram of the pump rate control 86 of the driller's panel 8. Adjustment of the pump rate control 86 adjusts the potentiometer 170 of FIG. 5. Adjustment of potentiometer 170 varies the positive terminal input voltage of the operational amplifier 101.

As explained above, an increase in the standpipe pressure will cause a decrease in the pump rate. For this reason the voltage across the standpipe pressure gauge 83 is also present at input terminal 120 of voltage divider 100. The output of voltage divider 100 is fed into the negative terminal of operational amplifier 101.

It can thus be seen that an increase in the standpipe pressure gauge voltage will cause a proportional increase in the voltage at the negative terminal of operational amplifier 101. The operational amplifier performs a subtracting function to subtract the output voltage of voltage divider 100 from the output voltage of potentiometer 170.

The output of operational amplifier 101 is thus a voltage which is proportional to the pump rate of the pump being simulated corrected for the effect of the pressure in the standpipe. This voltage is supplied to pump rate gauge 82.

The output voltage for operational amplifier 101 also drives voltage controlled oscillator 104. Oscillator 104 generates a train of pulses of preferably 0–150 $H_z$ responsive to the voltage at its input terminal. A digital counter 102 counts and latches the pulses from oscillator 104, and supplies a binary coded decimal representation over a multiconductor data line to terminal 103 for use by the calculator of the invention. The latch circuit is controlled by a clock which takes a new reading each second to determine the number of pulses received per second. If the pulsed signal is divided by 60, the pulses will represent the strokes per minute of the pump being simulated. Dividers 105, 106 and 107 in series perform a division by 60 so that the pulses which appear at the input of a thumper circuit 116 represent the strokes per minute of the pump. The pulses counted by counter 102 can be divided by the calculator to give the correct strokes per second.

Thumper circuit 116 provides an audio beat to loudspeaker 89 in response to each pulse received at its input. Thus loudspeaker 89 will play audio beats in beats per minute which are responsive to the setting of pump rate control 86, and corrected for standpipe pressure.

It can be seen that if the total pulses are counted from the output of divider 107, a number will be given which represents the total number of strokes of the pump. If the total pulses are counted from the output of divider 106, the number of pulses will be the number of pump strokes times five. Similarly, if the total pulses are counted from the output of divider 105, the number of pulses represents the number of pump stokes times ten. Thus the gauge 82, the digital signal at terminal 103, and the audio beats from loudspeaker 89 will always represent the pump rate in strokes per minute. However, the cumulative number of pump strokes displayed by digital display 71 will depend on where in the circuit the pulses from oscillator 104 are counted.

Switches 171, 172 and 173 of FIG. 5 represent push buttons 50, 51 and 52 respectively as shown in FIG. 2. Latch 108 may be either a mechanical or an electronic latch circuit which will allow only one switch to be closed at a time. The preferred embodiment is that latch 108 is an electronic circuit which, when one of switches 171, 172 and 173 is momentarily closed, only one of gate control lines 174, 175 or 176 will have a high signal level, and the other two gate control lines will have a low signal level.

For example, if it is desired to run the simulation at five times real time, button 51 is pushed. This will momentarily close switch 172. Responsive to the closing of switch 172, latch circuit 108 will place a high signal level on gate control line 175, and will place a low signal level on gate control lines 174 and 176. In this manner switch 171 enables AND gate 111 and inhibits AND gates 109 and 110; switch 172 enables AND gate 110 and inhibits AND gates 109 and 111; and, switch 173 enables AND gate 109 and inhibits AND gates 110 and 111.

The output of AND gates 109, 110 and 111 are each connected to an OR gate 112. The output of OR gate 112 is in turn connected to counter 113 which counts the pulses it receives from OR gate 112. Thus the gate control line which is in the high state will determine which AND gate will pass pulses to OR gate 112. The output of the two AND gates which are inhibited will remain in a low state and, therefore, OR gate 112 will only pass the pulses from the enabled AND gate to counter 113.

Counter 113 will count the total pulses it receives to represent the cumulative pump strokes of the pump being simulated. A reset signal on reset conductor 115 will reset the counter to zero. The reset signal is generated responsive to reset button 56 on the choke panel 7.

A digital representation of the number in the counter 113 is available to the calculator of the invention by data terminal 114 and is also displayed on digital display 71 of FIG. 2.

Each of the time frame buttons 50, 51 and 52 is illuminated by a small light 118 which is switched on by the action of a transistor 117 whose base is connected to the gate control line. When the gate control line goes to the high state, transistor 117 is turned on and the light circuit is completed. A light emitting diode may be used in place of the lamps 118 shown.

Figure 6:
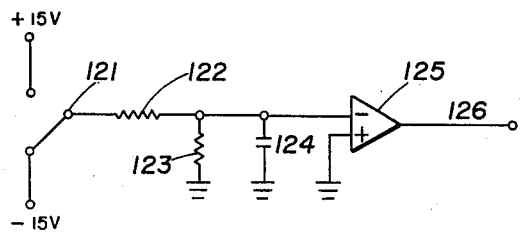

FIG. 6 presents a diagram of the time delay switches used to simulate the activation of the kelly, the annular preventer, and the hydraulic relief valve. A double throw switch 121 is used to switch the negative input terminal of a comparator 125 from a positive voltage to a negative voltage.

Resistors 122 and 123, and capacitor 124 are sized such that the RC time constant gives the delay desired.

The positive input terminal of comparator 125 is grounded in order that the voltage on the negative input terminal is compared to ground.

When switch 121 is changed from +15 to −15 volts, the voltage across capacitor 124 will begin to decrease as the capacitor is discharged. The rate of the voltage drop will depend on the size of resistors 122 and 123, and the size of capacitor 124.

When the voltage across capacitor 124 drops below ground voltage, the voltage at output terminal 126 will become positive, indicating that the apparatus being simulated has been activated.

When switch 121 is changed from −15 to +15 volts, the voltage across capacitor 124 will begin to rise as the capacitor is changed. When the voltage across capacitor 124 exceeds ground voltage, the voltage at the output terminal 126 will become negative, indicating that the apparatus being simulated has returned to its original position.

The voltage on output terminal 126 can also be used to turn lights off and to indicate the position of the simulated apparatus. In the preferred embodiment, when terminal 126 voltage is positive, one indicating light will be turned on and a second light will be turned off. When the terminal voltage is negative, the second light will be turned on and the first turned off.

For instance, in the case of the annular preventer, when the output voltage is positive, open light 81a will be on and the closed light 81b will be off. When the output voltage is negative, the closed light 81b will be on and the open light 81a will be off.

Figure 12:
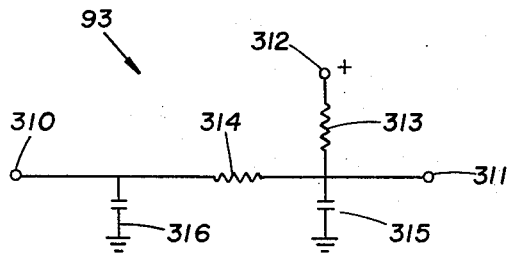

FIG. 12 represents one embodiment of pulse shaping circuit of FIG. 4. Terminal 310 is the input terminal connected to switch 92, and terminal 311 is the output terminal to one of the OR gates. A positive voltage is applied to terminal 312 which causes a sufficient voltage to appear at output terminal 311 to inhibit the connected OR gate. When terminal 310 is grounded, the output voltage will drop, thus enabling the OR gate. Resistors 313 and 314 are sized to insure proper operation of the OR gates. Capacitor 316, and a large capacitor 315, are included to dampen transients caused by the operation of the switch.

Figure 13:
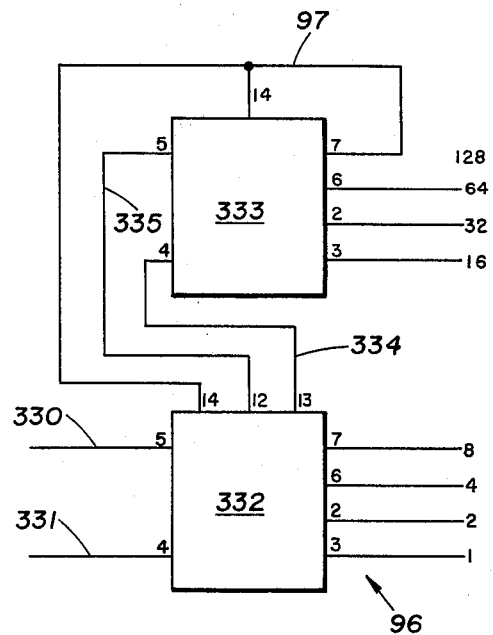

One embodiment of up/down counter 96 is shown in FIG. 13. Two integrated circuits are connected in series as shown to give eight bits. Positive lead 330 is connected to the up counting pin 5 of the first circuit 332, and negative lead 331 is connected to the down counting pin 4. The high order bit pin 7 of the second circuit 333 is connected to the reset pin 14 of both circuits as shown such that when the high order bit is turned on, both circuits will be reset and all bits will be turned off.

When the number goes negative in the desired circuits, all bits are turned on to show the complement of the number. It can be seen that if the pulses from OR gate 95 of FIG. 4 cause the counter to count below zero, all the bits will be turned on, and the high order bit will immediately reset the circuit and turn all the bits off. Thus if the number in the couter goes above 127, representing a fully open choke, the number will go to zero. If the counter counts down to zero, representing a fully closed choke, it will remain at zero until switch 92 is moved to the open position. Integrated circuit 74193 has the characteristics desired, and is connected in the manner shown in FIG. 13 to give one embodiment of the up/down counter 96 of FIG. 4. A suitable D/A converter 100 is integrated circuit MC1408L-8 sold by the Motorola Company.

Figure 14:
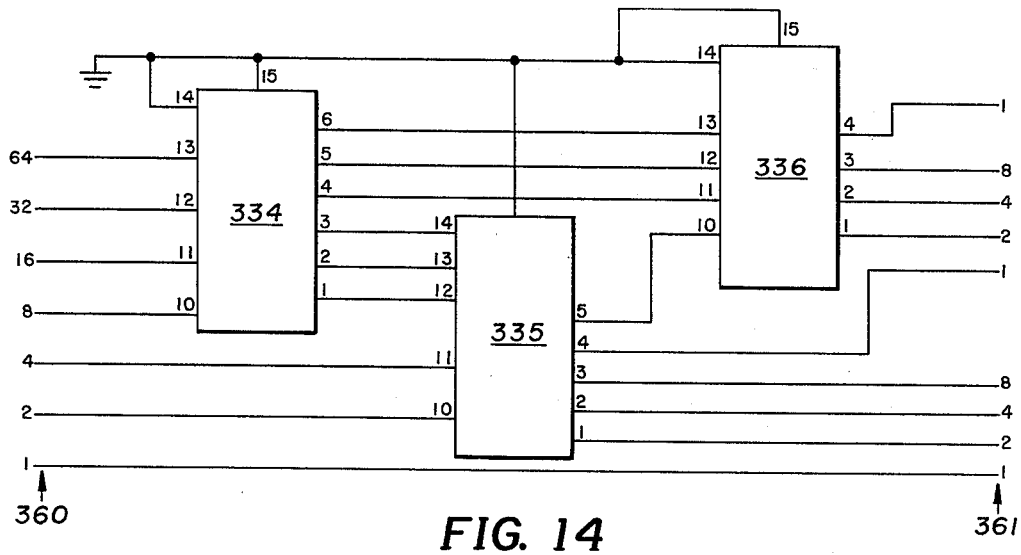

FIG. 14 presents one embodiment of the binary-to-BCD converter 98 of FIG. 4. Three integrated circuits, 334, 335 and 336, are connected in such a manner that a binary input on the conductors of data line 360 will result in a binary coded decimal output on the conductor of data line 361.

A suitable integrated circuit for use in binary-to-BCD converter 95 is circuit 74185 when connected as shown in the embodiment of FIG. 14.

Figure 15:
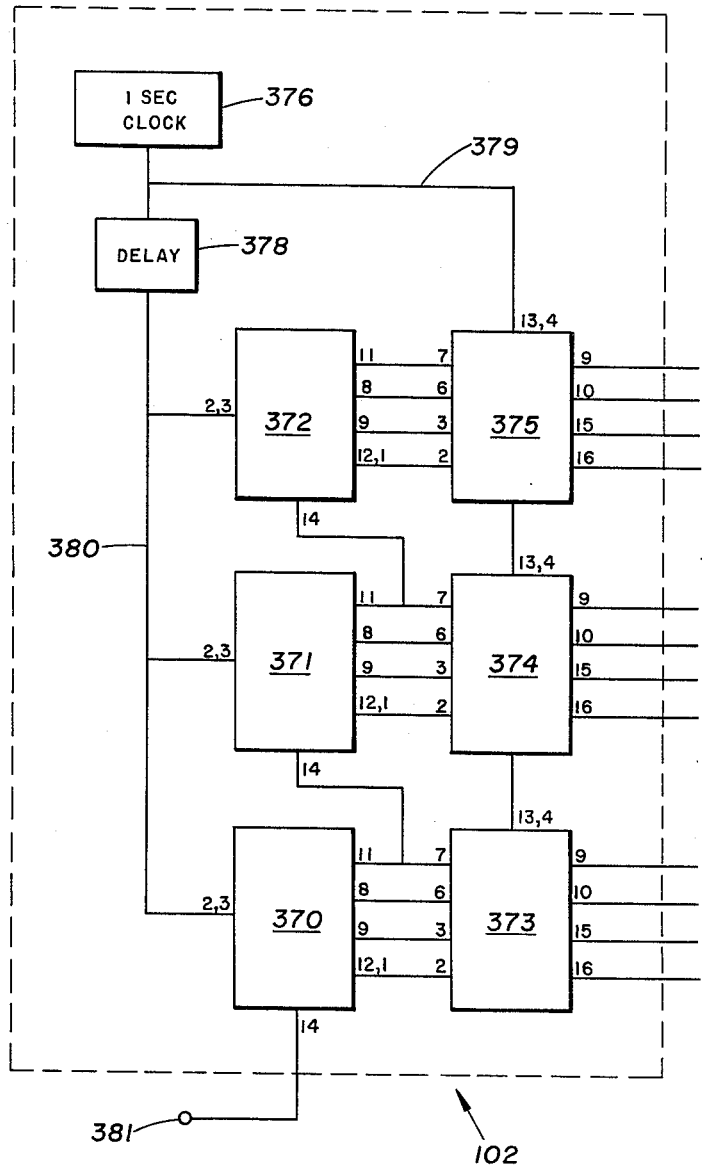

FIG. 15 presents one embodiment of the digital counter 102 of FIG. 5. The output pulses of generator 104 to be counted are applied to input terminal 381. These pulses are applied to three integrated circuits, 370, 371 and 372, which are connected in series as shown. A second set of integrated latch circuits, 373, 374 and 375, are connected to circuits 370, 371 and 372, respectively as shown. The latch circuits will not accept the bits on their inputs and show them on their outputs until the latch circuits receive a signal from conductor 379.

Circuits 370, 371 and 372 will reset, that is, turn all their bits off, when they receive a signal from conductor 380. A one second clock, 376, places a signal on 379 every second. Upon receipt of the signal, latch circuits 373, 374 and 375 turn on their outputs to correspond to the turned on bits at their input.

A delay circuit 378 gives the latch circuits sufficient time to turn on, typically 15 microseconds, and then places a signal on conductor 380, thereby resetting circuits 370, 371 and 372. A suitable integrated circuit for 370, 371 and 372 is integrated circuit 7490. A suitable latch circuit for circuits 373, 374 and 375 is circuit 7475. The circuits are connected in accordance with FIG. 14 for one embodiment of the digital counter 102 of FIG. 5. Integrated circuits 7490 in a similar configuration as circuits 370, 371 and 372 with a reset switch controlling conductor 380 may be used for resettable counter 113 of FIG. 5.

Figure 16:
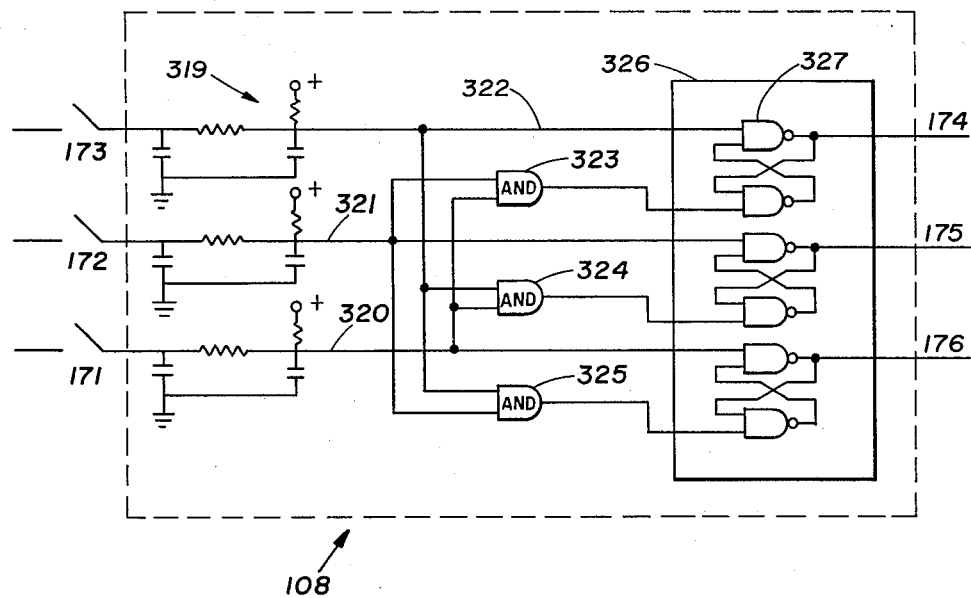

FIG. 16 shows one embodiment of latch 108 of FIG. 5. An integrated circuit 326 having AND gates 327 is used to place signal levels on gate control lines 174, 175 and 176. Pulse shaping circuits 319 are placed between switches 171, 172 and 173; and, latch control lines 320, 321 and 322 respectively. Pulse shaping circuits 319 are of the same type as that shown in FIG. 12.

AND gates 323, 324 and 325 are connected to latch circuit 326 and latch control lines 320, 321 and 322 in such a manner that the latch control line grounded through switches 171, 172 and 173 gives a low signal level to the other two latches as shown. It can thus be seen that closing one of the switches will cause a low signal level on the corresponding latch control line and the two other AND gates. The action of the latches will cause a high signal level on the corresponding gate control line, and will cause low signal levels on the other two gate control lines. The latches will maintain these signal relationships even after the switch is released and reopens. Latch circuit 74279 is suitable for integrated circuit 326.

Figure 7:
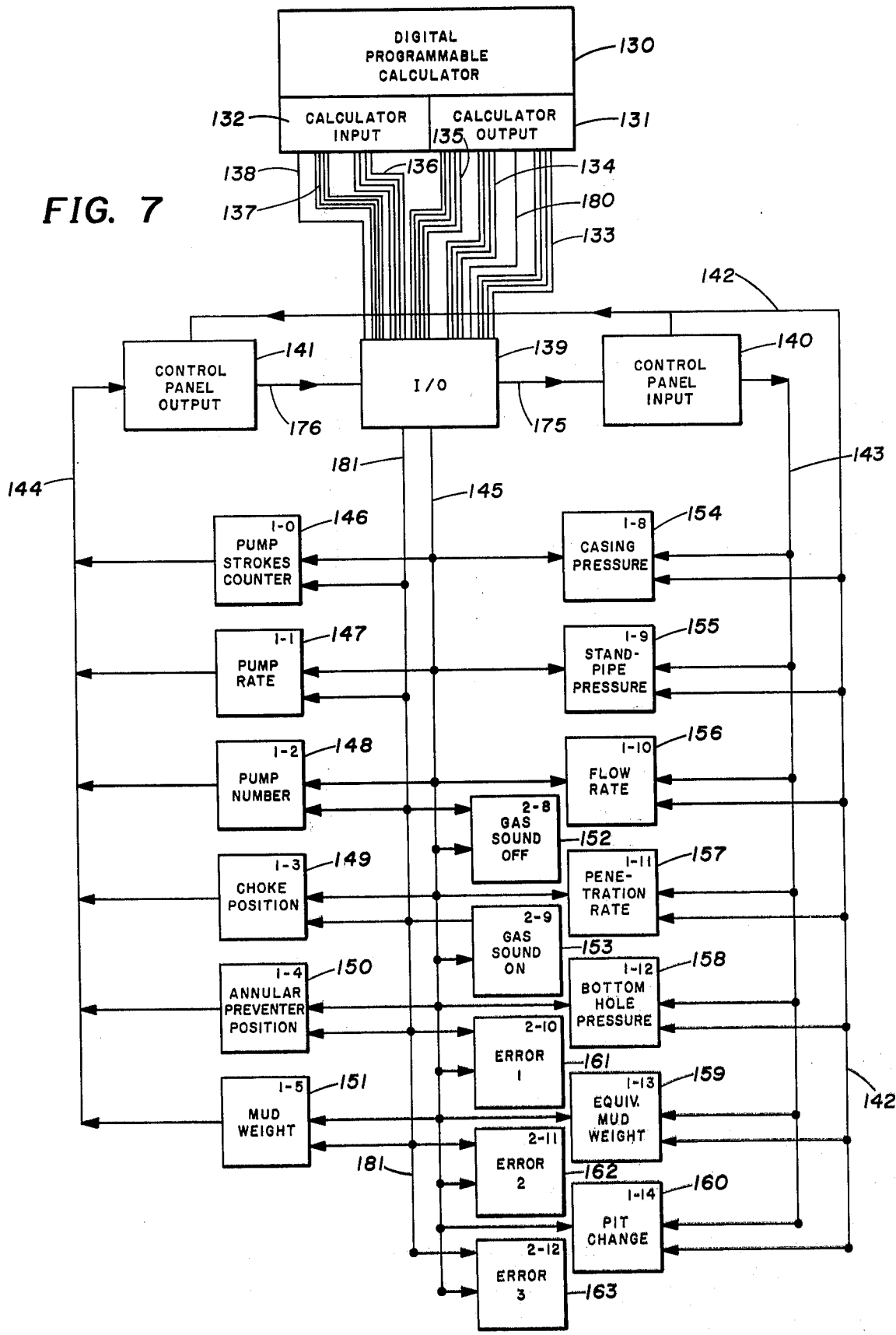

FIG. 7 presents a diagram of the input-output interface between the calculator and the control panels of the invention. A suitable digital programmable calculator 130 is programmed to receive the various outputs of choke panel 7 and driller's panel 8; to calculate the pressures and volumes present at a plurality of points in the circulation system being simulated; and, to return digital values including various pressures and volumes to panels 7 and 8 for display.

Digital programmable calculator 130 is preferably a Wang Model 600-14TP Programmable calculator sold by Wang Laboratories of Tweksbury, Massachusetts. The discussion herein concerning the input-output interface between the calculator 130 and the control panels 7 and 8 will be in terms of the operating characteristics of the Wang 600 calculator. The specifications for interfacing with the Wang calculator are found in the publication Input/Output Interfacing Specifications Wang 600 Series, published by Wang Laboratories, Inc., July 1, 1973, which may be used by one skilled in the art for accomplishing the mentioned input-output interface.

Calculator 130 has an output means 131 and an input means 132 through which data and commands are passed between the calculator and peripheral devices. The control panels 7 and 8 have a common input-output or I/O circuit 139. Data from the calculator to the panels is passed through the I/O circuit 139 over multiconductor communication line 175 to the control panel input circuit 140. The control panel input circuit 140 buffers the data and places it on a multiconductor input data bus 143 as a binary coded decimal number which may be read by the peripheral device concerned. The control panel input circuit 140 also issues command pulses on command line 143 for controlling the acceptance of data by the proper device.

Data from the control panels to the calculator is passed through the I/O circuit from a control panel output circuit 141 over multiconductor communication line 176. The control panel output circuit 141 buffers data transmitted by the peripheral device desired and transmits the data serially, a digit at a time, through the I/O circuit 139 to the calculator input 132. The output circuit additionally generates calculator command characters at the completion of data transmission and in response to command signals on command line 142.

The I/O circuit 139, in addition to passing input and output data, also places the address of the device concerned on multiconductor address line 145, and generates a control signal on command line 181.

The address line 135 includes four conductors which transmit, under program control, a binary coded decimal number which represents the address of the peripheral device to be interfaced with the calculator. A fifth conductor in line 135 indicates whether the device address is in group one or group two. Group one is represented by a zero on the group line, and group two by a one on the group line. Then the device address consists of a group number and an address and may be numbered as shown in the upper right-hand corner of the devices of the embodiment shown in FIG. 7. The particular device being addressed by the calculator may be either an input device or an output device. In FIG. 7, devices 146-151 are panel output devices in group one and have addresses 0-5. Devices 154-160 are panel input devices in group one and have addresses 8-14. Devices 152, 153 and 161-163 are panel input devices in group two and have addresses 8-12.

The calculator output 131 addresses a device by placing an address on line 135, and then places a strobe signal on strobe line 180. I/O circuit 139 passes the address signals to address line 145. The I/O circuit 139 then delays the strobe signal on strobe line 180 for a short length of time, typically 15 microseconds, to allow the devices addressed to receive the address on line 145; and, then strobes command line 181. The device addressed then responds to the strobe on line 181 dependent on whether it is an input or an output device. If the device is an output device, it transmits its data; if it is an input device, it is enabled to receive data. All unaddressed devices ignore any following command and data signals.

A four conductor digit position line 134 transmits a binary coded decimal representing the digit location of the binary coded decimal being simultaneously transmitted over a four conductor digit value line 133. For instance, if the first digit of the number to be transmitted to the device in group one whose address is 13 has a value of 7, the address line 135 will contain the number 013, digit position line 134 will contain the number 1, and digit value line 133 will contain the number 7. After a set length of time, the next digit value and digit position will appear on lines 133 and 134 respectively.

During the serial transmission of a number by the calculator output 131, the calculator is in a stop state, and will not continue execution of its program until the calculator receives a go command. The entire number to be sent by the calculator is transmitted digit-by-digit as described above. If a go command is not received by the calculator, it will again send that number digit-by-digit until a go command is received. The calculator is restarted at any time by transmitting a go command to the calculator input 132.

Control panel input circuit 140 receives each digit of the number being transmitted and stores the digits in appropriate shift registers. When a decimal point code is transmitted, the input circuit 140 receives and latches one more digit, transfers the number in the shift registers to a latch circuit similar to that discussed, and then strobes command line 142. It should be noted that when the number is latched, the corresponding bit conductors in input bus 143 are turned on. The strobe on line 142 causes the device, previously enabled by the address and strobe on lines 181 and 145, to accept the number on input bus 143. The strobe on line 142 also strobes the control panel output circuit 141 causing it to generate a go command to restart execution of the calculator.

Input devices 152, 153 and 161-163 of group two are basically switches and thus no numerical data needs to be transferred. Thus when any of the devices in group two are addressed, the strobe pulse on command line 181 serves to operate the switches.

If one of the devices 161, 162 or 163 is addressed, light 53, 54 or 55 respectively is turned on, and an audible alarm sound is played over loudspeaker 60 of FIG. 2. The circuit of devices 161, 162 and 163 also are connected to the output circuit 141 such that when they are addressed, the output circuit 141 is pulsed. The pulse inhibits the generation of the next go command to the calculator, thereby preventing the calculator from continuing execution of the program after an error device has been addressed. The connection from devices 161, 162 and 163 to output circuit 141 is not shown to simplify FIG. 7.

Devices 146 to 151 are output devices which transmit data to the calculator of the invention. When one of the output devices is addressed and strobed, its data is placed on the multiconductor output bus 144. The control panel output circuit 141 then serially transmits the number requested digit-by-digit over line 176 to the I/O circuit 139. The I/O circuit places the binary coded decimal representation on data line 136. Strobe line 138 is then strobed causing the calculation input 132 to accept the digit.

When all digits of the number have been transmitted, all eight conductors of input line 137 and data line 136 are used to transmit a go command to the calculator. When the go command is placed on lines 136 and 137, strobe line 138 is strobed, and the calculator returns to program control.

The stop button 58 of choke panel is connected to output circuit 141 and inhibits the next go command from being transmitted. Thus the simulator will stop at the end of the next panel output operation. Start button 57 causes output circuit 141 to issue a go command and strobe line 138 to restart the program.

Output devices 148 and 151 only have an on or off position. Therefore, only one bit is needed to transmit the data. The full number, however, is still transmitted to calculator input 132.

Figure 17:
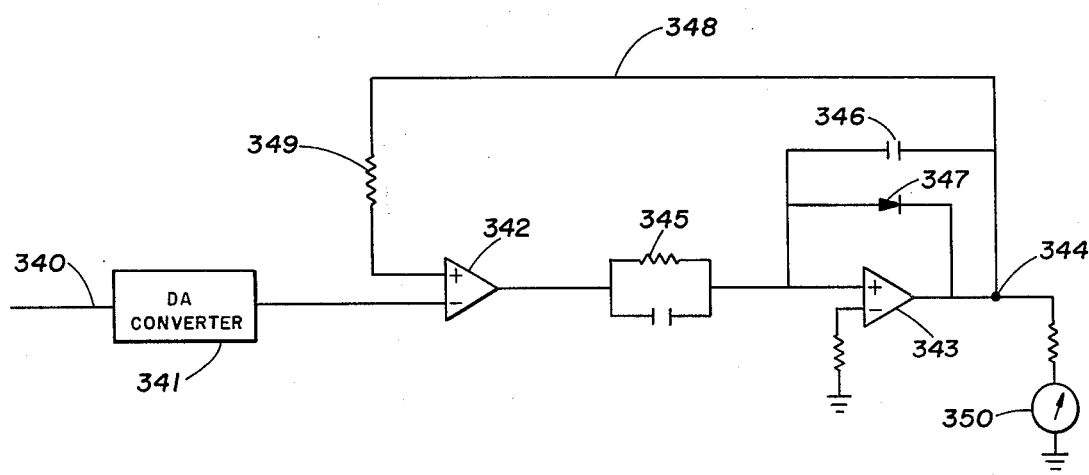

FIG. 17 presents an embodiment of the digital-to-analog converter used in input devices 154–157 to convert the digital data on input data bus 143 to a voltage signal for display on the appropriate gauge. Device 154 displays casing pressure on gauge 63; device 155 displays standpipe pressure on gauges 61 and 83; device 156 displays flow rate on gauge 76; and, device 157 displays penetration rate on gauge 75. Each of these devices uses a digital-to-analog converter 341 to convert the digital data on input data bus 143 to an analog voltage signal. The input data bus 143 is connected to the input terminals 340 of the converter. It should be remembered that input data bus 143 and input terminals 340 are multiconductor and multipin connections. A suitable converter is a DAC4912D sold by the Datel Company.

After the digital signal is converted to an analog signal, it is desirable to connect the converter 341 to its gauge 350 through a circuit capable of driving the gauge, and for smoothing the step output of the converter 341 thus driving the connected gauge smoothly from one reading to another. One embodiment of such a circuit is shown in the remainder of FIG. 17.

The output of the converter 341 is connected to the negative terminal of an operational amplifier 342. The output of the amplifier 342 is connected to a transfer circuit 345. The transfer circuit 345 is connected to the positive terminal of an operational amplifier 343, whose negative terminal is grounded. The output voltage at the output terminal of the smoothing circuit 344 has a feed-back loop for amplifier 343, which includes a capacitor 346 and a diode 347 to protect the capacitor 346. A feed-back conductor 348 connects the output terminal 344 to the positive terminal of operational amplifier 342 through resistor 349.

Any difference in the output and the input voltage of the smoothing circuit will adjust the output of the amplifier 342, thereby adjusting the output of operational amplifier 343 in such a fashion that the output will represent the input after a suitable time constant. The operational amplifier 343, acting as an integrator, will smooth out the differences at a slewing rate which will depend on the size of capacitor 346, the resistor in the transfer circuit 345, and the resistor 349.

A kelly position circuit, such as shown in FIG. 6, controlled by switch 78 of driller's panel 8 is connected to the penetration rate device 157 such that when the kelly position circuit is in the up condition, the penetration rate gauge 75 controlled by device 157 is turned off. Thus there is no penetration reading when the kelly is up.

An hydraulically controlled release valve position circuit controlled by switch 84 is similarly connected to input device 154, such that when the hydraulically controlled release valve circuit is in the closed condition, the casing pressure gauge 63 controlled by device 154 is turned off. The hydraulically controlled release valve position circuit is also connected to output device 149 such that when the valve position circuit is in the closed condition, device 149 transmits a zero to output circuit 141. Thus when the hydraulically controlled release valve is closed, the choke position reading is zero indicating a fully closed choke. This arrangement allows the calculator to determine if the well is shut-in without having to read the condition of the hydraulically controlled release valve position circuit.

When the annular preventer is closed, there can be no flow in the flow line. Thus an annular preventer's position circuit controlled by switch 80 is connected to input device 157 such that when the preventer position circuit is in the closed condition, the flow rate gauge 76 controlled by device 176 is turned off.

The pressure in the oil well can be divided into two types, static and circulating pressures. Static pressure, also referred to as hydrostatic head, is that pressure due to the column of mud above the particular point of interest. A pressure gradient can be calculated, dependent on the density of the mud concerned, in psi per foot. Thus, to find the pressure at the bottom of the hole, the total depth of the hole is corrected for deviation to find the true vertical depth, and then multiplied by this gradient to give the static portion of bottom hole pressure in psi.

Circulating pressures are basically friction losses which must be overcome by the pump as it pumps mud through the various surface equipment down the drill string 15, through the bit 13, up the annulus 12, and through the choke 41, when the choke is in the circulation path. The programmable calculator of the invention is programmed to calculate the static and circulating pressure dependent on data input to represent the well and the geometry of the circulating system being simulated.

Figure 1:
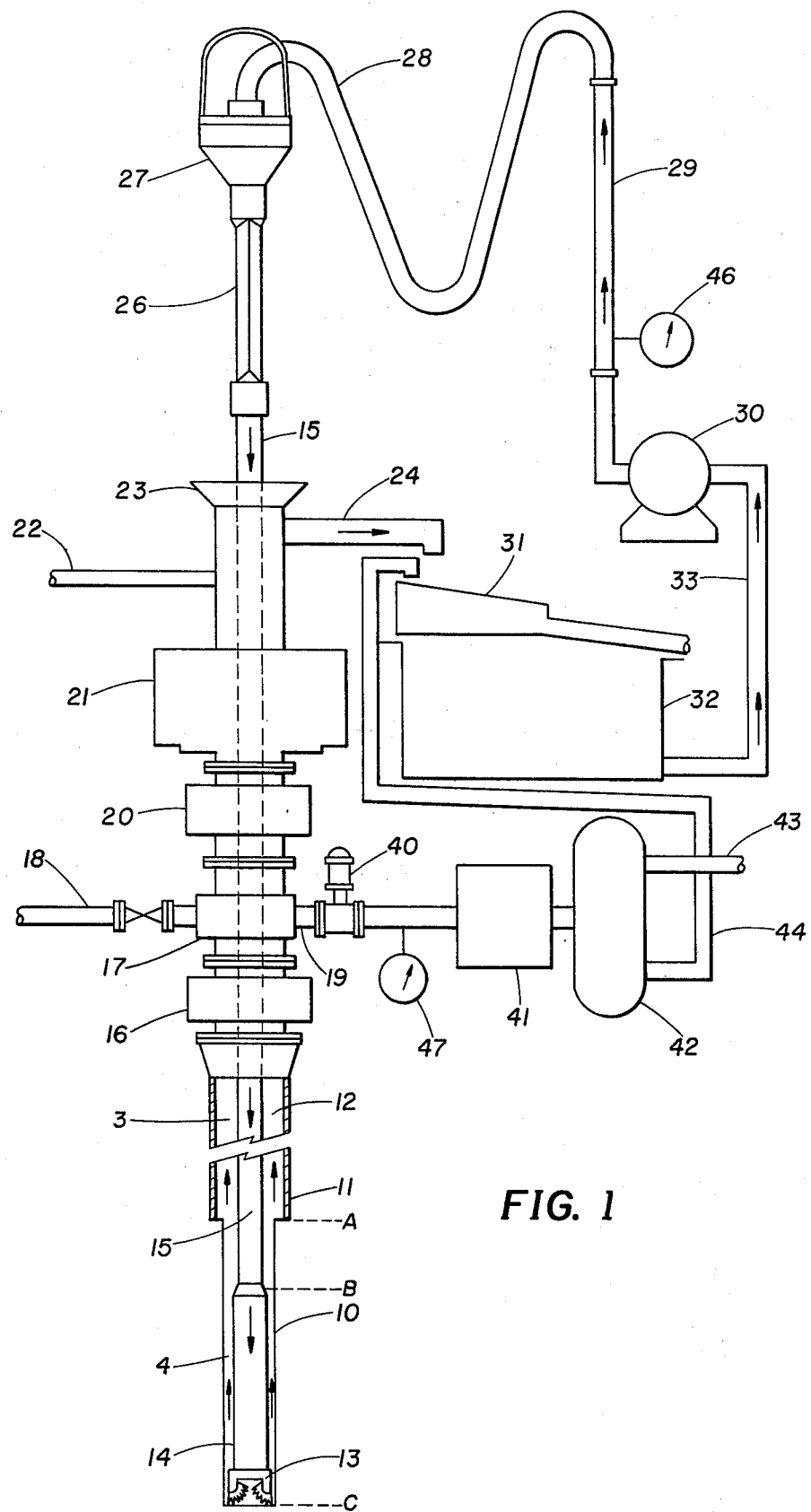

The geometry input data supplied, with reference to the circulation system in FIG. 1, includes:

1. Total well depth in feet;
2. True vertical depth in feet;
3. Depth of the fracture gradient in feet of the formation;
4. Minimum fracture gradient in pounds per gallon, specific gravity, or pounds per cubic foot, which if exceeded, will result in lost circulation of drilling mud into the formation;
5. Length of the first drill pipe size 15 of the drill string in the well from the kelly to section line B in feet;
6. The outside diameter of the first drill pipe size 15 of the drill string;
7. The inside diameter of the first drill pipe size 15 of the drill string;
8. The length of the second drill pipe size of the drill string such as drill collar 14 from section line B to section line C;
9. The outside diameter of the second drill pipe size 14 of the drill string;
10. The inside diameter of the second drill pipe size 14 of the drill string;

11. The length of casing 11 from the surface to section line A;
12. The inside diameter in inches of casing 11;
13. The length of the open hole 10 from the section line A to section line C; and,
14. The diameter of open hole 10.

The well input data for the well being simulated includes:
1. Initial mud density in specific gravity, pounds per gallon, or pounds per cu. ft.;
2. The plastic viscosity of the mud in centipoise;
3. The yield point of the mud in pounds per hundred square feet;
4. The diameter of the bit nozzles;
5. The pressure of the formation in pounds per gallon; specific gravity, or pounds per cubic foot;
6. The type of invading fluid, gas or liquid;
7. The penetration rate of the drill bit 13 in feet per hour;
8. The output of the mud pump and auxiliary pump in barrels per stroke; and,
9. The maximum pressure in psi the surface equipment will withstand before failure.

It should be understood that in the following equation, the terms used will be defined only after their first appearance. Each subsequent appearance of like terms refers to the same parameter earlier defined.

The standpipe pressure (SPP) is calculated as the sum of the pressures in the circulation system expressed by the equation:

$$SPP = P_b + \epsilon P_a + \epsilon P_p + P_s + \epsilon H_a - \epsilon H_p + CP \qquad (1)$$

where:
$P_b$ = circulating pressure loss across the bit;
$\epsilon P_a$ = the sum of circulating pressure losses in the annulus;
$\epsilon P_p$ = the sum of circulating pressure losses in the drill string;
$P_s$ = circulating pressure losses in the surface equipment;
$\epsilon H_a$ = the sum of hydrostatic head in the annulus;
$\epsilon H_p$ = the sum of hydrostatic head in the drill string; and
$CP$ = the casing pressure.

The well bore may be divided into three zones of the same geometry. The first is from the surface to the bottom of the casing at line A. The second zone is from the bottom casing at line A to the change of drill pipe size in the drill string shown at line B. The third zone is from line B to the bottom of the hole at line C. The volume capacity of the drill string and the annulus in each of these zones can be calculated from the geometry input data.

The drill string and annulus volumes of each zone can then be divided by the length of each zone to obtain a volume gradient. The volume gradient described can be used to determine the length of drill pipe or annulus a volume of fluid will occupy as the fluid is circulated through the system. The volume gradient is used in the determination of the static and circulating pressure drops for the various fluids in the drill string and annulus, to be described hereafter.

The circulating pressure loss across the bit ($P_b$) is calculated as follows:

$$P_b = (\rho_b Q^2)/(6.82 A^2 C^2) \qquad (2)$$

where:
$\rho_b$ = density of the mud flowing through the nozzles in pounds per gallon
$A$ = total bit nozzle area in square inches;
$C$ = a jet bit constant, typically 0.95; and,
$Q$ = flow rate of the mud in barrels per minute.

The fixed parameters of the equation are used to derive a bit flow constant ($K_b$) thus simplifying the equation to:

$$P_b = K_b \rho_b' Q^2 \qquad (3)$$

where $\rho_b'$ is the density of the mud flowing through the nozzles multiplied by the appropriate constant to convert it to a pressure gradient in psi per foot.

The circulating pressure loss in the annulus ($P_a$) fore each zone of the annulus is calculated by the following equation:

$$P_a = (\theta_a(i) L_a(i))/(282 D_a(i)) \qquad (4)$$

where:
$\theta_a(i)$ = equivalent shear stress of the mud in the $i^{th}$ zone in lb./100 ft.$^2$;
$L_a(i)$ = length of the $i^{th}$ zone of the annulus; and,
$D_a(i)$ = hydraulic diameter of the $i^{th}$ zone in inches.

The equivalent shear stress ($\theta_a(i)$) is calculated in accordance with the following equation:

$$\theta_a(i) = K(R_a(i))^n \qquad (5)$$

where:
$K$ = the power law consistency factor for laminar flow;
$R_a(i)$ = the equivalent Fann V.G. meter rotary speed; and
$n$ = power law flow behavior index for laminar flow.

K is calculated in accordance with the equation:

$$K = (PV + YP)/(300)^n \qquad (6)$$

where:
$PV$ = the input plastic viscosity in cps.; and,
$YP$ = the input yield point in lb./100 ft.$^2$.

$n$ is calculated in accordance with the equation:

$$n = 3.32 \log_{10}((2PV+YP)/(PV+YP)). \qquad (7)$$

$R_a(i)$ is calculated in accordance with the equation:

$$R_a(i) = (0.939 \, G_a(i) \, V_a(i))/D_a(i) \qquad (8)$$

where:
$G_a(i)$ = a geometric factor for the $i^{th}$ annulus zone; and,
$V_a(i)$ = the velocity of the fluid in the $i^{th}$ annulus zone in ft./min. $D_a(i)$ is calculated in accordance with the equation:

$$D_a(i) = DCH(i) - ODP(i) \qquad (9)$$

where:
$DCH(i)$ = the diameter of the casing or hole diameter of the $i^{th}$ zone; and,
$ODP(i)$ = the outside diameter of the drill string in the $i^{th}$ zone.

$G_a(i)$ is calculated in accordance with the equation:

$$G_n(i) = \frac{(((3-a(i))n+1)/(4-a(i))n)(1+a(i)/2)}{(\beta^{2/n}/n\beta^2)((\beta^2-1)/(\beta^{2/n}-1))} \quad (10)$$

where $a(i)$ = the shape factor for the $i^{th}$ zone; and,
$\beta$ = Fann V.G. meter constant, typically 1.068.
$a(i)$ is calculated in accordance with the equation:

$$a(i) = 1-(1-\alpha^x(i))^{1/x} \quad (11)$$

where:

$\alpha$ = the ratio of $ODP(i)/DCH(i)$; and,
$x = 0.37n^{-0.14}$.

The flow in the annulus is assumed to be in laminar flow. The annular circulating pressure loss equations may be solved using a unity velocity. The resulting pressure may then be divided by the total length of the annulus and the mud density expressed as psi/ft. to give an annulus circulating pressure change at unity velocity per foot density. This constant can then be used to approximate the annulus circulating pressure loss over any desired length of annulus and for changed mud densities and flow rates by the equation:

$$P_n(i) \approx K_a Q^n L_n(i) \rho' a(i) \quad (12)$$

where:

$K_a$ = annulus circulating pressure loss constant;
$Q$ = the flow rate in barrels per minute;
$La(i)$ = the length of the $i^{th}$ annulus zone; and,
$\rho'a(i)$ = the density in psi/ft. of the fluid in the $i^{th}$ annulus zone.

The circulating pressure loss in the drill string ($P_p$) for each drill pipe size string is calculated in accordance with the equation:

$$P_p = (\theta_p(i)L_p(i))/(282 ID_p(i)) \quad (13)$$

where:

$\theta_p(i)$ = the equivalent shear stress of the fluid in the $i^{th}$ pipe string in lb./100 ft.$^2$;
$L_p(i)$ = the length of the $i^{th}$ string of drill pipe; and,
$ID_p(i)$ = the inside diameter of the $i^{th}$ string of drill pipe.

The equivalent shear stress ($\theta_p(i)$) is calculated in accordance with the equation:

$$\theta_p(i) = \left(\frac{(20.67 KR_p(i)^n)}{(\rho_p(i)G_p(i)V_p(i))}\right)^b (.003c\rho_p(i)V_p(i)^2) \quad (14)$$

where:

$R_p(i)$ = equivalent Fann V.G. meter rotary speed for the $i^{th}$ string;
$\rho_p(i)$ = the fluid density in lb./gal. for the fluid in the $i^{th}$ string of drill pipe;
$G_p(i)$ = a geometrical factor for the $i^{th}$ string of drill pipe;
$V_p(i)$ = velocity in ft./min. of the fluid in the $i^{th}$ string of the drill pipe;
$b$ and $c$ = constants for turbulent friction factors; and,
$n$ = the power law flow behavior index for laminar flow.

$n$ is calculated in accordance with equation 7 above.
$k$ is calculated in accordance with equation 6 above.
$b$ is calculated in accordance with the equation:

$$b = (1.75-\log_{10}n)7.0 \quad (15)$$

$c$ is calculated in accordance with the equation:

$$c = (\log_{10}n+3.93)/50.0 \quad (16)$$

$R_p(i)$ is calculated in accordance with the equation:

$$R_p(i) = (0.939G_p(i)V_p(i))/ID_p(i) \quad (17)$$

where:

$ID_p(i)$ = the inside diameter of the drill string in the $i^{th}$ string.
$G_p(i)$ is calculated in accordance with the equation:

$$G_p(i) = ((2n+1)/3n)(\beta^{2/n}/n\beta^2)((\beta^2-1)/(\beta^{2/n}-1)) \quad (18)$$

where:

$\beta$ = Fann V.G. meter constant, typically 1.068.

The flow of the mud in the drill pipe is assumed to be in turbulent flow.

As with the annulus circulating pressure loss, the drill string pressure loss can be calculated with a unity velocity and the initial mud density to find the drill string circulating pressure loss for each size drill pipe in the well. The pressure loss calculated is then divided by the length of the drill pipe and the inital density of the mud expressed as psi/ft. to give a drill string circulating pressure loss constant for each string of drill pipe in the well.

This drill string circulating pressure loss constant can then be used to approximate the pressure loss over any length of similar drill pipe for a given flow rate and mud density in accordance with the following equation:

$$P_p(i) \approx K_p Q^s L_p(i) \rho'_p(i) \quad (19)$$

where:

$K_p$ = the drill string circulating pressure loss constant;
$Q$ = the flow rate;
$s$ = power law flow behavior index for turbulent flow;
$L_p(i)$ = the length of the $i^{th}$ section of drill pipe; and,
$\rho'(i)$ = the density in psi/ft. of the fluid in the $i^{th}$ section of the drill pipe.

$s$ is calculated in accordance with the equation:

$$s = nb-2b+2 \quad (20)$$

An exact determination of the pressure losses in the surface equipment would be very complex. However, the surface equipment pressure losses are a small percentage of the total pressure losses in the total circulation system. It has been found that a reasonable approximation can be made for the purposes of the simulation by the equation:

$$P_s \approx 1.02(\epsilon P_a + \epsilon P_p + P_b) \quad (21)$$

The casing pressure (CP) during (CP the choke is equal to the circulating pressure losses ) $_{the\ D}$ and is a function of several parameters including the density of the fluid flowing through the choke, the relative opening in the choke, and the flow rate of fluid through the choke. It has been found that casing pressure, when fluid is being pumped through the choke, may be approximated for the purpose of the simulation by the equation:

$$CP \approx \rho_c'(69\sqrt{Q_r/(dc+1)})^4 \quad (22)$$

where:

$\rho_c'$ = the density of the fluid flowing through the choke in psi/ft.;

$Q_r$ = an approximated flow rate of the fluid flowing through the choke; and, $dc$ = the choke setting in percent, where 0 is fully closed and 100 is fully opened.

The flow rate ($Q_r$) of the fluid through the choke will be a composite flow rate with a component due to the pump rate and a component due to the expansion of the invading fluid in the annulus. It has been found that for the purposes of the simulation, the flow rate through the choke can be approximated by the equation:

$$Q_r \approx (Q/0.2) + 10^i \sqrt{\epsilon Vol_{if}} \qquad (23)$$

where:

Q = the flow rate of the mud due to the pump rate;

$\epsilon Vol_{if}$ = the total volume of invading fluid in the annulus; and, $i$ = a number in the range of about 2 to 10.

The value of $i$ is chosen to fit the calculator of the invention and the electronics of the panels in order to give a good simulation of the flow rate desired. The preferred value of $i$ is 4.

If the well is shut-in, the casing pressure is calculated in accordance with the equation:

$$CP = SBHP - \epsilon H_a \qquad (24)$$

where:

SBHP = the shut-in bottom hole pressure and is the greater of the formation pressure (FP) or the sum of the static mud pressure in the drill string ($\epsilon H_p$).

In addition to the displays of panels 7 and 8, the bottom hole pressure and equivalent mud weights at the minimum fracture gradient depth may be displayed on an appropriate observer's panel. Such a display would enable an instructor to monitor the bottom hole condition, thus evaluating the effectiveness of the students+ actions.

The bottom hole pressure (BHP) during circulation is calculated in accordance with the equation:

$$BHP = CP + \epsilon H_a + \epsilon P_a \qquad (25)$$

The equivalent mud weight ($\rho_e$) in pounds per gallon at the minimum fracture gradient depth ($D_e$) may be calculated in accordance with the equation:

$$\rho_e = (CP + \epsilon H_a + \epsilon P_a)\big|_0^{D_e}/(0.052 D_e) \qquad (26)$$

where:

$(\epsilon H_a 30 \epsilon P_a)\big|_0^{D_e}$ = the circulating pressure losses in the drill string and the annulus summed from the surface to the minimum fracture gradient depth; and, $D_e$ = the depth of the minimum fracture gradient in feet.

It is well known that the volume of formation fluid which will invade the wellbore when the formation pressure exceeds the bottom hole pressure can be calculated by the Darcy equation with two of the parameters being the formation porosity and formation permeability. It has been found that the rate of penetration can be substituted as a variable related to porosity and permeability to produce a synthetic Darcy equation for calculating the bottom hole volume of invading fluid ($Vol_{if}$) for simulation purposes by the equation:

$$Vol_{if} = RP\,(FP-BHP)10^{-4} \qquad (27)$$

where:

RP = the input rate of penetration.

In order for the wellbore to receive a kick, it is necessary for the formation pressure to exceed the bottom hole pressure at some point during the simulation. Thus, the input formation pressure must be higher than the calculated bottom hole pressure in order for the simulated well to receive a kick. The calculator is programmed to calculate a formation pressure higher than the bottom hole pressure, to be discussed later.

If the invading fluid is gas, it will be controlled by the gas law as the gas is circulated to the surface. The gas law is expressed by the equation:

$$P_1 V_1/T_1 Z_1 = P_2 V_2/T_2 Z_2 \qquad (28)$$

where:

$P_1, P_2$ = pressure at point 1 and 2;

$T_1, T_2$ = temperature at point 1 and 2;

$Z_1, Z_2$ = compressibility at point 1 and 2; and, $V_1, V_2$ = volumes at point 1 and 2.

The gas equation can be used to determine the volume of the gas as it is circulated to the surface. A typical temperature gradient is used to determine the temperature of the gas in relation to its depth as the gas moves to the surface. The compressibility or Z factor is a function of T and P, and an expression can be developed to express the Z factor at any point in the well.

The pressure on the gas ($P_g$) at a given depth in the well may be calculated by the equation:

$$P_g = CP + \epsilon P_a\big|_0^{D_g} + \epsilon H_a\big|_0^{D_g} \qquad (29)$$

where:

CP = the casing pressure calculated by equation 24, as the gas cannot expand if the well is shut-in;

$\epsilon P_a\big|_0^{D_g}$ = the sum of annulus pressure losses from the surface to the depth of the gas calculated in accordance with equation 12; and $\epsilon H_a\big|_0^{D_g}$ = the sum of the static pressure of the mud in the annulus from the surface to the depth of the gas.

The compressibility factor (Z) may be calculated in accordance with the equation:

$$Z = 1 - 1.57 \times 10^{-4}(P_g) + 4.85 \times 10^{-8}(P_g)^2 - 3.99 \times 10^{-12}(P_g)^3 + 1.11 \times 10^{-16}(P_g)^4 \qquad (30)$$

Because the density of gas is much less than that of the mud in the annulus, the gas will migrate up the hole faster than the mud is being circulated. Thus, for a given increment of time, a volume of gas ($\Delta M$) will displace a like volume of mud above it, and float to the surface faster than the mud which originally surrounded the gas. To correct the mud flow for this phenomenon, it can be considered that the mud above the gas is migrating down the annulus in $\Delta M$ barrel increments as the gas is migrating up the annulus. It has been found that this volume for simulation purposes may be approximated in accordance with the following equation:

$$\Delta M = n(\rho'_{oM}/6) \qquad (31)$$

where:

$\Delta M$ = the barrels of mud displaced;

$n$ = power law flow behavior index for laminar flow calculated in accordance with equation 7; and, $\rho'_{OM}$ = the density in psi/ft. of the old mud, or the mud immediately above the gas in the annulus.

Figure 11:
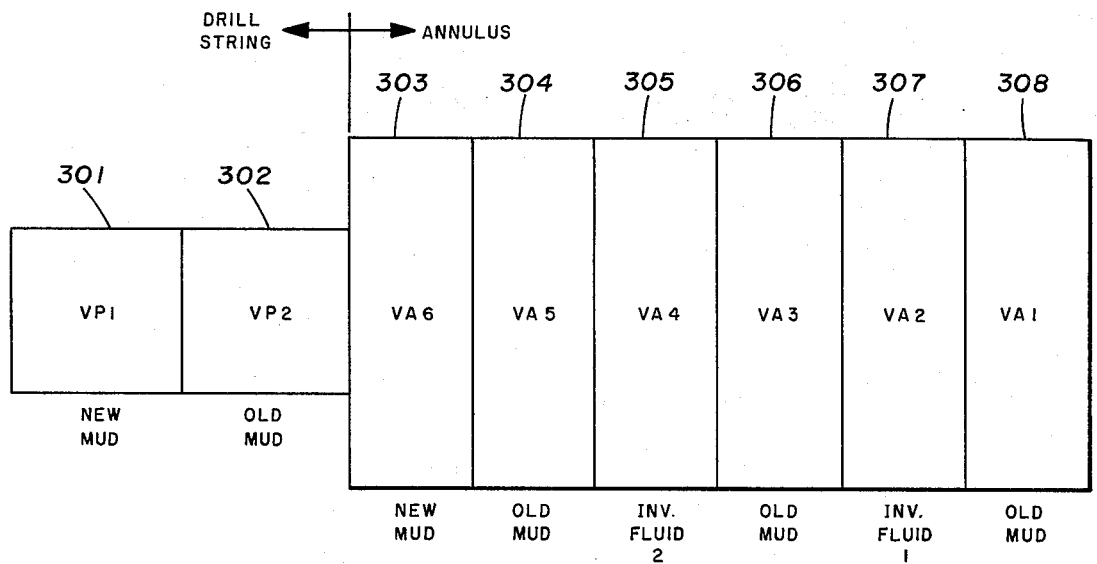

In order to account for the flow of two different densities of mud in the drill string, and the two muds and two different kicks of invading fluids in the annulus, eight data registers are reserved in the digital calculator to represent the volumes of the different fluids as they move through the well. These registers, identified hereafter by the parameters they contain, are illustrated in FIG. 11 and are tabulated as follows:

| REF. NO | REGISTER | REPRESENTS |
|---|---|---|
| 301 | VP1 | new mud in the drill string |
| 302 | VP2 | old mud in the drill string |
| 303 | VA6 | new mud in the bottom of the annulus |
| 304 | VA5 | old mud below the invading fluid |
| 305 | VA4 | invading fluid, kick 2 |
| 306 | VA3 | old mud between the kicks |
| 307 | VA2 | invading fluid, kick 1 |
| 308 | VA1 | old mud above the invading fluid |

The total volume of mud pumped is determined from the cumulative pump strokes shown on display 71 and the volume of each stroke of the pump. The cumulative pump strokes before the counter display 71 is reset by reset button 56 represents the old mud pumped. The cumulative pump strokes after the display 71 is reset represents the new mud pumped.

As old mud is pumped into the drill string, its volume is added to register VP2 until the volume of VP2 equals the volume capacity of the drill string. The volume of old mud pumped above the capacity of the drill string is then added to register VA1 until the volume of VA1 equals the volume of the annulus. This condition will exist until kick 1 occurs.

The volume of the invading fluid of kick 1 calculated in accordance with equation 27 will be moved to register VA2. Old mud pumped after the well receives kick 1 will move into register VA3. As kick 1 migrates up the annulus in $\Delta M1$ increments faster than the mud in register VA1, a volume of mud equal to $\Delta M$ per iteration can be considered as moving from VA1 to VA3. If the well receives a second kick, the volume of kick 2, calculated in accordance with equation 27, is moved to register VA4. Old mud pumped after the well receives kick 2 moves into register VA5.

As with kick 1, kick 2 migrates up the annulus in $\Delta M2$ increments faster than the mud in register VA3. This is reflected as a volume of mud equal to $\Delta M2$ per iteration being moved from register VA3 to VA5.

When new mud is pumped into the well, it will move into register VP1. An equal volume of old mud will be displaced from VP2 to VA5. When the volume of new mud in register VP1 equals the volume capacity of the drill string, the added new mud will be added to VA6. When the volume of new mud added to VA6, or the volume of old mud in VA5, equals the volume capacity of the annulus, the circulation is complete.

It can be seen that the sum of the volumes in the VA registers cannot exceed the volume capacity of the annulus. Any surplus will represent fluid displaced from the well.

By comparing the volumes in each volume register illustrated in FIG. 11 with the geometric zones determined for the drill string and annulus, the length of drill string and annulus each volume occupies can be determined. The volumes of old mud and new mud will determine the depth of the invading fluid in VA4. If the well is not shut-in, and the invading fluid is gas, it will expand in accordance with the pressure at its depth.

The pressure of the invading fluid in VA4 can be determined by equation 29. The volume of the gas at that depth can be determined by the gas law of equation 28. The volumes in registers VA4 and VA3 can, likewise, be used to determine the depth of kick 1 in register VA2. As before, the equations 29 and 28 can be used to determine the pressure and volume of kick 1. The volume of kick 1 will then determine the volume of old mud in VA1.

It will now be understood that $\epsilon VOL_{if}$ of equation 23 is VA2 + VA4. Equation 23 thus becomes:

$$Q_r \approx (Q/0.2) + 10 \sqrt[t]{VA2+VA4} \tag{32}$$

The volumes of the registers of FIG. 11 can be calculated in accordance with the following equations to simulate the fluid flow through the well:

$$VP1 - BNM \tag{33}$$

where:
$BNM$ = barrels of new mud pumped; and where the value of VP1 is greater than or equal to zero, and less than or equal to the total volume of the drill string ($\epsilon V_p$).

$$VP2 = \epsilon V_p - VP1 \tag{34}$$

where the value VP2 is not less than zero.

$$VA6 = BNM - VP1 \tag{35}$$

where:
$BNM$ = barrels of new mud pumped; and, the value of VA6 is greater than or equal to zero, and less than or equal to the total volume of the annulus ($\epsilon V_a$).

$$VA3 = (BOM + VP1) + \Delta M1 - \Delta M2 \tag{36}$$

where the expression (BOM+BP1) is greater than or equal to zero, and less than or equal to ($\epsilon V_a$).

$$VA5 = (BOM - VA3 + \Delta M2) \tag{37}$$

where the value of VA5 is greater than or equal to zero, and less than or equal to ($\epsilon V_a$).

$$VA1 = \epsilon V_a - (VA2+VA3+VA4+VA5+VA6) \tag{38}$$

where, if the invading fluid is gas, the volumes of VA2 and VA3 are the volumes of gas expanded as explained above in accordance with equations 28 and 29.

The pump rate and the barrels of mud pumped per stroke can then be used to determine Q in barrels per minute. The densities of the old mud and new mud, and the length of each volume in the VP and VA register is known. Thus, using equations 12 and 19, the circulating pressure losses in the drill string and annulus can be calculated. Typical density values for salt water or gas can be used with equation 19 to determine the circulating pressure losses of the invading fluid in VA2 and VA4. Also using the densities and lengths of the muds and invading fluid, the static pressures can, likewise, be determined.

The circulating pressure bit loss is calculated in accordance with equation 3. Pressure losses in the surface equipment is calculated in accordance with equation 21. The flow rate through the choke is calculated in accordance with equation 32. The casing pressure is calculated in accordance with the equation 22, if there is circulation through the choke, or equation 24, if the well is shut-in. All of the various pressures are now known in order to calculate the standpipe pressure in accordance with equation 1.

A set of numerical codes is established to represent a failure in some part of the circulation system. These degree of difficulty codes (DOD) can include:

0 = no failure;
1 = plugged nozzle;
2 = washout in drill pipe;
3 = pump swab cut out; and
−1 = any one of the above, plus allowing the calculator to determine the formation pressure and the type of invading fluid.

At an appropriate time in the calculation, the DOD code is checked and, dependent on its value, the parameters of the appropriate equation is changed to simulate the failure desired. For instance, for a DOD code of 1, the constant $K_b$ of equation 3 would be changed to show the decrease in the total bit nozzle area A of equation 2. For a DOD code of 2, the constant $K_b$ will be changed to zero. For a DOD code of 3, the flow rate Q of equations 12, 19 and 33 will be greatly reduced, requiring the operator to change to the auxiliary pump.

If the DOD code is −1, the formaton pressure and type of invading fluid is determined from a random number, generated from a time-dependent value which is not likely to repeat itself from simulation to simulation. The preferred time-dependent number is the standpipe pressure (SPP) calculated from the current control setting and input data. The random number (N) is calculated in accordance with the equation:

$$N = \sqrt{SPP+2} - INT(\sqrt{SPP+2}) \quad (39)$$

where:

INT indicates that only the digits to the left of the decimal, or the integer value of the expression, is used in the equation. For example, if the standpipe pressure equals 958.6 psi, then $\sqrt{SPP+2}$ = 30.9935, and INT($\sqrt{SPP+2}$) = 30.

Thus, the random number generated in accordance with equation 39 is 0.9935. It can thus be seen that the random number N will always be equal to or greater than zero, and less than one.

The formation pressure calculated in response to the random number is calculated in accordance with the equation:

$$FP = TD(TVD/TD)(\pi'+0.04+N/20) \quad (40)$$

where:
TVD = the input initial total vertical depth;
TD = the input initial total depth; and,
$\pi'$ = the initial density of the mud expressed in psi/ft, the ratio (TVD/TD) having been previously calculated and stored for use as a hole deviation correction factor for the hydrostatic head calculation.

Equation 39 is expressed as taking the square root of the time dependent variable. However, the variable could be raised to any fractional power to give a random number less than one, and greater than zero. Also, the constants 0.04 and 20 in equation 40 can be substituted by other constants which, when used with the random number N, will result in a reasonable increase in formation pressure above the bottom hole hydrostatic pressure of the mud in the well.

If the DOD code is −1, the random number N is also used to generate a new random DOD code. Since N is greater than 0 and less than 1, it can be multiplied by 4, and the digit to the left of the decimal will always be a digit greater than 0, but less than 4. Thus, the calculator generated DOD code equation is:

$$DOD = INT(4N) \quad (41)$$

Failure of the circulation system is simulated in accordance with the DOD code when:

$$\text{Total mud pumped} > \frac{\epsilon V_a}{2+N} \quad (42)$$

This insures that the failure will occur while the kick is in the lower portion of the annulus.

PROGRAMMABLE CALCULATOR INSTRUCTIONS

The programmable calculator 130 in the invention may be programmed to perform the foregoing calculations to determine the pressures and volumes desired. Programming is done with the instruction set compatible with the particular calculator being used. The instruction set for use with the preferred calculator is set out in the manual "600 Series Reference Manual with Programming" published by Wang Laboratories, Inc., in 1972, which may be used by one skilled in the art to program the calculator of the disclosed embodiment.

Figure 8A:
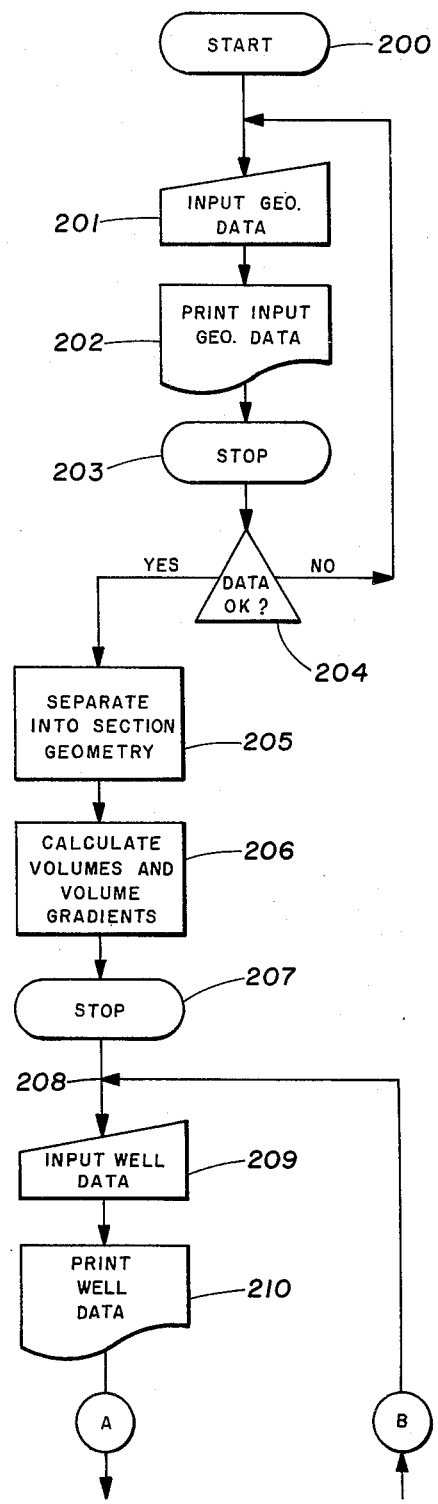
Figure 8B:
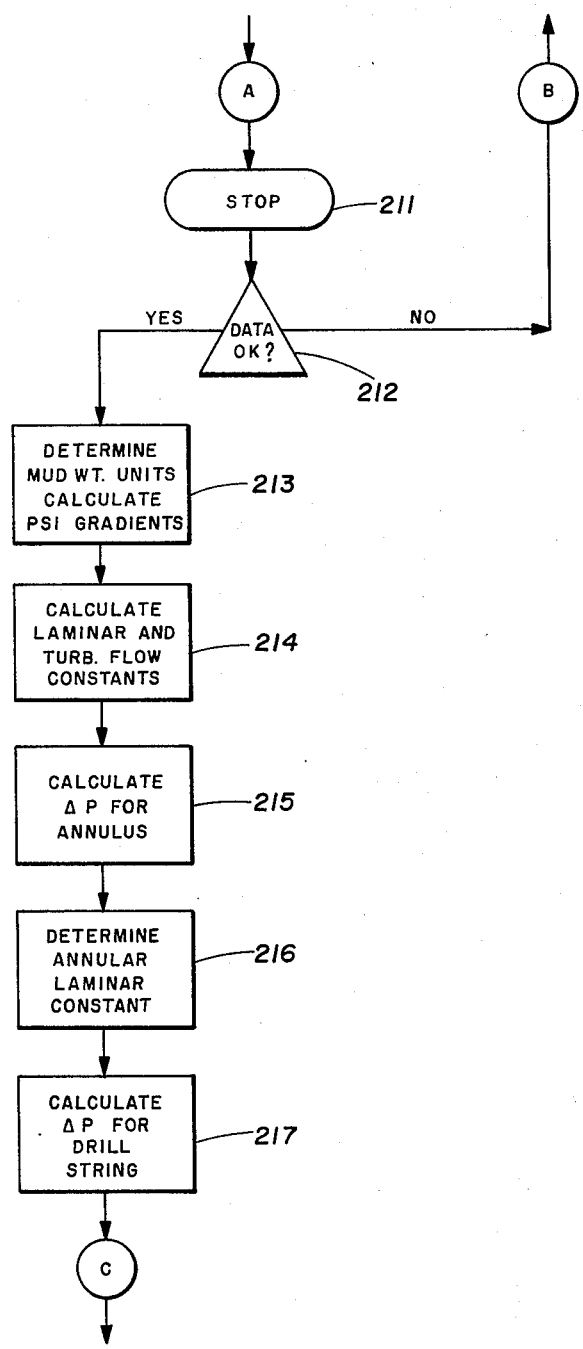
Figure 8C:
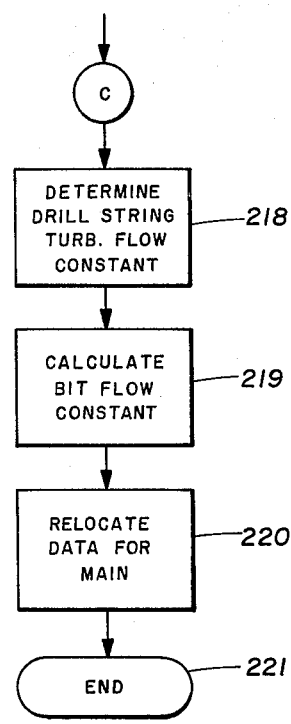
Figure 9A:
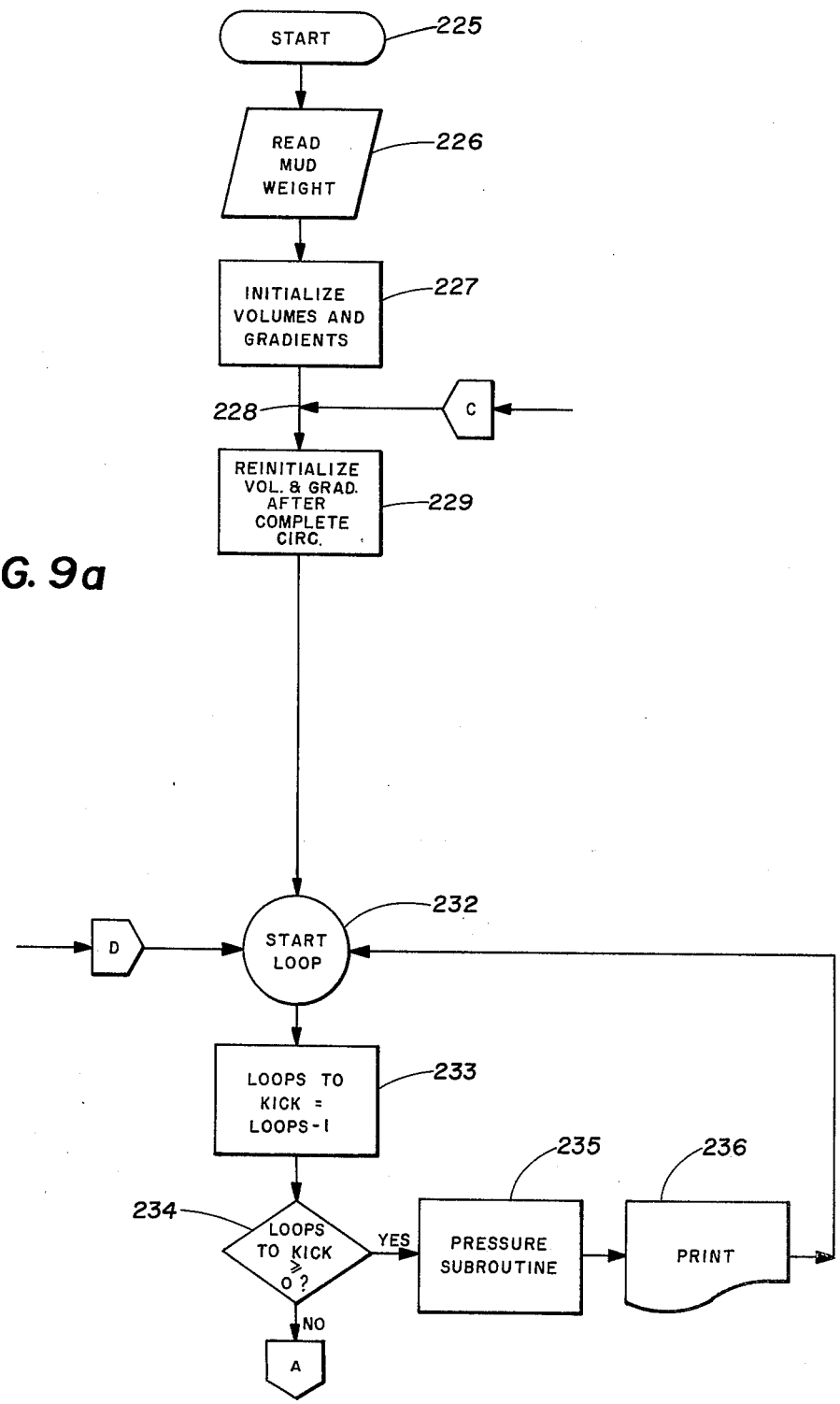
Figure 9B:
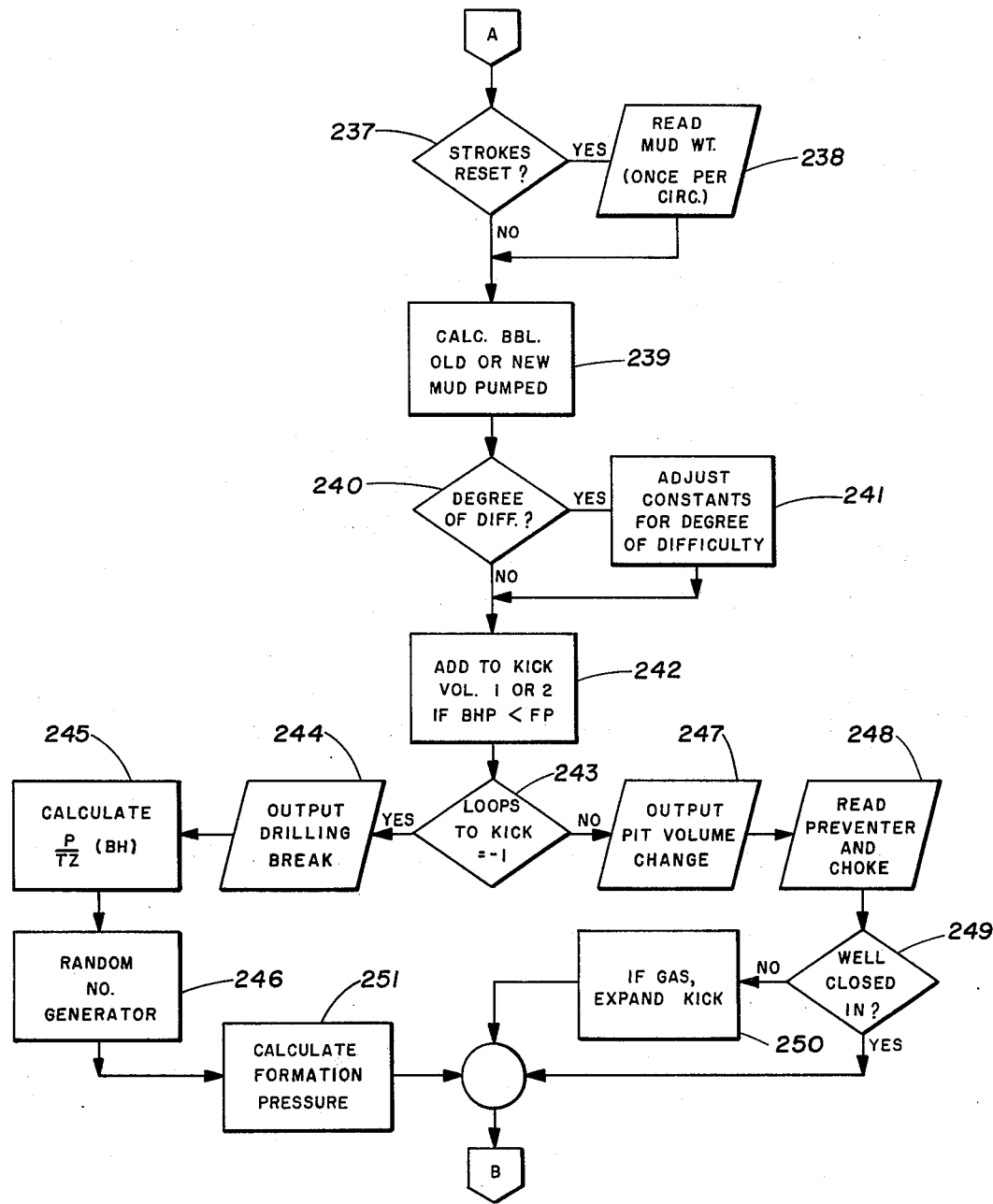
Figure 9C:
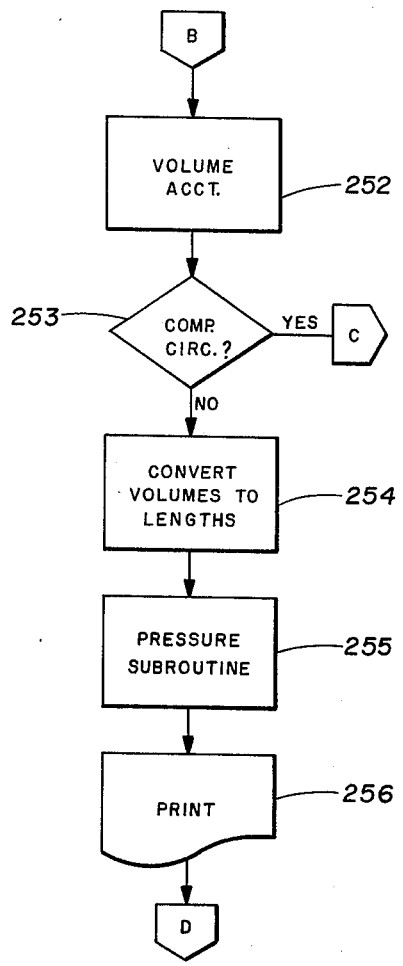
Figure 10A:
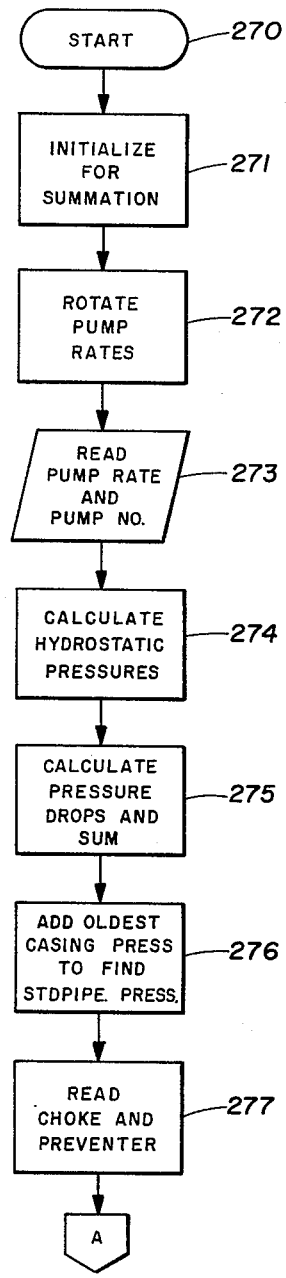
Figure 10B:
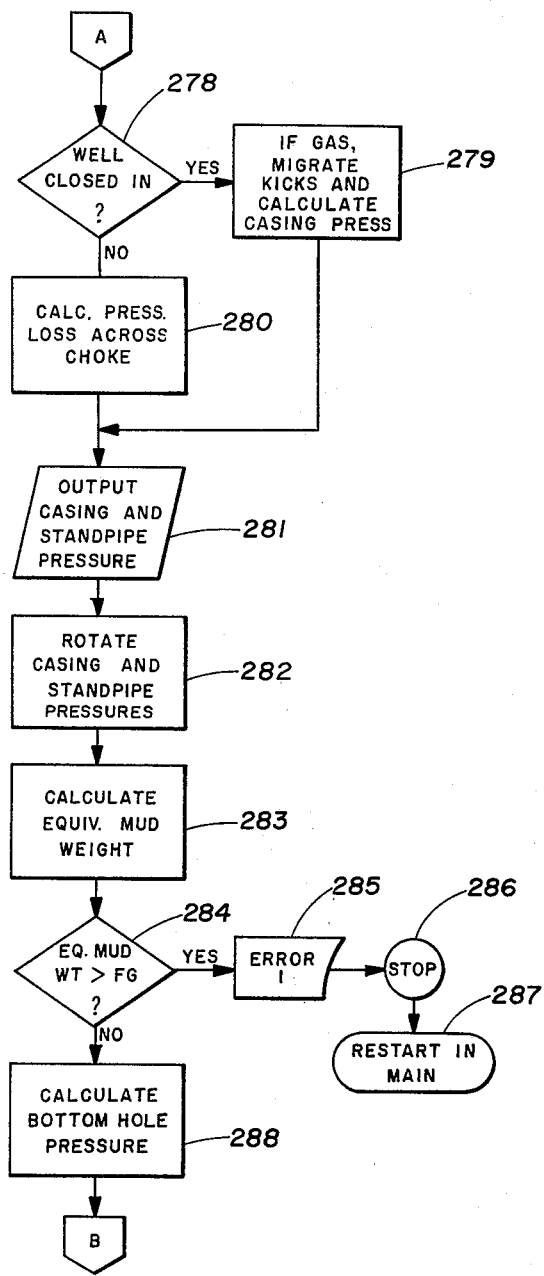
Figure 10C:
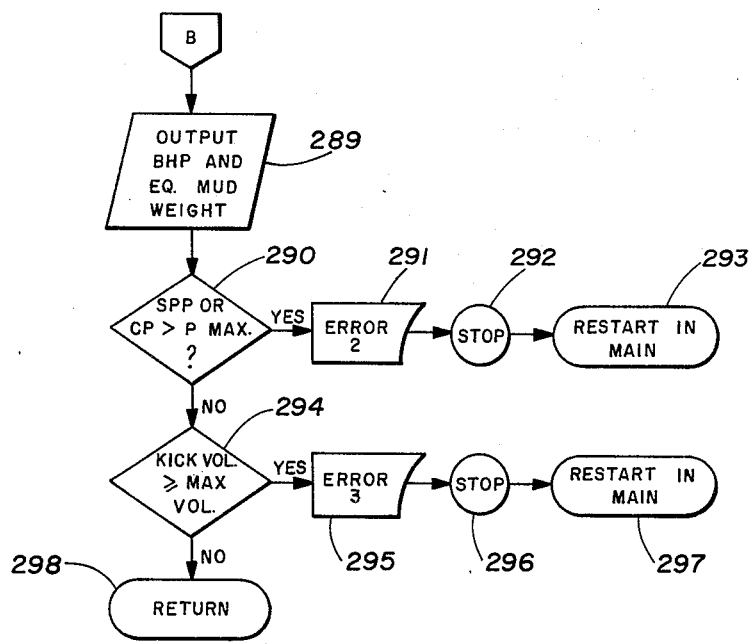

The calculator programming is divided into two programs which include: a data input and constant initialization program labeled BOSS-O and illustrated in FIG. 8; and a main simulation program labeled BOSS-M and illustrated in FIG. 9, which includes a pressure subroutine illustrated in FIG. 10 for calculating the various pressures during the execution of the BOSS-M program.

The BOSS-O routine of FIG. 8 is started at start instruction 200. The previously listed geometry data is input by the operator at block 201, and listed by the calculator at block 202. The calculator then stops at block 203 to allow the operator to verify the data input at block 204. If the data is wrong, the operator returns to block 201 and corrects the incorrect data.

If the data is correct, the calculator then divides the well at block 205 into zones between the surface and line A, line B and line C of FIG. 1. At block 206, the volumes of the various well zones are determined as heretofore described. Also, at 206, these zones are described as gradients in barrels per foot for use in correlating the volumes of the VP and VA registers to drill string and annulus lengths.

The calculator then stops at 207 to indicate to the operator that it is ready to accept the well data. Well data is entered at 209 by the operator, and printed at 210 by the calculator for verification. The calculator stops at 211 to allow the operator to verify the data at 212. If there is an error, the operator returns to point 208 to correct the error. When the data is correct, the operator instructs the calculator to continue execution.

In block 213 the mud density, referred to as mud weight, is examined to determine the units used. Density unit conventions vary from region to region. Therefore, if the value is equal to or greater than 4, but less than 40, the units are assumed to be in lbs./gal. If the value is equal to or greater than 40, the units are assumed to be in lb./cu.ft. If the value is less than 4, the units are assumed to be in specific gravity. Once the units are determined, the density is multiplied by the proper constant to convert the density units to psi per ft.

In block 214 the input data is used to determine the various laminar and turbulent flow constants for use in determining the circulating drill pipe and annulus pressure losses. The constants are calculated in accordance with equations 5–11, and equations 14–18. $V_a$ ($i$) of equation 8, and $V_p$ ($i$) of equation 14 are assumed to be at a value which will give a pressure loss in per unit velocity.

The circulation pressure loss in the annulus is calculated at block 215 in accordance with equation 4. The determined pressure loss is then divided at block 216 by the length of the annulus and the initial mud density to give the constant $K_a$ for later use in equation 12.

Likewise, the circulation pressure loss in the drill string is calculated at block 217 in accordance with equation 13. This determined pressure loss is then divided at block 218 with the length of the drill string and the initial mud density to give the constant $K_p$ for later use in equation 19.

The total bit nozzle area is used at block 219 to calculate the bit flow constant $K_b$ for later use in equation 3 for calculating the circulating pressure loss across the bit.

The constants developed and the input data needed in the BOSS-M routine are then relocated at block 220 into suitable data registers where they can later be accessed as called for. The BOSS-O routine ends at block 221.

It can be seen that the constants developed in the BOSS-O routine will greatly simplify the later pressure calculations.

The BOSS-M simulation routine of FIG. 9 starts at block 222. The mud weight reading set on digital device 64 is read at block 226 by the calculator output means 131 of FIG. 7 by placing the address for device 152 on address line 135, as discussed earlier. At block 227, the values of volumes in the VP and VA registers of FIG. 11 are initialized and the mud weight is converted to psi/ft. as discussed in connection with block 213 of FIG. 8.

At block 229, the volume and gradient registers are reinitialized in response to a determination which indicates that a circulation out of the well kick is complete. This determination is made by comparing the volume of mud in registers VA5 and VA6 to the volume of the annulus.

The start of the circulation simulation loop starts at point 232.

Each time the calculator program passes point 232, the value of a parameter indicating the number of loops before a kick is initiated (loops-to-kick) is decreased by one. The initial value of loops-to-kick is input by the operator prior to the execution of the BOSS-M program.

A comparison is made at 234 to see if the value of loops-to-kick is greater than or equal to zero. A value of loops-to-kick greater than or equal to zero indicates a normal circulation is taking place. If the comparison of 234 is true, the pressure subroutine is called at block 235, the pressures are printed at block 236, and a new loop is started at 232. The printing operation at 236 provides a permanent record of the simulation to be used, for example, as a record of the student's training. It is preferable to print only after a selected number of loops in order to keep the record manageable.

A value of loops-to-kick less than zero at 234 indicates that a well kick is being or is about to be initiated. The false branch of 234 is the start of the well kick loop. It will be seen during the discussion of FIG. 10 that the cumulative pump strokes display will have been read during the pressure subroutine. A present value of cumulative pump strokes on this loop less than the cumulative pump strokes on the last loop indicates that the stroke counter 71 has been reset. This determination is made at 237. If the strokes have been reset, the calculator at 238 reads the mud weight control 64. The mud weight counter is read only once during each kick circulation because of the limited capacity of the calculator. More checks per circulation could be made if the calculator could account for more than two mud densities at the same time.

If the strokes display has not been reset, barrels of old mud pumped is calculated at block 239. However, if the strokes display has been reset, barrels of new mud pumped is calculated at block 239. The relationship of equation 42 is compared at 240 to determine if the degree of difficulty failure is to occur during this loop. If the comparison is true, the appropriate constant is adjusted at 241 to simulate the failure called for by the value of the degree of difficulty code. It will be noted that during the first kick loop, the random number has not yet been generated; and, there is no machine-generated DOD code in the case where the DOD code is to be selected by the calculator program. However, block 241 will be executed only after several kick loops have been executed and the random number N has been generated.

The bottom hole pressure is compared to the formation pressure at block 242; and if the formation pressure is higher, the invading fluid volume will be added to the volume value stored in either VA2 or VA4 in accordance with equation 27. The initial value of formation pressure is set equal to or lower than the value of bottom hole pressure in order that the well kick not be initiated until after the first well kick loop.

A comparison is made at 243 to determine if the value of loops-to-kicks equals −1. If the comparison is true, it indicates that this loop is the first loop of a kick. The value of rate of penetration is increased by a set amount, such as multiplying the rate of penetration by $\sqrt{3}$, to indicate a drilling break. This higher value is output to device 157 for display on gauge 75 of driller's panel 8 to indicate the initiation of a well kick.

The gas law values of pressure, temperature, and compressibility are determined at 245 for the bottom of the hole conditions for later use in correcting the volume of gas as the gas moves to the surface.

The random number N is generated at block 246, and is used to calculate the formation pressure at block 251. After the formation pressure is calculated in the first well kick loop, the volume accounting equations are executed at block 252. The volume accounting equations are equations 33–38 wherein the volumes of mud and invading fluid are determined for registers VP1, VP2 and VA1 to VA6.

The volume of VA5 and VA6 is compared to the volume of the annulus at 253 to determine if a complete circulation has been made. If the comparison is true, the program returns to point 228 and executes the reinitialization of block 229 as discussed above. If a circulation has not been completed, each volume in the VP and VA registers is converted to lengths in accordance with the volume gradients calculated at block 206 of FIG. 8. If the lengths of the various volumes indicate that gas is present at the surface, the gas sound is turned on. If the fluid at the surface is not gas, the gas sound is turned off.

The pressure subroutine is called at block 255 for calculating and displaying various pressures. Selected pressures are printed at 256 to continue the permanent record of the simulation.

After the first well kick loop, the comparisons of 243 will be false, and the program will branch to block 247. The calculator output means 131 will output at 247 the pit volume change to device 160 for display on digital display 72 of choke panel 7. It will be noted that the pit volume change is actually the change calculated in the previous loop.

At block 248 the state of the preventer switch 80 and the percent opening of the choke is read. A comparison is made at 249 to determine if the preventor is closed, and if the choke is closed. If the comparison of 249 is true, the well is shut-in and the invading fluid, if gas, cannot expand. In that case, the program branches to the execution of block 252.

If the comparison of 249 is false, and the invading fluid is gas, block 250 is executed. By knowing the length of mud volumes in register VA6 and VA5, the depth of the gas in VA4 can be determined. The pressure on the gas is then calculated in accordance with equation 29. The gas law of equation 28 is then used to determine the new volume of the gas which is then stored in VA4. This new volume is then converted to a length. The lengths of the volumes in registers VA6, VA5, VA4 and VA3 can then be used to locate the depth of the gas volume in register VA2. The pressure on the gas volume in VA2 is calculated in accordance with equation 29. Equation 28 is then used to calculate the new volume of the gas, which is then stored in VA2. After the expanded volumes of the gas are calculated and stored, the program continues to block 252.

The BOSS-M routine continues in the loop until stopped by the operator, or until an error condition occurs.

The pressure subroutine, called at blocks 235 and 255, starts at 270 of FIG. 10. It can be seen that the subroutine need actually only appear once if the logic flow is from the true side of 234 to block 255.

The various data registers used by the calculator for the pressure calculations are initialized at block 271. Since there is a delay before a change in pump rate is felt at the casing pressure, this delay is simulated by calculating the casing pressure based on some previous reading of pump rate. The delay desired can be controlled by which previous reading is used in the calculation. Block 272 advances the previous reading stored to make room in the proper data register for the new reading. The pump rate and pump number is read at block 273.

The static mud pressures in the annulus and the drill string are calculated at 274 by multiplying the mud densities in psi/ft. of the respective mud in the VP and VA registers by the length of each mud volume as calculated in block 254 of FIG. 9. The static pressures may also be corrected for hole deviation by multiplying the resultant pressures by TVD/TD.

The circulating pressure losses are calculated at 275 in accordance with equations 3, 12, 19 and 21 and summed. There is a delay between the time a pressure appears on the casing until it is reflected to the standpipe pressure. To simulate this delay, an old casing pressure calculated in a previous loop is added at 176 to the summed value of block 275 to give the standpipe pressure.

The choke and preventer settings are read at 277 and a comparison is made at 278 to determine if the well is shut-in. If the comparison at 278 is true, the program branches to 279. If the invading fluid is gas, it is determined at 279 how far up the annulus the gas will migrate. Each kick will displace $\Delta M1$ and $\Delta M2$ barrels of mud respectively for each loop as the gas rises faster than the mud. Since the gas in a shut-in well cannot expand, its pressure will remain the same as it rises, thereby increasing the casing pressure with each incremental lift of the gas. The incremental increase in casing pressure is calculated by converting the length of each volume of mud displaced, and multiplying those lengths by the density of the mud in psi/ft.

Further, at 279, the casing pressure is calculated in accordance with equation 24, and, if gas, the pressure due to the migration of unexpanded gas is added.

If the comparison of 278 is false, the pressure loss across the choke, which is also the casing pressure, is calculated in accordance with equation 22. The flow rate $Q_r$ is also output by the calculator to input device 156 for display on gauge 76. As previously explained, the display will be inhibited if the annulus preventer circuit is in the closed condition.

The casing and the standpipe pressure are output at 281 by the calculator to device 154 and 155 for display by gauges 61, 63 and 83 of panels 7 and 8. The casing pressure and standpipe pressure are shifted in the data registers at 282 such that the oldest casing pressure is dropped from storage and the newest casing pressure is added to storage. This shifting or rotating of pressure values places the values in the proper registers in order that the oldest casing pressure may be used in the standpipe calculation of block 276 in the next pressure calculation.

Equivalent mud weight is calculated at 283 in accordance with equation 26. If the comparison at 284 of equivalent mud weight to the minimum fracture gradient is true, the calculator initiates the error 1 signal indicating lost circulation. The routine then stops at 286 and will restart at 287 by operation of the restart button 57 of panel 7.

If the comparison at 284 is false, the bottom hole pressure is calculated at 288 in accordance with equation 25. If an observer's panel is used, the bottom hole pressure and equivalent mud weight are output at 289 by the calculator to devices 158 and 159 for display.

A comparison is made at 290 to determine if either the standpipe pressure or the casing pressure exceeds the maximum allowable surface equipment pressure. If the comparison at 290 is true, then an error 2 signal is generated by the calculator at 291, and the calculator stops executing at 292, and is restarted at 293 by the operation of start button 57.

If the comparison at 290 is false, a comparison is made to determine if the kick volumes in VA2 and VA4 are greater than a maximum volume which if exceeded, makes control of the well impossible. If the coparison at 294 is true, the calculator generates an error 3 signal which indicates a blowout. The calculator stops execution at 296, and is restarted at 297 by operation of start button 57.

If the comparison at 294 is false, the next step in the main routine after the calling of the pressure subroutine is executed.

The flow diagram of FIGS. 8, 9 and 10 are intended to be illustrative only. Alternate ways of achieving the same results will occur to those skilled in the art after study of FIGS. 8, 9 and 10.

A program listing, similar to the program illustrated in FIG. 8, is appended as TABLE I.

A program listing, similar to the program illustrated in FIG. 9 and containing a pressure routine similar to the pressure illustrated in FIG. 10, is appended as TABLE II.

Other types of circulating problems and systems can be simulated by the invention by changing the program to be executed by the calculator and by changing the parameters which the manual controls represent. For instance, control 66 and switch 67 can represent the rate and direction of movement of the drill string during a trip. In this situation, a kick may occur if the hole is not kept full of mud as the drill pipe is removed; or, if the pipe is pulled too fast, the swabbing effect of the pipe moving out of the hole may reduce the bottom hole pressure sufficiently to allow formation fluid to invade the well bore. These effects may be included in the pressure calculation routine with suitable pressure equations, and the volume gradients may be changed in each loop to indicate the enlarging of the annulus and decreasing of the drill string volumes as the drill string is withdrawn.

Treating systems may also be simulated in which various chemicals are pumped down the well and into the formation. In this case, control 66 could simulate a second pump rate control and one of the gauges, such as gauge 61, could simulate manifold pressure. Such a simulation would be useful in training well treating personnel in various well treating techniques.

TABLE I

| | | | | |
|---|---|---|---|---|
| 0000 | 09 | 00 | * | M |
| 0001 | 00 | 10 | E 0 | |
| 0002 | 07 | 00 | RE 0 | |
| 0003 | 09 | 01 | * | ST |
| 0004 | 01 | 00 | T 0 | |
| 0005 | 07 | 01 | RE 1 | |
| 0006 | 06 | 14 | ST 14 | |
| 0007 | 07 | 07 | RE 7 | |
| 0008 | 03 | 14 | -14 | |
| 0009 | 08 | 05 | * | J |
| 0010 | 08 | 00 | * | S |
| 0011 | 02 | 01 | +1 | |
| 0012 | 09 | 04 | * | J |
| 0013 | 08 | 00 | * | S |
| 0014 | 02 | 03 | +3 | |
| 0015 | 07 | 07 | RE 7 | |
| 0016 | 09 | 01 | * | ST |
| 0017 | 02 | 11 | +11 | |
| 0018 | 07 | 08 | RE 8 | |
| 0019 | 09 | 01 | * | ST |
| 0020 | 02 | 12 | +12 | |
| 0021 | 07 | 02 | RE 2 | |
| 0022 | 09 | 01 | * | ST |
| 0023 | 02 | 13 | +13 | |
| 0024 | 07 | 03 | RE 3 | |
| 0025 | 09 | 01 | * | ST |
| 0026 | 02 | 14 | +14 | |
| 0027 | 07 | 01 | RE 1 | |
| 0028 | 06 | 14 | ST 14 | |
| 0029 | 07 | 00 | RE 0 | |
| 0030 | 03 | 14 | -14 | |
| 0031 | 08 | 05 | * | J |
| 0032 | 08 | 00 | * | S |
| 0033 | 02 | 02 | +2 | |
| 0034 | 07 | 00 | RE 0 | |
| 0035 | 06 | 14 | ST 14 | |
| 0036 | 08 | 01 | * | RE |
| 0037 | 02 | 11 | +11 | |
| 0038 | 03 | 14 | -14 | |
| 0039 | 09 | 01 | * | ST |
| 0040 | 02 | 15 | +15 | |
| 0041 | 07 | 10 | RE 10 | |
| 0042 | 09 | 01 | * | ST |
| 0043 | 03 | 00 | -0 | |
| 0044 | 07 | 02 | RE 2 | |
| 0045 | 09 | 01 | * | ST |
| 0046 | 03 | 01 | -1 | |
| 0047 | 07 | 03 | RE 3 | |
| 0048 | 09 | 01 | * | ST |
| 0049 | 03 | 02 | -2 | |
| 0050 | 00 | 00 | E 0 | |
| 0051 | 09 | 01 | * | ST |
| 0052 | 03 | 03 | -3 | |
| 0053 | 09 | 01 | * | ST |
| 0054 | 03 | 04 | -4 | |
| 0055 | 09 | 01 | * | ST |
| 0056 | 03 | 05 | -5 | |
| 0057 | 09 | 01 | * | ST |
| 0058 | 03 | 06 | -6 | |
| 0059 | 11 | 10 | F 10 | |
| 0060 | 09 | 00 | * | M |
| 0061 | 02 | 01 | +1 | |
| 0062 | 07 | 01 | RE 1 | |
| 0063 | 09 | 01 | * | ST |
| 0064 | 02 | 11 | +11 | |
| 0065 | 07 | 08 | RE 8 | |
| 0066 | 09 | 01 | * | ST |
| 0067 | 02 | 12 | +12 | |
| 0068 | 07 | 02 | RE 2 | |
| 0069 | 09 | 01 | * | ST |
| 0070 | 02 | 13 | +13 | |
| 0071 | 07 | 03 | RE 3 | |
| 0072 | 09 | 01 | * | ST |
| 0073 | 02 | 14 | +14 | |
| 0074 | 07 | 07 | RE 7 | |
| 0075 | 06 | 14 | ST 14 | |
| 0076 | 07 | 01 | RE 1 | |
| 0077 | 03 | 14 | -14 | |
| 0078 | 09 | 01 | * | ST |
| 0079 | 02 | 15 | +15 | |
| 0080 | 07 | 08 | RE 8 | |
| 0081 | 09 | 01 | * | ST |
| 0082 | 03 | 00 | -0 | |
| 0083 | 07 | 05 | RE 5 | |
| 0084 | 09 | 01 | * | ST |
| 0085 | 03 | 01 | -1 | |
| 0086 | 07 | 06 | RE 6 | |

| | | | |
|---|---|---|---|
| 0087 | 09 01 | * | ST |
| 0088 | 03 02 | −2 | |
| 0089 | 07 09 | RE 9 | |
| 0090 | 09 01 | * | ST |
| 0091 | 03 03 | −3 | |
| 0092 | 07 10 | RE 10 | |
| 0093 | 09 01 | * | ST |
| 0094 | 03 04 | −4 | |
| 0095 | 07 05 | RE 5 | |
| 0096 | 09 01 | * | ST |
| 0097 | 03 05 | −5 | |
| 0098 | 07 06 | RE 6 | |
| 0099 | 09 01 | * | ST |
| 0100 | 03 06 | −6 | |
| 0101 | 11 10 | F 10 | |
| 0102 | 09 00 | * | M |
| 0103 | 02 03 | +3 | |
| 0104 | 07 07 | RE 7 | |
| 0105 | 09 01 | * | ST |
| 0106 | 02 11 | +11 | |
| 0107 | 07 08 | RE 8 | |
| 0108 | 09 01 | * | ST |
| 0109 | 02 12 | +12 | |
| 0110 | 07 02 | RE 2 | |
| 0111 | 09 01 | * | ST |
| 0112 | 02 13 | +13 | |
| 0113 | 07 03 | RE 3 | |
| 0114 | 09 01 | * | ST |
| 0115 | 02 14 | +14 | |
| 0116 | 00 00 | E 0 | |
| 0117 | 09 01 | * | ST |
| 0118 | 03 03 | −3 | |
| 0119 | 09 01 | * | ST |
| 0120 | 03 04 | −4 | |
| 0121 | 09 01 | * | ST |
| 0122 | 03 05 | −5 | |
| 0123 | 09 01 | * | ST |
| 0124 | 03 06 | −6 | |
| 0125 | 07 09 | RE 9 | |
| 0126 | 09 01 | * | ST |
| 0127 | 02 15 | +15 | |
| 0128 | 07 10 | RE 10 | |
| 0129 | 09 01 | * | ST |
| 0130 | 03 00 | −0 | |
| 0131 | 07 05 | RE 5 | |
| 0132 | 09 01 | * | ST |
| 0133 | 03 01 | −1 | |
| 0134 | 07 06 | RE 6 | |
| 0135 | 09 01 | * | ST |
| 0136 | 03 02 | −2 | |
| 0137 | 11 10 | F 10 | |
| 0138 | 09 00 | * | M |
| 0139 | 02 02 | +2 | |
| 0140 | 07 01 | RE 1 | |
| 0141 | 06 14 | ST 14 | |
| 0142 | 07 07 | RE 7 | |
| 0143 | 03 14 | −14 | |
| 0144 | 09 01 | * | ST |
| 0145 | 02 15 | +15 | |
| 0146 | 07 10 | RE 10 | |
| 0147 | 09 01 | * | ST |
| 0148 | 03 00 | −0 | |
| 0149 | 07 02 | RE 2 | |
| 0150 | 09 01 | * | ST |
| 0151 | 03 01 | −1 | |
| 0152 | 07 03 | RE 3 | |
| 0153 | 09 01 | * | ST |
| 0154 | 03 02 | −2 | |
| 0155 | 07 00 | RE 0 | |
| 0156 | 06 14 | ST 14 | |
| 0157 | 07 01 | RE 1 | |
| 0158 | 03 14 | −14 | |
| 0159 | 09 01 | * | ST |
| 0160 | 03 03 | −3 | |
| 0161 | 07 10 | RE 10 | |
| 0162 | 09 01 | * | ST |
| 0163 | 03 04 | −4 | |
| 0164 | 07 05 | RE 5 | |
| 0165 | 09 01 | * | ST |
| 0166 | 03 05 | −5 | |
| 0167 | 07 06 | RE 6 | |
| 0168 | 09 01 | * | ST |
| 0169 | 03 06 | −6 | |
| 0170 | 11 10 | F 10 | |
| 0171 | 09 00 | * | M |
| 0172 | 02 04 | +4 | |
| 0173 | 08 01 | * | RE |
| 0174 | 03 03 | −3 | |
| 0175 | 08 02 | * | W |
| 0176 | 03 03 | −3 | |
| 0177 | 08 01 | * | RE |
| 0178 | 03 04 | −4 | |
| 0179 | 08 02 | * | W |
| 0180 | 03 03 | −3 | |
| 0181 | 08 01 | * | RE |
| 0182 | 03 05 | −5 | |
| 0183 | 08 02 | * | W |
| 0184 | 03 03 | −3 | |
| 0185 | 08 01 | * | RE |
| 0186 | 03 06 | −6 | |
| 0187 | 08 02 | * | W |
| 0188 | 03 03 | −3 | |
| 0189 | 08 00 | * | S |
| 0190 | 02 05 | +5 | |
| 0191 | 09 00 | * | M |
| 0192 | 11 10 | F 10 | |
| 0193 | 00 01 | E 1 | |
| 0194 | 08 02 | * | W |
| 0195 | 11 00 | F 0 | |
| 0196 | 08 01 | * | RE |
| 0197 | 02 11 | +11 | |
| 0198 | 08 02 | * | W |
| 0199 | 03 03 | −3 | |
| 0200 | 08 01 | * | RE |
| 0201 | 02 12 | +12 | |
| 0202 | 08 02 | * | W |
| 0203 | 03 03 | −3 | |
| 0204 | 08 01 | * | RE |
| 0205 | 02 13 | +13 | |
| 0206 | 08 02 | * | W |
| 0207 | 03 03 | −3 | |
| 0208 | 08 01 | * | RE |
| 0209 | 02 14 | +14 | |
| 0210 | 08 02 | * | W |

| | | | | | | |
|---|---|---|---|---|---|---|
| 0211 | 03 | 03 | -3 | 0272 | 08 | 02 | * W |
| 0212 | 08 | 02 | * W | 0273 | 03 | 15 | -15 |
| 0213 | 03 | 15 | -15 | 0274 | 08 | 02 | * W |
| 0214 | 08 | 01 | * RE | 0275 | 03 | 15 | -15 |
| 0215 | 02 | 15 | +15 | 0276 | 08 | 02 | * W |
| 0216 | 09 | 04 | * J | 0277 | 03 | 15 | -15 |
| 0217 | 08 | 00 | * S | 0278 | 07 | 11 | RE11 |
| 0218 | 02 | 05 | +5 | 0279 | 06 | 14 | ST14 |
| 0219 | 00 | 02 | E 2 | 0280 | 07 | 00 | RE 0 |
| 0220 | 08 | 02 | * W | 0281 | 05 | 14 | ÷14 |
| 0221 | 11 | 00 | F 0 | 0282 | 09 | 01 | * ST |
| 0222 | 08 | 01 | * RE | 0283 | 02 | 09 | +9 |
| 0223 | 02 | 15 | +15 | 0284 | 07 | 12 | RE12 |
| 0224 | 08 | 02 | * W | 0285 | 09 | 01 | * ST |
| 0225 | 03 | 03 | -3 | 0286 | 02 | 02 | +2 |
| 0226 | 08 | 01 | * RE | 0287 | 07 | 13 | RE13 |
| 0227 | 03 | 00 | -0 | 0288 | 09 | 01 | * ST |
| 0228 | 08 | 02 | * W | 0289 | 02 | 03 | +3 |
| 0229 | 03 | 03 | -3 | 0290 | 00 | 09 | E 9 |
| 0230 | 08 | 01 | * RE | 0291 | 00 | 10 | E 10 |
| 0231 | 03 | 01 | -1 | 0292 | 00 | 07 | E 7 |
| 0232 | 08 | 02 | * W | 0293 | 00 | 01 | E 1 |
| 0233 | 03 | 03 | -3 | 0294 | 00 | 04 | E 4 |
| 0234 | 08 | 01 | * RE | 0295 | 00 | 11 | E 11 |
| 0235 | 03 | 02 | -2 | 0296 | 00 | 04 | E 4 |
| 0236 | 08 | 02 | * W | 0297 | 00 | 12 | E 12 |
| 0237 | 03 | 03 | -3 | 0298 | 06 | 04 | ST 4 |
| 0238 | 08 | 02 | * W | 0299 | 08 | 01 | * RE |
| 0239 | 03 | 15 | -15 | 0300 | 02 | 11 | +11 |
| 0240 | 08 | 01 | * RE | 0301 | 09 | 01 | * ST |
| 0241 | 03 | 03 | -3 | 0302 | 01 | 03 | T 3 |
| 0242 | 09 | 04 | * J | 0303 | 08 | 01 | * RE |
| 0243 | 08 | 00 | * S | 0304 | 02 | 15 | +15 |
| 0244 | 02 | 05 | +5 | 0305 | 09 | 01 | * ST |
| 0245 | 00 | 03 | E 3 | 0306 | 01 | 02 | T 2 |
| 0246 | 08 | 02 | * W | 0307 | 08 | 01 | * RE |
| 0247 | 11 | 00 | F 0 | 0308 | 03 | 03 | -3 |
| 0248 | 08 | 01 | * RE | 0309 | 09 | 01 | * ST |
| 0249 | 03 | 03 | -3 | 0310 | 01 | 01 | T 1 |
| 0250 | 08 | 02 | * W | 0311 | 08 | 01 | * RE |
| 0251 | 03 | 03 | -3 | 0312 | 02 | 14 | +14 |
| 0252 | 08 | 01 | * RE | 0313 | 08 | 12 | * $x^2$ |
| 0253 | 03 | 04 | -4 | 0314 | 06 | 14 | ST14 |
| 0254 | 08 | 02 | * W | 0315 | 07 | 04 | RE 4 |
| 0255 | 03 | 03 | -3 | 0316 | 04 | 14 | ×14 |
| 0256 | 08 | 01 | * RE | 0317 | 09 | 01 | * ST |
| 0257 | 03 | 05 | -5 | 0318 | 01 | 04 | T 4 |
| 0258 | 08 | 02 | * W | 0319 | 08 | 01 | * RE |
| 0259 | 03 | 03 | -3 | 0320 | 03 | 02 | -2 |
| 0260 | 08 | 01 | * RE | 0321 | 08 | 12 | * $x^2$ |
| 0261 | 03 | 06 | -6 | 0322 | 06 | 14 | ST14 |
| 0262 | 08 | 02 | * W | 0323 | 07 | 04 | RE 4 |
| 0263 | 03 | 03 | -3 | 0324 | 04 | 14 | ×14 |
| 0264 | 09 | 00 | * M | 0325 | 09 | 01 | * ST |
| 0265 | 02 | 05 | +5 | 0326 | 01 | 05 | T 5 |
| 0266 | 08 | 02 | * W | 0327 | 08 | 01 | * RE |
| 0267 | 03 | 15 | -15 | 0328 | 03 | 06 | -6 |
| 0268 | 08 | 02 | * W | 0329 | 08 | 12 | * $x^2$ |
| 0269 | 03 | 15 | -15 | 0330 | 06 | 14 | ST14 |
| 0270 | 08 | 02 | * W | 0331 | 07 | 04 | RE 4 |
| 0271 | 03 | 15 | -15 | 0332 | 04 | 14 | ×14 |

| | | | | | | | |
|---|---|---|---|---|---|---|---|
| 0333 | 09 | 01 | * ST | | 0394 | 08 01 | * RE |
| 0334 | 01 | 06 | T 6 | | 0395 | 02 11 | +11 |
| 0335 | 08 | 01 | * RE | | 0396 | 06 14 | ST14 |
| 0336 | 02 | 12 | +12 | 5 0397 | 08 01 | * RE |
| 0337 | 08 | 12 | * x² | | 0398 | 01 09 | T 9 |
| 0338 | 06 | 14 | ST14 | | 0399 | 04 14 | ×14 |
| 0339 | 08 | 01 | * RE | | 0400 | 06 15 | ST15 |
| 0340 | 02 | 13 | +13 | 10 0401 | 08 01 | * RE |
| 0341 | 08 | 12 | * x² | | 0402 | 02 15 | +15 |
| 0342 | 03 | 14 | -14 | | 0403 | 06 14 | ST14 |
| 0343 | 07 | 04 | RE 4 | | 0404 | 08 01 | * RE |
| 0344 | 04 | 14 | ×14 | | 0405 | 01 08 | T 8 |
| 0345 | 09 | 01 | * ST | 15 0406 | 04 14 | ×14 |
| 0346 | 01 | 09 | T 9 | | 0407 | 02 15 | +15 |
| 0347 | 08 | 01 | * RE | | 0408 | 08 01 | * RE |
| 0348 | 03 | 00 | - 0 | | 0409 | 03 03 | - 3 |
| 0349 | 08 | 12 | * x² | | 0410 | 06 14 | ST14 |
| 0350 | 06 | 14 | ST14 | 20 0411 | 08 01 | * RE |
| 0351 | 08 | 01 | * RE | | 0412 | 01 07 | T 7 |
| 0352 | 03 | 01 | - 1 | | 0413 | 04 14 | ×14 |
| 0353 | 08 | 12 | * x² | | 0414 | 02 15 | +15 |
| 0354 | 03 | 14 | -14 | 25 0415 | 09 01 | * ST |
| 0355 | 07 | 04 | RE 4 | | 0416 | 01 11 | T 11 |
| 0356 | 04 | 14 | ×14 | | 0417 | 00 15 | E 15 |
| 0357 | 09 | 01 | * ST | | 0418 | 09 03 | * SP |
| 0358 | 01 | 08 | T 8 | | 0419 | 09 00 | * M |
| 0359 | 08 | 01 | * RE | 30 0420 | 10 00 | f 0 |
| 0360 | 03 | 04 | - 4 | | 0421 | 06 00 | ST 0 |
| 0361 | 08 | 12 | * x² | | 0422 | 09 15 | * RI |
| 0362 | 06 | 14 | ST14 | | 0423 | 09 00 | * M |
| 0363 | 08 | 01 | * RE | 35 0424 | 10 01 | f 1 |
| 0364 | 03 | 05 | - 5 | | 0425 | 06 01 | ST 1 |
| 0365 | 08 | 12 | * x² | | 0426 | 09 15 | * RI |
| 0366 | 03 | 14 | -14 | | 0427 | 09 00 | * M |
| 0367 | 07 | 04 | RE 4 | | 0428 | 10 02 | f 2 |
| 0368 | 04 | 14 | ×14 | 40 0429 | 06 02 | ST 2 |
| 0369 | 09 | 01 | * ST | | 0430 | 09 15 | * RI |
| 0370 | 01 | 07 | T 7 | | 0431 | 09 00 | * M |
| 0371 | 08 | 01 | * RE | | 0432 | 10 03 | f 3 |
| 0372 | 02 | 11 | +11 | 45 0433 | 06 03 | ST 3 |
| 0373 | 06 | 14 | ST14 | | 0434 | 09 15 | * RI |
| 0374 | 08 | 01 | * RE | | 0435 | 09 00 | * M |
| 0375 | 01 | 04 | T 4 | | 0436 | 10 04 | f 4 |
| 0376 | 04 | 14 | ×14 | | 0437 | 06 04 | ST 4 |
| 0377 | 06 | 15 | ST15 | 50 0438 | 09 15 | * RI |
| 0378 | 08 | 01 | * RE | | 0439 | 09 00 | * M |
| 0379 | 02 | 15 | +15 | | 0440 | 10 05 | f 5 |
| 0380 | 06 | 14 | ST14 | | 0441 | 06 05 | ST 5 |
| 0381 | 08 | 01 | * RE | 55 0442 | 09 15 | * RI |
| 0382 | 01 | 05 | T 5 | | 0443 | 09 00 | * M |
| 0383 | 04 | 14 | ×14 | | 0444 | 10 06 | f 6 |
| 0384 | 02 | 15 | +15 | | 0445 | 06 06 | ST 6 |
| 0385 | 08 | 01 | * RE | | 0446 | 09 15 | * RI |
| 0386 | 03 | 03 | - 3 | 60 0447 | 09 00 | * M |
| 0387 | 06 | 14 | ST14 | | 0448 | 10 07 | f 7 |
| 0388 | 08 | 01 | * RE | | 0449 | 06 07 | ST 7 |
| 0389 | 01 | 06 | T 6 | | 0450 | 09 00 | * M |
| 0390 | 04 | 14 | ×14 | 65 0451 | 10 08 | f 8 |
| 0391 | 02 | 15 | +15 | | 0452 | 06 08 | ST 8 |
| 0392 | 09 | 01 | * ST | | 0453 | 09 15 | * RI |
| 0393 | 01 | 10 | T 10 | | 0454 | 09 00 | * M |

| | | | | | | |
|---|---|---|---|---|---|---|
| 0455 | 10 | 09 | f9 | 0517 | 08 | 05 | * J |
| 0456 | 06 | 09 | ST9 | 0518 | 09 | 00 | * M |
| 0457 | 09 | 15 | * RT | 0519 | 08 | 01 | * RE |
| 0458 | 09 | 00 | * M | 0520 | 00 | 10 | E10 |
| 0459 | 10 | 10 | f10 | 0521 | 00 | 00 | E0 |
| 0460 | 06 | 10 | ST10 | 0522 | 00 | 05 | E5 |
| 0461 | 09 | 15 | * RT | 0523 | 00 | 02 | E2 |
| 0462 | 09 | 00 | * M | 0524 | 09 | 01 | * ST |
| 0463 | 10 | 11 | f11 | 0525 | 02 | 05 | +5 |
| 0464 | 06 | 11 | ST11 | 0526 | 09 | 00 | * M |
| 0465 | 09 | 15 | * RT | 0527 | 08 | 05 | * J |
| 0466 | 09 | 00 | * M | 0528 | 07 | 02 | RE2 |
| 0467 | 10 | 12 | f12 | 0529 | 09 | 01 | * ST |
| 0468 | 06 | 12 | ST12 | 0530 | 03 | 12 | −12 |
| 0469 | 09 | 15 | * RT | 0531 | 08 | 02 | * W |
| 0470 | 09 | 00 | * M | 0532 | 13 | 00 | B0 |
| 0471 | 10 | 13 | f13 | 0533 | 07 | 03 | RE3 |
| 0472 | 06 | 13 | ST13 | 0534 | 09 | 01 | * ST |
| 0473 | 09 | 15 | * RT | 0535 | 03 | 13 | −13 |
| 0474 | 09 | 00 | * M | 0536 | 08 | 02 | * W |
| 0475 | 00 | 00 | E0 | 0537 | 01 | 00 | T0 |
| 0476 | 07 | 00 | RE0 | 0538 | 08 | 02 | * W |
| 0477 | 08 | 02 | * W | 0539 | 01 | 15 | T15 |
| 0478 | 00 | 00 | E0 | 0540 | 07 | 04 | RE4 |
| 0479 | 09 | 01 | * ST | 0541 | 09 | 01 | * ST |
| 0480 | 02 | 04 | +4 | 0542 | 03 | 14 | −14 |
| 0481 | 08 | 02 | * W | 0543 | 08 | 02 | * W |
| 0482 | 07 | 15 | RE15 | 0544 | 12 | 00 | A0 |
| 0483 | 07 | 01 | RE1 | 0545 | 07 | 05 | RE5 |
| 0484 | 09 | 01 | * ST | 0546 | 09 | 01 | * ST |
| 0485 | 03 | 11 | −11 | 0547 | 03 | 15 | −15 |
| 0486 | 08 | 02 | * W | 0548 | 08 | 02 | * W |
| 0487 | 15 | 02 | D2 | 0549 | 12 | 00 | A0 |
| 0488 | 06 | 14 | ST14 | 0550 | 07 | 06 | RE6 |
| 0489 | 00 | 04 | E4 | 0551 | 09 | 01 | * ST |
| 0490 | 03 | 14 | −14 | 0552 | 04 | 00 | ×0 |
| 0491 | 08 | 05 | * J | 0553 | 08 | 02 | * W |
| 0492 | 08 | 00 | * S | 0554 | 12 | 00 | A0 |
| 0493 | 08 | 02 | * W | 0555 | 08 | 02 | * W |
| 0494 | 00 | 03 | E3 | 0556 | 12 | 15 | A15 |
| 0495 | 00 | 06 | E6 | 0557 | 07 | 07 | RE7 |
| 0496 | 03 | 14 | −14 | 0558 | 09 | 01 | * ST |
| 0497 | 08 | 05 | * J | 0559 | 02 | 06 | +6 |
| 0498 | 08 | 00 | * S | 0560 | 08 | 02 | * W |
| 0499 | 08 | 01 | * RE | 0561 | 08 | 02 | * W |
| 0500 | 00 | 01 | E1 | 0562 | 07 | 08 | RE8 |
| 0501 | 00 | 04 | E4 | 0563 | 08 | 02 | * W |
| 0502 | 00 | 04 | E4 | 0564 | 09 | 00 | * M |
| 0503 | 08 | 15 | * ½ | 0565 | 07 | 09 | RE9 |
| 0504 | 09 | 01 | * ST | 0566 | 08 | 02 | * W |
| 0505 | 02 | 05 | +5 | 0567 | 05 | 02 | ÷2 |
| 0506 | 08 | 00 | * S | 0568 | 08 | 02 | * W |
| 0507 | 08 | 05 | * J | 0569 | 05 | 15 | ÷15 |
| 0508 | 09 | 00 | * M | 0570 | 09 | 01 | * ST |
| 0509 | 08 | 02 | * W | 0571 | 02 | 01 | +1 |
| 0510 | 00 | 10 | E10 | 0572 | 07 | 10 | RE10 |
| 0511 | 00 | 04 | E4 | 0573 | 08 | 02 | * W |
| 0512 | 00 | 03 | E3 | 0574 | 04 | 03 | ×3 |
| 0513 | 00 | 03 | E3 | 0575 | 09 | 01 | * ST |
| 0514 | 09 | 01 | * ST | 0576 | 02 | 07 | +7 |
| 0515 | 02 | 05 | +5 | 0577 | 07 | 11 | RE11 |
| 0516 | 08 | 00 | * S | 0578 | 08 | 02 | * W |

| | | | | | | |
|---|---|---|---|---|---|---|
| 0579 | 04 | 03 | ×3 | 0641 | 00 | 03 | E3 |
| 0580 | 09 | 01 | * ST | 0642 | 00 | 10 | E10 |
| 0581 | 02 | 08 | +8 | 0643 | 00 | 03 | E3 |
| 0582 | 08 | 02 | * W | 0644 | 00 | 02 | E2 |
| 0583 | 10 | 15 | f15 | 0645 | 04 | 14 | ×14 |
| 0584 | 07 | 12 | RE12 | 0646 | 09 | 01 | * ST |
| 0585 | 08 | 02 | * W | 0647 | 01 | 12 | T12 |
| 0586 | 03 | 00 | −0 | 0648 | 00 | 03 | E3 |
| 0587 | 08 | 02 | * W | 0649 | 00 | 00 | E0 |
| 0588 | 04 | 15 | ×15 | 0650 | 00 | 00 | E0 |
| 0589 | 08 | 02 | * W | 0651 | 08 | 10 | * LN |
| 0590 | 04 | 15 | ×15 | 0652 | 04 | 14 | ×14 |
| 0591 | 08 | 02 | * W | 0653 | 08 | 11 | * $e^x$ |
| 0592 | 04 | 15 | ×15 | 0654 | 06 | 14 | ST14 |
| 0593 | 08 | 02 | * W | 0655 | 07 | 02 | RE2 |
| 0594 | 04 | 15 | ×15 | 0656 | 06 | 15 | ST15 |
| 0595 | 08 | 02 | * W | 0657 | 07 | 03 | RE3 |
| 0596 | 04 | 15 | ×15 | 0658 | 02 | 15 | +15 |
| 0597 | 08 | 02 | * W | 0659 | 07 | 14 | RE14 |
| 0598 | 03 | 15 | −15 | 0660 | 05 | 15 | ÷15 |
| 0599 | 09 | 03 | * SP | 0661 | 09 | 01 | * ST |
| 0600 | 07 | 08 | RE8 | 0662 | 03 | 07 | −7 |
| 0601 | 06 | 14 | ST14 | 0663 | 08 | 01 | * RE |
| 0602 | 00 | 10 | E10 | 0664 | 01 | 12 | T12 |
| 0603 | 00 | 04 | E4 | 0665 | 09 | 10 | * LU |
| 0604 | 00 | 06 | E6 | 0666 | 06 | 14 | ST14 |
| 0605 | 00 | 05 | E5 | 0667 | 06 | 15 | ST15 |
| 0606 | 04 | 14 | ×14 | 0668 | 00 | 03 | E3 |
| 0607 | 07 | 12 | RE12 | 0669 | 00 | 10 | E10 |
| 0608 | 02 | 14 | +14 | 0670 | 00 | 09 | E9 |
| 0609 | 09 | 01 | * ST | 0671 | 00 | 03 | E3 |
| 0610 | 02 | 10 | +10 | 0672 | 02 | 14 | +14 |
| 0611 | 08 | 01 | * RE | 0673 | 00 | 05 | E5 |
| 0612 | 02 | 06 | +6 | 0674 | 00 | 00 | E0 |
| 0613 | 06 | 14 | ST14 | 0675 | 05 | 14 | ÷14 |
| 0614 | 08 | 01 | * RE | 0676 | 09 | 01 | * ST |
| 0615 | 02 | 05 | +5 | 0677 | 03 | 08 | −8 |
| 0616 | 04 | 14 | ×14 | 0678 | 00 | 01 | E1 |
| 0617 | 08 | 01 | * RE | 0679 | 00 | 10 | E10 |
| 0618 | 02 | 09 | +9 | 0680 | 00 | 07 | E7 |
| 0619 | 04 | 14 | ×14 | 0681 | 00 | 05 | E5 |
| 0620 | 08 | 01 | * RE | 0682 | 03 | 15 | −15 |
| 0621 | 01 | 00 | T0 | 0683 | 00 | 07 | E7 |
| 0622 | 04 | 14 | ×14 | 0684 | 05 | 15 | ÷15 |
| 0623 | 09 | 01 | * ST | 0685 | 00 | 12 | E12 |
| 0624 | 02 | 06 | +6 | 0686 | 06 | 15 | ST15 |
| 0625 | 08 | 01 | * RE | 0687 | 06 | 13 | ST13 |
| 0626 | 03 | 12 | −12 | 0688 | 07 | 15 | RE15 |
| 0627 | 06 | 02 | ST2 | 0689 | 06 | 14 | ST14 |
| 0628 | 06 | 15 | ST15 | 0690 | 08 | 01 | * RE |
| 0629 | 06 | 14 | ST14 | 0691 | 01 | 12 | T12 |
| 0630 | 00 | 02 | E2 | 0692 | 04 | 14 | ×14 |
| 0631 | 04 | 14 | ×14 | 0693 | 00 | 02 | E2 |
| 0632 | 08 | 01 | * RE | 0694 | 04 | 15 | ×15 |
| 0633 | 03 | 13 | −13 | 0695 | 03 | 14 | −14 |
| 0634 | 06 | 03 | ST3 | 0696 | 00 | 02 | E2 |
| 0635 | 02 | 14 | +14 | 0697 | 02 | 14 | +14 |
| 0636 | 07 | 03 | RE3 | 0698 | 09 | 01 | * ST |
| 0637 | 02 | 15 | +15 | 0699 | 01 | 13 | T13 |
| 0638 | 05 | 14 | ÷14 | 0700 | 08 | 01 | * RE |
| 0639 | 09 | 10 | * LU | 0701 | 03 | 14 | −14 |
| 0640 | 06 | 14 | ST14 | 0702 | 08 | 12 | * $x^2$ |

| | | | | | | | |
|---|---|---|---|---|---|---|---|
| 0703 | 06 | 14 | ST 14 | | 0765 | 08 | 11 | * $e^x$ |

| | | | |
|---|---|---|---|
| 0703 | 06 | 14 | ST 14 |
| 0704 | 08 | 01 | * RE |
| 0705 | 03 | 15 | −15 |
| 0706 | 08 | 12 | * $x^2$ |
| 0707 | 02 | 14 | +14 |
| 0708 | 08 | 01 | * RE |
| 0709 | 04 | 00 | ×0 |
| 0710 | 08 | 12 | * $x^2$ |
| 0711 | 02 | 14 | +14 |
| 0712 | 00 | 10 | E 10 |
| 0713 | 00 | 00 | E 0 |
| 0714 | 00 | 00 | E 0 |
| 0715 | 00 | 00 | E 0 |
| 0716 | 00 | 07 | E 7 |
| 0717 | 00 | 06 | E 6 |
| 0718 | 00 | 07 | E 7 |
| 0719 | 04 | 14 | ×14 |
| 0720 | 08 | 12 | * $x^2$ |
| 0721 | 08 | 15 | * ½ |
| 0722 | 06 | 14 | ST 14 |
| 0723 | 00 | 03 | E 3 |
| 0724 | 00 | 10 | E 10 |
| 0725 | 00 | 01 | E 1 |
| 0726 | 00 | 02 | E 2 |
| 0727 | 00 | 04 | E 4 |
| 0728 | 04 | 14 | ×14 |
| 0729 | 09 | 01 | * SI |
| 0730 | 01 | 15 | T 15 |
| 0731 | 08 | 01 | * RE |
| 0732 | 03 | 11 | −11 |
| 0733 | 06 | 11 | ST 11 |
| 0734 | 08 | 01 | * RE |
| 0735 | 02 | 05 | +5 |
| 0736 | 04 | 11 | ×11 |
| 0737 | 00 | 04 | E 4 |
| 0738 | 00 | 03 | E 3 |
| 0739 | 06 | 12 | ST 12 |
| 0740 | 00 | 00 | E 0 |
| 0741 | 06 | 09 | ST 9 |
| 0742 | 06 | 10 | ST 10 |
| 0743 | 11 | 09 | F 9 |
| 0744 | 11 | 02 | F 2 |
| 0745 | 11 | 09 | F 9 |
| 0746 | 11 | 02 | F 2 |
| 0747 | 11 | 09 | F 9 |
| 0748 | 11 | 02 | F 2 |
| 0749 | 09 | 00 | * M |
| 0750 | 08 | 11 | * $e^x$ |
| 0751 | 08 | 01 | * RE |
| 0752 | 01 | 00 | T 0 |
| 0753 | 05 | 09 | ÷9 |
| 0754 | 08 | 01 | * RE |
| 0755 | 01 | 00 | T 0 |
| 0756 | 05 | 10 | ÷10 |
| 0757 | 07 | 11 | RE 11 |
| 0758 | 05 | 09 | ÷9 |
| 0759 | 00 | 05 | E 5 |
| 0760 | 08 | 10 | * LN |
| 0761 | 06 | 14 | ST 14 |
| 0762 | 08 | 01 | * RE |
| 0763 | 01 | 12 | T 12 |
| 0764 | 04 | 14 | ×14 |

| | | | |
|---|---|---|---|
| 0765 | 08 | 11 | * $e^x$ |
| 0766 | 05 | 09 | ÷9 |
| 0767 | 09 | 01 | * SI |
| 0768 | 02 | 00 | +0 |
| 0769 | 07 | 11 | RE 11 |
| 0770 | 05 | 10 | ÷10 |
| 0771 | 00 | 05 | E 5 |
| 0772 | 08 | 10 | * LN |
| 0773 | 06 | 14 | ST 14 |
| 0774 | 08 | 01 | * RE |
| 0775 | 01 | 13 | T 13 |
| 0776 | 04 | 14 | ×14 |
| 0777 | 08 | 11 | * $e^x$ |
| 0778 | 05 | 10 | ÷10 |
| 0779 | 09 | 01 | * SI |
| 0780 | 01 | 14 | T 14 |
| 0781 | 00 | 00 | E 0 |
| 0782 | 06 | 14 | ST 14 |
| 0783 | 09 | 03 | * $\Psi$ |
| 0784 | 09 | 00 | * M |
| 0785 | 11 | 09 | F 9 |
| 0786 | 00 | 04 | E 4 |
| 0787 | 06 | 14 | ST 14 |
| 0788 | 00 | 00 | E 0 |
| 0789 | 06 | 15 | ST 15 |
| 0790 | 09 | 00 | * M |
| 0791 | 01 | 09 | T 9 |
| 0792 | 15 | 11 | D 11 |
| 0793 | 07 | 12 | RE 12 |
| 0794 | 09 | 04 | * $J_0$ |
| 0795 | 09 | 00 | * S |
| 0796 | 08 | 11 | * $e^x$ |
| 0797 | 15 | 11 | D 11 |
| 0798 | 06 | 15 | ST 15 |
| 0799 | 00 | 01 | E 1 |
| 0800 | 02 | 12 | +12 |
| 0801 | 00 | 01 | E 1 |
| 0802 | 02 | 15 | +15 |
| 0803 | 00 | 01 | E 1 |
| 0804 | 03 | 14 | −14 |
| 0805 | 08 | 04 | * $J_0$ |
| 0806 | 08 | 00 | * S |
| 0807 | 01 | 09 | T 9 |
| 0808 | 09 | 15 | * RT |
| 0809 | 09 | 00 | * M |
| 0810 | 11 | 02 | F 2 |
| 0811 | 07 | 01 | RE 1 |
| 0812 | 06 | 05 | ST 5 |
| 0813 | 08 | 12 | * $x^2$ |
| 0814 | 06 | 15 | ST 15 |
| 0815 | 07 | 02 | RE 2 |
| 0816 | 03 | 05 | −5 |
| 0817 | 07 | 02 | RE 2 |
| 0818 | 08 | 12 | * $x^2$ |
| 0819 | 03 | 15 | −15 |
| 0820 | 00 | 09 | E 9 |
| 0821 | 00 | 10 | E 10 |
| 0822 | 00 | 07 | E 7 |
| 0823 | 00 | 01 | E 1 |
| 0824 | 00 | 04 | E 4 |
| 0825 | 00 | 02 | E 2 |
| 0826 | 00 | 03 | E 3 |

| | | | | | | | |
|---|---|---|---|---|---|---|---|
| 0827 | 00 | 11 | E11 | 0888 | 04 | 15 | ×15 |
| 0828 | 00 | 12 | E12 | 0889 | 00 | 01 | E1 |
| 0829 | 00 | 04 | E4 | 0890 | 02 | 15 | +15 |
| 0830 | 04 | 15 | ×15 | 0891 | 07 | 14 | RE14 |
| 0831 | 00 | 05 | E5 | 0892 | 05 | 15 | ÷15 |
| 0832 | 08 | 03 | * ∞ | 0893 | 07 | 06 | RE6 |
| 0833 | 05 | 15 | ÷15 | 0894 | 06 | 14 | ST14 |
| 0834 | 08 | 15 | * ½ | 0895 | 00 | 02 | E2 |
| 0835 | 06 | 04 | ST4 | 0896 | 05 | 14 | ÷14 |
| 0836 | 08 | 01 | * RE | 0897 | 00 | 01 | E1 |
| 0837 | 01 | 12 | T12 | 0898 | 02 | 14 | +14 |
| 0838 | 08 | 10 | * LN | 0899 | 04 | 15 | ×15 |
| 0839 | 06 | 14 | ST14 | 0900 | 06 | 07 | ST7 |
| 0840 | 00 | 10 | E10 | 0901 | 07 | 04 | RE4 |
| 0841 | 00 | 01 | E1 | 0902 | 06 | 14 | ST14 |
| 0842 | 00 | 04 | E4 | 0903 | 07 | 05 | RE5 |
| 0843 | 00 | 12 | E12 | 0904 | 05 | 14 | ÷14 |
| 0844 | 04 | 14 | ×14 | 0905 | 07 | 07 | RE7 |
| 0845 | 08 | 11 | * $e^x$ | 0906 | 04 | 14 | ×14 |
| 0846 | 06 | 14 | ST14 | 0907 | 00 | 10 | E10 |
| 0847 | 00 | 10 | E10 | 0908 | 00 | 09 | E9 |
| 0848 | 00 | 03 | E3 | 0909 | 00 | 03 | E3 |
| 0849 | 00 | 07 | E7 | 0910 | 00 | 09 | E9 |
| 0850 | 04 | 14 | ×14 | 0911 | 04 | 14 | ×14 |
| 0851 | 07 | 02 | RE2 | 0912 | 06 | 08 | ST8 |
| 0852 | 06 | 15 | ST15 | 0913 | 08 | 10 | * LN |
| 0853 | 07 | 01 | RE1 | 0914 | 06 | 14 | ST14 |
| 0854 | 05 | 15 | ÷15 | 0915 | 08 | 01 | * RE |
| 0855 | 08 | 10 | * LN | 0916 | 01 | 12 | T12 |
| 0856 | 06 | 15 | ST15 | 0917 | 04 | 14 | ×14 |
| 0857 | 07 | 14 | RE14 | 0918 | 08 | 11 | * $e^x$ |
| 0858 | 04 | 15 | ×15 | 0919 | 06 | 14 | ST14 |
| 0859 | 08 | 11 | * $e^x$ | 0920 | 08 | 01 | * RE |
| 0860 | 06 | 15 | ST15 | 0921 | 03 | 07 | -7 |
| 0861 | 00 | 01 | E1 | 0922 | 04 | 14 | ×14 |
| 0862 | 03 | 15 | -15 | 0923 | 07 | 00 | RE0 |
| 0863 | 00 | 12 | E12 | 0924 | 04 | 14 | ×14 |
| 0864 | 08 | 10 | * LN | 0925 | 00 | 02 | E2 |
| 0865 | 06 | 15 | ST15 | 0926 | 00 | 08 | E8 |
| 0866 | 07 | 14 | RE14 | 0927 | 00 | 01 | E1 |
| 0867 | 08 | 15 | * ½ | 0928 | 05 | 14 | ÷14 |
| 0868 | 04 | 15 | ×15 | 0929 | 07 | 05 | RE5 |
| 0869 | 08 | 11 | * $e^x$ | 0930 | 05 | 14 | ÷14 |
| 0870 | 06 | 15 | ST15 | 0931 | 02 | 09 | +9 |
| 0871 | 00 | 01 | E1 | 0932 | 07 | 03 | RE3 |
| 0872 | 03 | 15 | -15 | 0933 | 08 | 12 | * $x^2$ |
| 0873 | 00 | 12 | E12 | 0934 | 06 | 14 | ST14 |
| 0874 | 06 | 06 | ST6 | 0935 | 00 | 09 | E9 |
| 0875 | 00 | 03 | E3 | 0936 | 00 | 10 | E10 |
| 0876 | 06 | 15 | ST15 | 0937 | 00 | 07 | E7 |
| 0877 | 00 | 04 | E4 | 0938 | 00 | 01 | E1 |
| 0878 | 06 | 14 | ST14 | 0939 | 00 | 04 | E4 |
| 0879 | 07 | 06 | RE6 | 0940 | 00 | 02 | E2 |
| 0880 | 03 | 15 | -15 | 0941 | 00 | 03 | E3 |
| 0881 | 07 | 06 | RE6 | 0942 | 00 | 11 | E11 |
| 0882 | 03 | 14 | -14 | 0943 | 00 | 12 | E12 |
| 0883 | 08 | 01 | * RE | 0944 | 00 | 04 | E4 |
| 0884 | 01 | 12 | T12 | 0945 | 04 | 14 | ×14 |
| 0885 | 04 | 14 | ×14 | 0946 | 00 | 05 | E5 |
| 0886 | 08 | 01 | * RE | 0947 | 05 | 14 | ÷14 |
| 0887 | 01 | 12 | T12 | 0948 | 08 | 15 | * ½ |

| | | |
|---|---|---|
| 0949 | 06 04 | ST 4 |
| 0950 | 08 12 | * $x^2$ |
| 0951 | 06 14 | ST14 |
| 0952 | 00 10 | E 10 |
| 0953 | 00 00 | E 0 |
| 0954 | 00 05 | E 5 |
| 0955 | 00 08 | E 8 |
| 0956 | 04 14 | ×14 |
| 0957 | 08 01 | * RE |
| 0958 | 03 08 | − 8 |
| 0959 | 04 14 | ×14 |
| 0960 | 07 11 | RE11 |
| 0961 | 04 14 | ×14 |
| 0962 | 06 05 | ST 5 |
| 0963 | 00 03 | E 3 |
| 0964 | 06 15 | ST15 |
| 0965 | 00 04 | E 4 |
| 0966 | 06 14 | ST14 |
| 0967 | 08 01 | * RE |
| 0968 | 01 12 | T 12 |
| 0969 | 04 14 | ×14 |
| 0970 | 08 01 | * RE |
| 0971 | 01 12 | T 12 |
| 0972 | 04 15 | ×15 |
| 0973 | 00 01 | E 1 |
| 0974 | 02 15 | +15 |
| 0975 | 07 14 | RE14 |
| 0976 | 05 15 | ÷15 |
| 0977 | 06 07 | ST 7 |
| 0978 | 00 10 | E 10 |
| 0979 | 00 09 | E 9 |
| 0980 | 00 03 | E 3 |
| 0981 | 00 09 | E 9 |
| 0982 | 04 15 | ×15 |
| 0983 | 07 04 | RE 4 |
| 0984 | 04 15 | ×15 |
| 0985 | 07 03 | RE 3 |
| 0986 | 05 15 | ÷15 |
| 0987 | 08 10 | * LN |
| 0988 | 06 15 | ST15 |
| 0989 | 08 01 | * RE |
| 0990 | 01 12 | T 12 |
| 0991 | 04 15 | ×15 |
| 0992 | 08 11 | * $e^x$ |
| 0993 | 06 15 | ST15 |
| 0994 | 00 01 | E 1 |
| 0995 | 00 10 | E 10 |
| 0996 | 00 00 | E 0 |
| 0997 | 00 07 | E 7 |
| 0998 | 00 05 | E 5 |
| 0999 | 04 15 | ×15 |
| 1000 | 08 01 | * RE |
| 1001 | 03 07 | − 7 |
| 1002 | 04 15 | ×15 |
| 1003 | 07 11 | RE11 |
| 1004 | 05 15 | ÷15 |
| 1005 | 07 07 | RE 7 |
| 1006 | 05 15 | ÷15 |
| 1007 | 07 04 | RE 4 |
| 1008 | 08 12 | * $x^2$ |
| 1009 | 05 15 | ÷15 |
| 1010 | 08 10 | * LN |
| 1011 | 06 15 | ST15 |
| 1012 | 07 13 | RE13 |
| 1013 | 04 15 | ×15 |
| 1014 | 08 11 | * $e^x$ |
| 1015 | 06 15 | ST15 |
| 1016 | 07 05 | RE 5 |
| 1017 | 04 15 | ×15 |
| 1018 | 07 00 | RE 0 |
| 1019 | 04 15 | ×15 |
| 1020 | 00 02 | E 2 |
| 1021 | 00 08 | E 8 |
| 1022 | 00 01 | E 1 |
| 1023 | 05 15 | ÷15 |
| 1024 | 07 03 | RE 3 |
| 1025 | 05 15 | ÷15 |
| 1026 | 02 10 | +10 |
| 1027 | 09 15 | * RT |

TABLE II

| | | |
|---|---|---|
| 0000 | 15 15 | D15 |
| 0001 | 15 15 | D15 |
| 0002 | 15 15 | D15 |
| 0003 | 12 12 | A12 |
| 0004 | 12 12 | A12 |
| 0005 | 12 12 | A12 |
| 0006 | 12 12 | A12 |
| 0007 | 15 00 | D 0 |
| 0008 | 08 03 | * Go |
| 0009 | 09 00 | * M |
| 0010 | 10 09 | F 9 |
| 0011 | 00 06 | E 6 |
| 0012 | 00 07 | E 7 |
| 0013 | 06 09 | ST 9 |
| 0014 | 00 05 | E 5 |
| 0015 | 00 09 | E 9 |
| 0016 | 06 10 | ST10 |
| 0017 | 09 00 | * M |
| 0018 | 11 09 | F 9 |
| 0019 | 00 00 | E 0 |
| 0020 | 06 15 | ST15 |
| 0021 | 06 11 | ST11 |
| 0022 | 09 00 | * M |
| 0023 | 01 09 | T 9 |
| 0024 | 00 01 | E 1 |
| 0025 | 03 09 | − 9 |
| 0026 | 00 01 | E 1 |
| 0027 | 03 10 | −10 |
| 0028 | 15 11 | D11 |
| 0029 | 07 09 | RE 9 |
| 0030 | 09 04 | * Jo |
| 0031 | 08 00 | * S |
| 0032 | 01 09 | T 9 |
| 0033 | 06 14 | ST14 |
| 0034 | 02 11 | +11 |
| 0035 | 15 11 | D11 |
| 0036 | 07 10 | RE10 |
| 0037 | 06 12 | ST12 |
| 0038 | 08 04 | * Jo |
| 0039 | 08 00 | * S |

| | | | | | | |
|---|---|---|---|---|---|---|
| 0040 | 02 09 | +9 | | 0101 | 09 15 | * RI |
| 0041 | 07 10 | RE10 | | 0102 | 05 15 | ÷15 |
| 0042 | 06 14 | ST14 | | 0103 | 08 01 | * RE |
| 0043 | 00 01 | E1 | | 0104 | 04 04 | ×4 |
| 0044 | 00 02 | E2 | | 0105 | 04 15 | ×15 |
| 0045 | 02 14 | +14 | | 0106 | 09 15 | * RI |
| 0046 | 15 11 | D11 | | 0107 | 09 00 | * M |
| 0047 | 07 14 | RE14 | | 0108 | 11 14 | F14 |
| 0048 | 06 14 | ST14 | | 0109 | 00 00 | E0 |
| 0049 | 00 01 | E1 | | 0110 | 06 13 | ST13 |
| 0050 | 09 00 | * M | | 0111 | 07 03 | RE3 |
| 0051 | 02 09 | +9 | | 0112 | 09 04 | * J. |
| 0052 | 04 14 | ×14 | | 0113 | 08 00 | * S |
| 0053 | 02 15 | +15 | | 0114 | 01 14 | T14 |
| 0054 | 07 11 | RE11 | | 0115 | 08 01 | * RE |
| 0055 | 06 14 | ST14 | | 0116 | 04 01 | ×1 |
| 0056 | 07 13 | RE13 | | 0117 | 06 13 | ST13 |
| 0057 | 03 14 | −14 | | 0118 | 08 01 | * RE |
| 0058 | 08 05 | * J+ | | 0119 | 04 00 | ×0 |
| 0059 | 08 00 | * S | | 0120 | 02 13 | +13 |
| 0060 | 01 09 | T9 | | 0121 | 09 00 | * M |
| 0061 | 03 11 | −11 | | 0122 | 01 14 | T14 |
| 0062 | 00 01 | E1 | | 0123 | 08 01 | * RE |
| 0063 | 02 09 | +9 | | 0124 | 04 02 | ×2 |
| 0064 | 00 01 | E1 | | 0125 | 02 13 | +13 |
| 0065 | 02 10 | +10 | | 0126 | 10 09 | F9 |
| 0066 | 07 12 | RE12 | | 0127 | 06 04 | ST4 |
| 0067 | 04 14 | ×14 | | 0128 | 08 01 | * RE |
| 0068 | 03 15 | −15 | | 0129 | 02 09 | +9 |
| 0069 | 09 15 | * RI | | 0130 | 04 04 | ×4 |
| 0070 | 09 00 | * M | | 0131 | 07 13 | RE13 |
| 0071 | 10 02 | F2 | | 0132 | 06 14 | ST14 |
| 0072 | 06 15 | ST15 | | 0133 | 08 01 | * RE |
| 0073 | 06 14 | ST14 | | 0134 | 01 00 | T0 |
| 0074 | 08 05 | * J+ | | 0135 | 05 14 | ÷14 |
| 0075 | 00 00 | E0 | | 0136 | 08 01 | * RE |
| 0076 | 09 15 | * RI | | 0137 | 04 09 | ×9 |
| 0077 | 07 07 | RE7 | | 0138 | 04 14 | ×14 |
| 0078 | 03 14 | −14 | | 0139 | 02 04 | +4 |
| 0079 | 08 05 | * J+ | | 0140 | 08 01 | * RE |
| 0080 | 07 15 | RE15 | | 0141 | 05 00 | ÷0 |
| 0081 | 09 15 | * RI | | 0142 | 02 04 | +4 |
| 0082 | 07 07 | RE7 | | 0143 | 06 08 | ST8 |
| 0083 | 09 15 | * RI | | 0144 | 06 15 | ST15 |
| 0084 | 09 00 | * M | | 0145 | 00 02 | E2 |
| 0085 | 10 10 | F10 | | 0146 | 00 03 | E3 |
| 0086 | 08 01 | * RE | | 0147 | 00 00 | E0 |
| 0087 | 03 09 | −9 | | 0148 | 00 00 | E0 |
| 0088 | 09 04 | * J. | | 0149 | 06 14 | ST14 |
| 0089 | 08 00 | * S | | 0150 | 03 15 | −15 |
| 0090 | 00 07 | E7 | | 0151 | 09 13 | * IXI |
| 0091 | 00 01 | E1 | | 0152 | 06 15 | ST15 |
| 0092 | 06 15 | ST15 | | 0153 | 07 14 | RE14 |
| 0093 | 09 15 | * RI | | 0154 | 02 15 | +15 |
| 0094 | 09 00 | * M | | 0155 | 08 12 | * $x^2$ |
| 0095 | 00 07 | E7 | | 0156 | 06 14 | ST14 |
| 0096 | 07 07 | RE7 | | 0157 | 00 01 | E1 |
| 0097 | 04 15 | ×15 | | 0158 | 00 00 | E0 |
| 0098 | 07 08 | RE8 | | 0159 | 00 03 | E3 |
| 0099 | 09 04 | * J. | | 0160 | 09 02 | * α |
| 0100 | 08 03 | * S. | | 0161 | 11 06 | F6 |

| | | | | | | | |
|---|---|---|---|---|---|---|---|
| 0162 | 04 | 15 | ×15 | 0224 | 06 | 14 | ST14 |
| 0163 | 00 | 03 | E 3 | 0225 | 09 | 12 | *    I |
| 0164 | 09 | 02 | *   α | 0226 | 03 | 14 | −14 |
| 0165 | 11 | 09 | F 9 | 0227 | 09 | 01 | *   ST |
| 0166 | 00 | 12 | E 12 | 0228 | 03 | 07 | −7 |
| 0167 | 04 | 14 | ×14 | 0229 | 09 | 01 | *   ST |
| 0168 | 02 | 15 | +15 | 0230 | 03 | 09 | −9 |
| 0169 | 00 | 10 | E 10 | 0231 | 09 | 00 | *   M |
| 0170 | 00 | 05 | E 5 | 0232 | 00 | 00 | E 0 |
| 0171 | 00 | 09 | E 9 | 0233 | 06 | 01 | *   RE |
| 0172 | 02 | 15 | +15 | 0234 | 02 | 01 | +1 |
| 0173 | 06 | 04 | ST 4 | 0235 | 09 | 02 | *   α |
| 0174 | 00 | 10 | E 10 | 0236 | 10 | 01 | f 1 |
| 0175 | 00 | 00 | E 0 | 0237 | 15 | 13 | D13 |
| 0176 | 00 | 01 | E 1 | 0238 | 12 | 11 | A11 |
| 0177 | 00 | 03 | E 3 | 0239 | 00 | 00 | E 0 |
| 0178 | 04 | 13 | ×13 | 0240 | 15 | 13 | D13 |
| 0179 | 00 | 05 | E 5 | 0241 | 12 | 14 | A14 |
| 0180 | 00 | 06 | E 6 | 0242 | 09 | 01 | *   ST |
| 0181 | 00 | 05 | E 5 | 0243 | 05 | 04 | ÷4 |
| 0182 | 02 | 13 | +13 | 0244 | 09 | 01 | *   ST |
| 0183 | 06 | 07 | ST 7 | 0245 | 04 | 03 | ×3 |
| 0184 | 00 | 01 | E 1 | 0246 | 09 | 01 | *   ST |
| 0185 | 02 | 03 | +3 | 0247 | 04 | 05 | ×5 |
| 0186 | 09 | 15 | *   RI | 0248 | 09 | 01 | *   ST |
| 0187 | 09 | 00 | *   M | 0249 | 04 | 07 | ×7 |
| 0188 | 08 | 00 | *   S | 0250 | 09 | 01 | *   ST |
| 0189 | 06 | 01 | ST 1 | 0251 | 04 | 08 | ×8 |
| 0190 | 15 | 14 | D 14 | 0252 | 09 | 01 | *   ST |
| 0191 | 12 | 11 | A 11 | 0253 | 05 | 03 | ÷3 |
| 0192 | 00 | 05 | E 5 | 0254 | 09 | 01 | *   ST |
| 0193 | 06 | 02 | ST 2 | 0255 | 02 | 11 | +11 |
| 0194 | 00 | 00 | E 0 | 0256 | 09 | 01 | *   ST |
| 0195 | 06 | 00 | ST 0 | 0257 | 02 | 13 | +13 |
| 0196 | 09 | 01 | *   ST | 0258 | 09 | 01 | *   ST |
| 0197 | 04 | 13 | ×13 | 0259 | 02 | 14 | +14 |
| 0198 | 09 | 01 | *   ST | 0260 | 09 | 01 | *   ST |
| 0199 | 04 | 14 | ×14 | 0261 | 02 | 15 | +15 |
| 0200 | 09 | 01 | *   ST | 0262 | 09 | 01 | *   ST |
| 0201 | 04 | 15 | ×15 | 0263 | 03 | 00 | −0 |
| 0202 | 09 | 01 | *   ST | 0264 | 09 | 01 | *   ST |
| 0203 | 05 | 00 | ÷0 | 0265 | 03 | 01 | −1 |
| 0204 | 09 | 01 | *   ST | 0266 | 08 | 01 | *   RE |
| 0205 | 05 | 01 | ÷1 | 0267 | 01 | 10 | T 10 |
| 0206 | 09 | 01 | *   ST | 0268 | 09 | 01 | *   ST |
| 0207 | 05 | 02 | ÷2 | 0269 | 02 | 12 | +12 |
| 0208 | 09 | 01 | *   ST | 0270 | 08 | 01 | *   RE |
| 0209 | 04 | 10 | ×10 | 0271 | 01 | 11 | T 11 |
| 0210 | 09 | 01 | *   ST | 0272 | 09 | 01 | *   ST |
| 0211 | 05 | 04 | ÷4 | 0273 | 03 | 02 | −2 |
| 0212 | 15 | 13 | D13 | 0274 | 08 | 01 | *   RE |
| 0213 | 12 | 05 | A 5 | 0275 | 03 | 03 | −3 |
| 0214 | 09 | 02 | *   α | 0276 | 09 | 01 | *   ST |
| 0215 | 11 | 01 | F 1 | 0277 | 03 | 04 | −4 |
| 0216 | 06 | 14 | ST 14 | 0278 | 09 | 01 | *   ST |
| 0217 | 08 | 01 | *   RE | 0279 | 03 | 05 | −5 |
| 0218 | 02 | 05 | +5 | 0280 | 09 | 01 | *   ST |
| 0219 | 04 | 14 | ×14 | 0281 | 03 | 06 | −6 |
| 0220 | 09 | 01 | *   ST | 0282 | 09 | 01 | *   ST |
| 0221 | 03 | 03 | −3 | 0283 | 03 | 08 | −8 |
| 0222 | 08 | 01 | *   RE | 0284 | 09 | 01 | *   ST |
| 0223 | 02 | 10 | +10 | 0285 | 03 | 10 | −10 |

| | | | | | | | |
|---|---|---|---|---|---|---|---|
| 0286 | 09 | 00 | * M | | 0347 | 15 | 11 | D11 |
| 0287 | 10 | 00 | FO | | 0348 | 06 | 06 | ST6 |
| 0288 | 08 | 01 | * | | 0349 | 00 | 01 | E1 |
| 0289 | 02 | 11 | +11 | 5 | 0350 | 02 | 05 | +5 |
| 0290 | 06 | 09 | ST9 | | 0351 | 00 | 01 | E1 |
| 0291 | 00 | 01 | E1 | | 0352 | 02 | 06 | +6 |
| 0292 | 00 | 09 | E9 | | 0353 | 06 | 14 | ST14 |
| 0293 | 06 | 03 | ST3 | | 0354 | 00 | 06 | E6 |
| 0294 | 00 | 02 | E2 | 10 | 0355 | 00 | 06 | E6 |
| 0295 | 00 | 00 | E0 | | 0356 | 03 | 14 | -14 |
| 0296 | 06 | 04 | ST4 | | 0357 | 00 | 12 | E12 |
| 0297 | 00 | 04 | E4 | | 0358 | 08 | 05 | * J |
| 0298 | 00 | 03 | E3 | | 0359 | 08 | 00 | * S |
| 0299 | 06 | 05 | ST5 | 15 | 0360 | 08 | 06 | * ST |
| 0300 | 00 | 05 | E5 | | 0361 | 15 | 11 | D11 |
| 0301 | 00 | 09 | E9 | | 0362 | 07 | 05 | RE5 |
| 0302 | 06 | 06 | ST6 | | 0363 | 02 | 09 | +9 |
| 0303 | 00 | 00 | E0 | 20 | 0364 | 08 | 00 | * S |
| 0304 | 06 | 07 | ST7 | | 0365 | 04 | 12 | ×12 |
| 0305 | 06 | 08 | ST8 | | 0366 | 09 | 00 | * M |
| 0306 | 06 | 10 | ST10 | | 0367 | 01 | 12 | T12 |
| 0307 | 00 | 01 | E1 | 25 | 0368 | 00 | 01 | E1 |
| 0308 | 00 | 12 | E12 | | 0369 | 03 | 12 | -12 |
| 0309 | 06 | 11 | ST11 | | 0370 | 09 | 04 | * J |
| 0310 | 00 | 04 | E4 | | 0371 | 00 | 01 | E1 |
| 0311 | 06 | 12 | ST12 | | 0372 | 06 | 11 | ST11 |
| 0312 | 00 | 03 | E3 | 30 | 0373 | 00 | 01 | E1 |
| 0313 | 06 | 13 | ST13 | | 0374 | 03 | 13 | -13 |
| 0314 | 09 | 00 | * M | | 0375 | 09 | 04 | * J |
| 0315 | 11 | 12 | F12 | | 0376 | 06 | 11 | ST11 |
| 0316 | 15 | 11 | D11 | | 0377 | 08 | 03 | * G |
| 0317 | 07 | 03 | RE3 | 35 | 0378 | 07 | 11 | RE11 |
| 0318 | 09 | 04 | * J | | 0379 | 02 | 03 | +3 |
| 0319 | 08 | 00 | * S | | 0380 | 00 | 01 | E1 |
| 0320 | 01 | 12 | T12 | | 0381 | 02 | 04 | +4 |
| 0321 | 06 | 14 | ST14 | 40 | 0382 | 11 | 12 | F12 |
| 0322 | 02 | 07 | +7 | | 0383 | 09 | 00 | * M |
| 0323 | 15 | 11 | D11 | | 0384 | 08 | 06 | * ST |
| 0324 | 07 | 04 | RE4 | | 0385 | 00 | 00 | E0 |
| 0325 | 04 | 14 | ×14 | 45 | 0386 | 06 | 06 | ST6 |
| 0326 | 02 | 10 | +10 | | 0387 | 09 | 01 | * ST |
| 0327 | 09 | 00 | * M | | 0388 | 04 | 09 | ×9 |
| 0328 | 04 | 12 | ×12 | | 0389 | 08 | 01 | * RE |
| 0329 | 07 | 10 | RE10 | | 0390 | 04 | 14 | ×14 |
| 0330 | 06 | 14 | ST14 | 50 | 0391 | 09 | 01 | * ST |
| 0331 | 07 | 09 | RE9 | | 0392 | 04 | 15 | ×15 |
| 0332 | 03 | 14 | -14 | | 0393 | 08 | 01 | * RE |
| 0333 | 08 | 05 | * J | | 0394 | 04 | 13 | ×13 |
| 0334 | 08 | 00 | * S | 55 | 0395 | 09 | 01 | * ST |
| 0335 | 01 | 12 | T12 | | 0396 | 04 | 14 | ×14 |
| 0336 | 15 | 11 | D11 | | 0397 | 15 | 13 | D13 |
| 0337 | 07 | 04 | RE4 | | 0398 | 12 | 01 | A1 |
| 0338 | 05 | 14 | ÷14 | | 0399 | 09 | 01 | * ST |
| 0339 | 07 | 08 | RE8 | 60 | 0400 | 04 | 13 | ×13 |
| 0340 | 02 | 14 | +14 | | 0401 | 06 | 03 | ST3 |
| 0341 | 00 | 12 | E12 | | 0402 | 00 | 03 | E3 |
| 0342 | 06 | 14 | ST14 | | 0403 | 00 | 09 | E9 |
| 0343 | 07 | 07 | RE7 | 65 | 0404 | 06 | 15 | ST15 |
| 0344 | 02 | 14 | +14 | | 0405 | 15 | 13 | D13 |
| 0345 | 02 | 08 | +8 | | 0406 | 12 | 02 | A2 |
| 0346 | 07 | 14 | RE14 | | 0407 | 02 | 15 | +15 |

| | | | | | | | |
|---|---|---|---|---|---|---|---|
| 0408 | 15 | 11 | D11 | | 0469 | 07 | 08 |
| 0409 | 07 | 15 | RL15 | | 0470 | 03 | 14 |
| 0410 | 09 | 01 | * | | 0471 | 08 | 01 |
| 0411 | 04 | 06 | x6 | 5 | 0472 | 02 | 09 |
| 0412 | 04 | 03 | x3 | | 0473 | 04 | 14 |
| 0413 | 08 | 01 | * | | 0474 | 02 | 06 |
| 0414 | 01 | 00 | T,0 | | 0475 | 00 | 00 |
| 0415 | 06 | 13 | SI,13 | | 0476 | 06 | 04 |
| 0416 | 10 | 09 | f,9 | 10 | 0477 | 08 | 01 |
| 0417 | 06 | 07 | SI,7 | | 0478 | 05 | 02 |
| 0418 | 09 | 01 | * | | 0479 | 02 | 06 |
| 0419 | 04 | 11 | x11 | | 0480 | 08 | 05 |
| 0420 | 07 | 12 | RL16 | 15 | 0481 | 03 | 04 |
| 0421 | 06 | 04 | SI,4 | | 0482 | 03 | 06 |
| 0422 | 11 | 09 | F,9 | | 0483 | 08 | 01 |
| 0423 | 06 | 08 | SI,6 | | 0484 | 05 | 01 |
| 0424 | 07 | 03 | RE,3 | | 0485 | 09 | 01 |
| 0425 | 09 | 04 | * | 20 | 0486 | 05 | 02 |
| 0426 | 08 | 00 | * | | 0487 | 08 | 01 |
| 0427 | 01 | 05 | T,5 | | 0488 | 05 | 00 |
| 0428 | 07 | 04 | RE,4 | | 0489 | 09 | 01 |
| 0429 | 06 | 14 | SI,14 | 25 | 0490 | 05 | 01 |
| 0430 | 07 | 03 | RE,3 | | 0491 | 15 | 13 |
| 0431 | 08 | 12 | * | | 0492 | 12 | 03 |
| 0432 | 04 | 14 | x14 | | 0493 | 06 | 07 |
| 0433 | 08 | 01 | * | 30 | 0494 | 00 | 05 |
| 0434 | 01 | 15 | T,15 | | 0495 | 00 | 11 |
| 0435 | 04 | 14 | x14 | | 0496 | 00 | 04 |
| 0436 | 02 | 06 | +,6 | | 0497 | 06 | 15 |
| 0437 | 07 | 03 | RE,3 | | 0498 | 15 | 13 |
| 0438 | 08 | 10 | * | 35 | 0499 | 12 | 04 |
| 0439 | 06 | 14 | SI,14 | | 0500 | 03 | 04 |
| 0440 | 06 | 15 | SI,15 | | 0501 | 07 | 15 |
| 0441 | 08 | 01 | * | | 0502 | 06 | 07 |
| 0442 | 01 | 12 | T,14 | | 0503 | 08 | 01 |
| 0443 | 04 | 14 | x14 | 40 | 0504 | 04 | 11 |
| 0444 | 03 | 11 | * | | 0505 | 00 | 12 |
| 0445 | 06 | 14 | SI,14 | | 0506 | 06 | 08 |
| 0446 | 08 | 01 | * | | 0507 | 08 | 01 |
| 0447 | 02 | 00 | +,0 | | 0508 | 02 | 09 |
| 0448 | 04 | 14 | x14 | 45 | 0509 | 04 | 06 |
| 0449 | 07 | 07 | RE,7 | | 0510 | 08 | 01 |
| 0450 | 04 | 14 | x14 | | 0511 | 02 | 06 |
| 0451 | 09 | 01 | * | | 0512 | 02 | 08 |
| 0452 | 04 | 09 | x9 | 50 | 0513 | 07 | 01 |
| 0453 | 02 | 06 | +,6 | | 0514 | 00 | 12 |
| 0454 | 08 | 01 | * | | 0515 | 08 | 05 |
| 0455 | 01 | 13 | T,13 | | 0516 | 00 | 00 |
| 0456 | 04 | 15 | x15 | | 0517 | 06 | 08 |
| 0457 | 08 | 11 | * | 55 | 0518 | 08 | 01 |
| 0458 | 06 | 14 | SI,14 | | 0519 | 04 | 06 |
| 0459 | 08 | 01 | * | | 0520 | 06 | 03 |
| 0460 | 01 | 14 | T,14 | | 0521 | 08 | 01 |
| 0461 | 04 | 14 | x14 | 60 | 0522 | 04 | 15 |
| 0462 | 07 | 08 | RE,8 | | 0523 | 04 | 03 |
| 0463 | 04 | 14 | x14 | | 0524 | 07 | 07 |
| 0464 | 02 | 06 | +,6 | | 0525 | 08 | 04 |
| 0465 | 09 | 00 | * | | 0526 | 08 | 00 |
| 0466 | 01 | 05 | T,5 | 65 | 0527 | 02 | 05 |
| 0467 | 07 | 07 | RE,7 | | 0528 | 15 | 13 |
| 0468 | 06 | 14 | SI,14 | | 0529 | 12 | 10 |

| | | |
|---|---|---|
| 0530 | 08 01 | * RE |
| 0531 | 04 12 | ×12 |
| 0532 | 06 05 | ST5 |
| 0533 | 00 01 | E1 |
| 0534 | 02 05 | +5 |
| 0535 | 09 01 | * ST |
| 0536 | 04 12 | ×12 |
| 0537 | 15 14 | D14 |
| 0538 | 12 08 | A8 |
| 0539 | 07 08 | RE8 |
| 0540 | 02 04 | +4 |
| 0541 | 07 03 | RE3 |
| 0542 | 09 02 | * α |
| 0543 | 10 04 | f4 |
| 0544 | 02 04 | +4 |
| 0545 | 08 01 | * RE |
| 0546 | 03 09 | -9 |
| 0547 | 08 04 | * Jo |
| 0548 | 08 00 | * S |
| 0549 | 02 05 | +5 |
| 0550 | 08 01 | * RE |
| 0551 | 03 08 | -8 |
| 0552 | 06 12 | ST12 |
| 0553 | 00 06 | E6 |
| 0554 | 05 12 | ÷12 |
| 0555 | 08 01 | * RE |
| 0556 | 01 12 | T12 |
| 0557 | 04 12 | ×12 |
| 0558 | 00 00 | E0 |
| 0559 | 06 10 | ST10 |
| 0560 | 06 09 | ST9 |
| 0561 | 08 01 | * RE |
| 0562 | 02 15 | +15 |
| 0563 | 08 04 | * Jo |
| 0564 | 07 12 | RE12 |
| 0565 | 06 10 | ST10 |
| 0566 | 08 01 | * RE |
| 0567 | 03 01 | -1 |
| 0568 | 08 04 | * Jo |
| 0569 | 07 12 | RE12 |
| 0570 | 06 09 | ST9 |
| 0571 | 00 07 | E7 |
| 0572 | 00 02 | E2 |
| 0573 | 06 14 | ST14 |
| 0574 | 07 10 | RE10 |
| 0575 | 15 11 | D11 |
| 0576 | 02 14 | +14 |
| 0577 | 00 01 | E1 |
| 0578 | 03 14 | -14 |
| 0579 | 07 09 | RE9 |
| 0580 | 15 11 | D11 |
| 0581 | 02 14 | +14 |
| 0582 | 08 01 | * RE |
| 0583 | 01 00 | T0 |
| 0584 | 06 12 | ST12 |
| 0585 | 08 01 | * RE |
| 0586 | 01 11 | T11 |
| 0587 | 05 12 | ÷12 |
| 0588 | 04 10 | ×10 |
| 0589 | 08 01 | * RE |
| 0590 | 03 06 | -6 |
| 0591 | 04 10 | ×10 |
| 0592 | 07 05 | RE5 |
| 0593 | 04 10 | ×10 |
| 0594 | 07 12 | RE12 |
| 0595 | 04 09 | ×9 |
| 0596 | 08 01 | * RE |
| 0597 | 03 08 | -8 |
| 0598 | 04 09 | ×9 |
| 0599 | 07 05 | RE5 |
| 0600 | 04 09 | ×9 |
| 0601 | 02 10 | +10 |
| 0602 | 06 15 | ST15 |
| 0603 | 08 00 | * S |
| 0604 | 05 05 | ÷5 |
| 0605 | 09 00 | * M |
| 0606 | 02 05 | +5 |
| 0607 | 00 00 | E0 |
| 0608 | 06 04 | ST4 |
| 0609 | 09 01 | * ST |
| 0610 | 04 12 | ×12 |
| 0611 | 06 13 | ST13 |
| 0612 | 10 09 | f9 |
| 0613 | 00 10 | E10 |
| 0614 | 00 02 | E2 |
| 0615 | 05 03 | ÷3 |
| 0616 | 08 01 | * RE |
| 0617 | 03 01 | -1 |
| 0618 | 06 14 | ST14 |
| 0619 | 08 01 | * RE |
| 0620 | 02 15 | +15 |
| 0621 | 02 14 | +14 |
| 0622 | 08 13 | * √x |
| 0623 | 08 13 | * √x |
| 0624 | 09 02 | * α |
| 0625 | 10 01 | f1 |
| 0626 | 02 03 | +3 |
| 0627 | 09 02 | * α |
| 0628 | 10 01 | f1 |
| 0629 | 15 13 | D13 |
| 0630 | 12 10 | A10 |
| 0631 | 15 14 | D14 |
| 0632 | 12 08 | A8 |
| 0633 | 07 12 | RE12 |
| 0634 | 08 04 | * Jo |
| 0635 | 08 00 | * S |
| 0636 | 07 05 | RE5 |
| 0637 | 15 14 | D14 |
| 0638 | 12 09 | A9 |
| 0639 | 08 01 | * RE |
| 0640 | 03 08 | -8 |
| 0641 | 06 12 | ST12 |
| 0642 | 09 00 | * M |
| 0643 | 07 05 | RE5 |
| 0644 | 06 15 | ST15 |
| 0645 | 07 03 | RE3 |
| 0646 | 08 13 | * √x |
| 0647 | 06 14 | ST14 |
| 0648 | 00 06 | E6 |
| 0649 | 00 09 | E9 |
| 0650 | 04 14 | ×14 |
| 0651 | 07 07 | RE7 |

| | | | |
|---|---|---|---|
| 0652 | 05 | 14 | ÷14 |
| 0653 | 08 | 12 | * x² |
| 0654 | 08 | 12 | * x² |
| 0655 | 04 | 15 | ×15 |
| 0656 | 06 | 14 | ST14 |
| 0657 | 08 | 01 | * RE |
| 0658 | 04 | 15 | ×15 |
| 0659 | 08 | 04 | * J+ |
| 0660 | 08 | 00 | * S |
| 0661 | 05 | 05 | ÷5 |
| 0662 | 07 | 08 | RE8 |
| 0663 | 03 | 14 | −14 |
| 0664 | 00 | 12 | E12 |
| 0665 | 08 | 05 | * J+ |
| 0666 | 07 | 08 | RE8 |
| 0667 | 06 | 15 | ST15 |
| 0668 | 09 | 00 | * M |
| 0669 | 05 | 05 | ÷5 |
| 0670 | 07 | 15 | RE15 |
| 0671 | 02 | 04 | +4 |
| 0672 | 08 | 01 | * RE |
| 0673 | 05 | 00 | ÷0 |
| 0674 | 06 | 14 | ST14 |
| 0675 | 07 | 04 | RE4 |
| 0676 | 03 | 14 | −14 |
| 0677 | 06 | 15 | ST15 |
| 0678 | 09 | 13 | * IXI |
| 0679 | 06 | 14 | ST14 |
| 0680 | 00 | 09 | E9 |
| 0681 | 00 | 09 | E9 |
| 0682 | 06 | 05 | ST5 |
| 0683 | 03 | 14 | −14 |
| 0684 | 08 | 05 | * J+ |
| 0685 | 08 | 00 | * S |
| 0686 | 06 | 05 | ST5 |
| 0687 | 07 | 15 | RE15 |
| 0688 | 09 | 13 | * IXI |
| 0689 | 05 | 15 | ÷15 |
| 0690 | 04 | 05 | ×5 |
| 0691 | 08 | 01 | * RE |
| 0692 | 05 | 00 | ÷0 |
| 0693 | 06 | 15 | ST15 |
| 0694 | 07 | 05 | RE5 |
| 0695 | 03 | 15 | −15 |
| 0696 | 06 | 04 | ST4 |
| 0697 | 09 | 00 | * M |
| 0698 | 06 | 05 | ST5 |
| 0699 | 07 | 04 | RE4 |
| 0700 | 08 | 05 | * J+ |
| 0701 | 00 | 00 | E0 |
| 0702 | 06 | 04 | ST4 |
| 0703 | 09 | 01 | * ST |
| 0704 | 05 | 00 | ÷0 |
| 0705 | 06 | 14 | ST14 |
| 0706 | 00 | 05 | E5 |
| 0707 | 05 | 14 | ÷14 |
| 0708 | 15 | 13 | D13 |
| 0709 | 12 | 08 | A8 |
| 0710 | 07 | 06 | RE6 |
| 0711 | 06 | 14 | ST14 |
| 0712 | 00 | 05 | E5 |

| | | | |
|---|---|---|---|
| 0713 | 05 | 14 | ÷14 |
| 0714 | 08 | 05 | * J+ |
| 0715 | 00 | 00 | E0 |
| 0716 | 06 | 06 | ST6 |
| 0717 | 15 | 13 | D13 |
| 0718 | 12 | 09 | A9 |
| 0719 | 08 | 01 | * RE |
| 0720 | 02 | 02 | +2 |
| 0721 | 06 | 13 | ST13 |
| 0722 | 10 | 09 | f9 |
| 0723 | 08 | 01 | * RE |
| 0724 | 02 | 09 | +9 |
| 0725 | 04 | 15 | ×15 |
| 0726 | 08 | 01 | * RE |
| 0727 | 05 | 02 | ÷2 |
| 0728 | 06 | 10 | ST10 |
| 0729 | 02 | 15 | +15 |
| 0730 | 08 | 01 | * RE |
| 0731 | 04 | 09 | ×9 |
| 0732 | 06 | 14 | ST14 |
| 0733 | 02 | 10 | +10 |
| 0734 | 08 | 01 | * RE |
| 0735 | 01 | 00 | T0 |
| 0736 | 05 | 14 | ÷14 |
| 0737 | 07 | 13 | RE13 |
| 0738 | 04 | 14 | ×14 |
| 0739 | 02 | 15 | +15 |
| 0740 | 07 | 13 | RE13 |
| 0741 | 05 | 15 | ÷15 |
| 0742 | 08 | 01 | * RE |
| 0743 | 02 | 05 | +5 |
| 0744 | 05 | 15 | ÷15 |
| 0745 | 08 | 01 | * RE |
| 0746 | 02 | 09 | +9 |
| 0747 | 05 | 15 | ÷15 |
| 0748 | 06 | 05 | ST5 |
| 0749 | 08 | 03 | * G0 |
| 0750 | 08 | 03 | * G0 |
| 0751 | 08 | 03 | * G0 |
| 0752 | 08 | 03 | * G0 |
| 0753 | 08 | 01 | * RE |
| 0754 | 04 | 11 | ×11 |
| 0755 | 06 | 14 | ST14 |
| 0756 | 08 | 01 | * RE |
| 0757 | 02 | 09 | +9 |
| 0758 | 04 | 14 | ×14 |
| 0759 | 02 | 10 | +10 |
| 0760 | 09 | 01 | * ST |
| 0761 | 05 | 05 | ÷5 |
| 0762 | 08 | 03 | * G0 |
| 0763 | 08 | 03 | * G0 |
| 0764 | 08 | 03 | * G0 |
| 0765 | 08 | 03 | * G0 |
| 0766 | 08 | 01 | * RE |
| 0767 | 02 | 03 | +3 |
| 0768 | 03 | 15 | −15 |
| 0769 | 00 | 12 | E12 |
| 0770 | 08 | 05 | * J+ |
| 0771 | 00 | 01 | E1 |
| 0772 | 10 | 08 | f8 |
| 0773 | 08 | 01 | * RE |

| | | | | | | |
|---|---|---|---|---|---|---|
| 0774 | 02 | 10 | +10 | 0836 | 09 12 | * I |
| 0775 | 06 | 14 | ST14 | 0837 | 09 01 | * ST |
| 0776 | 07 | 06 | RE 6 | 0838 | 02 04 | +4 |
| 0777 | 08 | 03 | * J₃ | 0839 | 03 06 | -6 |
| 0778 | 03 | 14 | -14 | 0840 | 00 02 | E 2 |
| 0779 | 08 | 05 | * J₅ | 0841 | 00 00 | E 0 |
| 0780 | 00 | 04 | E 4 | 0842 | 05 15 | ÷15 |
| 0781 | 10 | 08 | f 8 | 0843 | 00 10 | E 10 |
| 0782 | 08 | 01 | * RE | 0844 | 00 00 | E 0 |
| 0783 | 01 | 11 | T 11 | 0845 | 00 04 | E 4 |
| 0784 | 06 | 14 | ST14 | 0846 | 02 15 | +15 |
| 0785 | 08 | 01 | * RE | 0847 | 08 01 | * RE |
| 0786 | 03 | 01 | -1 | 0848 | 03 04 | -4 |
| 0787 | 03 | 14 | -14 | 0849 | 02 15 | +15 |
| 0788 | 08 | 01 | * RE | 0850 | 08 01 | * RE |
| 0789 | 02 | 15 | +15 | 0851 | 01 00 | T 0 |
| 0790 | 03 | 14 | -14 | 0852 | 04 15 | ×15 |
| 0791 | 00 | 01 | E 1 | 0853 | 08 01 | * RE |
| 0792 | 03 | 14 | -14 | 0854 | 02 09 | +9 |
| 0793 | 08 | 05 | * J₅ | 0855 | 04 15 | ×15 |
| 0794 | 00 | 07 | E 7 | 0856 | 09 01 | * ST |
| 0795 | 10 | 06 | f 6 | 0857 | 02 06 | +6 |
| 0796 | 00 | 01 | E 1 | 0858 | 00 10 | E 10 |
| 0797 | 03 | 02 | -2 | 0859 | 00 04 | E 4 |
| 0798 | 09 | 04 | * J₀ | 0860 | 00 06 | E 6 |
| 0799 | 08 | 03 | * J₃ | 0861 | 06 14 | ST14 |
| 0800 | 10 | 03 | f 3 | 0862 | 00 10 | E 10 |
| 0801 | 00 | 01 | E 1 | 0863 | 00 08 | E 8 |
| 0802 | 03 | 01 | -1 | 0864 | 03 06 | -6 |
| 0803 | 06 | 14 | ST14 | 0865 | 08 05 | * J₅ |
| 0804 | 00 | 02 | E 2 | 0866 | 00 00 | E 0 |
| 0805 | 03 | 14 | -14 | 0867 | 06 14 | ST14 |
| 0806 | 08 | 04 | * J₀ | 0868 | 07 14 | RE14 |
| 0807 | 08 | 00 | * S | 0869 | 09 01 | * ST |
| 0808 | 08 | 15 | * ½ | 0870 | 03 09 | -9 |
| 0809 | 08 | 01 | * RE | 0871 | 09 01 | * ST |
| 0810 | 02 | 01 | +1 | 0872 | 03 07 | -7 |
| 0811 | 06 | 15 | ST15 | 0873 | 09 00 | * M |
| 0812 | 00 | 01 | E 1 | 0874 | 08 15 | * ½ |
| 0813 | 00 | 08 | E 8 | 0875 | 07 01 | RE 1 |
| 0814 | 04 | 15 | ×15 | 0876 | 00 12 | E 12 |
| 0815 | 15 | 13 | D 13 | 0877 | 08 05 | * J₅ |
| 0816 | 12 | 11 | A 11 | 0878 | 08 00 | * S |
| 0817 | 08 | 01 | * RE | 0879 | 00 01 | E 1 |
| 0818 | 02 | 04 | +4 | 0880 | 08 01 | * RE |
| 0819 | 09 | 04 | * J₀ | 0881 | 04 10 | ×10 |
| 0820 | 08 | 00 | * S | 0882 | 06 15 | ST15 |
| 0821 | 08 | 15 | * ½ | 0883 | 06 14 | ST14 |
| 0822 | 00 | 12 | E 12 | 0884 | 15 13 | D 13 |
| 0823 | 08 | 05 | * J₅ | 0885 | 12 00 | A 0 |
| 0824 | 08 | 00 | * S | 0886 | 09 01 | * ST |
| 0825 | 08 | 15 | * ½ | 0887 | 04 10 | ×10 |
| 0826 | 07 | 06 | RE 6 | 0888 | 03 14 | -14 |
| 0827 | 08 | 13 | * √ | 0889 | 00 12 | E 12 |
| 0828 | 06 | 06 | ST 6 | 0890 | 06 15 | ST15 |
| 0829 | 09 | 12 | * I | 0891 | 00 12 | E 12 |
| 0830 | 03 | 06 | -6 | 0892 | 09 04 | * J₀ |
| 0831 | 06 | 14 | ST14 | 0893 | 08 00 | * S |
| 0832 | 06 | 15 | ST15 | 0894 | 00 02 | E 2 |
| 0833 | 00 | 04 | E 4 | 0895 | 08 05 | * J₅ |
| 0834 | 04 | 14 | ×14 | 0896 | 08 00 | * S |
| 0835 | 06 | 06 | ST 6 | 0897 | 00 02 | E 2 |

| | | | |
|---|---|---|---|
| 0898 | 08 | 01 | * RE |
| 0899 | 04 | 10 | ×10 |
| 0900 | 06 | 15 | ST15 |
| 0901 | 08 | 01 | * RE |
| 0902 | 05 | 04 | ÷4 |
| 0903 | 08 | 04 | * J₀ |
| 0904 | 08 | 00 | * S |
| 0905 | 00 | 02 | E2 |
| 0906 | 15 | 13 | D13 |
| 0907 | 12 | 05 | A5 |
| 0908 | 09 | 02 | * α |
| 0909 | 11 | 01 | F1 |
| 0910 | 06 | 14 | ST14 |
| 0911 | 08 | 01 | * RE |
| 0912 | 02 | 05 | +5 |
| 0913 | 04 | 14 | ×14 |
| 0914 | 09 | 01 | * ST |
| 0915 | 03 | 03 | −3 |
| 0916 | 09 | 01 | * ST |
| 0917 | 03 | 05 | −5 |
| 0918 | 00 | 08 | E8 |
| 0919 | 00 | 03 | E3 |
| 0920 | 09 | 01 | * ST |
| 0921 | 05 | 04 | ÷4 |
| 0922 | 09 | 00 | * M |
| 0923 | 00 | 02 | E2 |
| 0924 | 08 | 01 | * RE |
| 0925 | 05 | 04 | ÷4 |
| 0926 | 06 | 14 | ST14 |
| 0927 | 08 | 01 | * RE |
| 0928 | 04 | 06 | ×6 |
| 0929 | 04 | 15 | ×15 |
| 0930 | 07 | 01 | RE1 |
| 0931 | 08 | 04 | * J₀ |
| 0932 | 08 | 03 | * G₀ |
| 0933 | 07 | 15 | RE15 |
| 0934 | 15 | 11 | D11 |
| 0935 | 02 | 14 | +14 |
| 0936 | 06 | 14 | ST14 |
| 0937 | 07 | 07 | RE7 |
| 0938 | 06 | 13 | ST13 |
| 0939 | 08 | 01 | * RE |
| 0940 | 01 | 10 | T10 |
| 0941 | 06 | 15 | ST15 |
| 0942 | 00 | 02 | E2 |
| 0943 | 08 | 13 | * √x |
| 0944 | 04 | 15 | ×15 |
| 0945 | 03 | 14 | −14 |
| 0946 | 08 | 05 | * J₊ |
| 0947 | 08 | 00 | * S |
| 0948 | 00 | 03 | E3 |
| 0949 | 00 | 03 | E3 |
| 0950 | 00 | 01 | E1 |
| 0951 | 06 | 03 | ST3 |
| 0952 | 06 | 04 | ST4 |
| 0953 | 00 | 00 | E0 |
| 0954 | 06 | 06 | ST6 |
| 0955 | 00 | 01 | E1 |
| 0956 | 00 | 10 | E10 |
| 0957 | 00 | 05 | E5 |
| 0958 | 06 | 07 | ST7 |
| 0959 | 08 | 15 | * % |
| 0960 | 06 | 08 | ST8 |
| 0961 | 00 | 03 | E3 |
| 0962 | 00 | 09 | E9 |
| 0963 | 06 | 05 | ST5 |
| 0964 | 15 | 13 | D13 |
| 0965 | 12 | 02 | A2 |
| 0966 | 02 | 05 | +5 |
| 0967 | 00 | 02 | E2 |
| 0968 | 06 | 15 | ST15 |
| 0969 | 08 | 01 | * RE |
| 0970 | 02 | 04 | +4 |
| 0971 | 09 | 04 | * J₀ |
| 0972 | 08 | 00 | * S |
| 0973 | 00 | 03 | E3 |
| 0974 | 08 | 02 | * W |
| 0975 | 03 | 00 | −0 |
| 0976 | 02 | 15 | +15 |
| 0977 | 06 | 14 | ST14 |
| 0978 | 15 | 11 | D11 |
| 0979 | 07 | 15 | RE15 |
| 0980 | 06 | 15 | ST15 |
| 0981 | 00 | 03 | E3 |
| 0982 | 02 | 14 | +14 |
| 0983 | 15 | 11 | D11 |
| 0984 | 07 | 14 | RE14 |
| 0985 | 15 | 11 | D11 |
| 0986 | 04 | 15 | ×15 |
| 0987 | 00 | 00 | E0 |
| 0988 | 09 | 01 | * ST |
| 0989 | 02 | 04 | +4 |
| 0990 | 10 | 03 | f3 |
| 0991 | 09 | 00 | * M |
| 0992 | 00 | 03 | E3 |
| 0993 | 07 | 13 | RE13 |
| 0994 | 06 | 07 | ST7 |
| 0995 | 09 | 04 | * J₀ |
| 0996 | 08 | 00 | * S |
| 0997 | 00 | 04 | E4 |
| 0998 | 08 | 01 | * RE |
| 0999 | 02 | 06 | +6 |
| 1000 | 06 | 15 | ST15 |
| 1001 | 08 | 01 | * RE |
| 1002 | 05 | 05 | ÷5 |
| 1003 | 03 | 15 | −15 |
| 1004 | 08 | 05 | * J₊ |
| 1005 | 08 | 00 | * S |
| 1006 | 00 | 04 | E4 |
| 1007 | 09 | 04 | * J₀ |
| 1008 | 08 | 00 | * S |
| 1009 | 00 | 04 | E4 |
| 1010 | 08 | 01 | * RE |
| 1011 | 02 | 01 | +1 |
| 1012 | 04 | 15 | ×15 |
| 1013 | 09 | 02 | * α |
| 1014 | 11 | 04 | F4 |
| 1015 | 06 | 15 | ST15 |
| 1016 | 07 | 00 | RE0 |
| 1017 | 06 | 14 | ST14 |
| 1018 | 08 | 01 | * RE |
| 1019 | 05 | 03 | ÷3 |

| | | | | | | | |
|---|---|---|---|---|---|---|---|
|1020|02|14|+14| |1084|11|14|F14|
|1021|08|01|* RE| |1085|10|10|f10|
|1022|01|10|T10| |1086|08|01|* RE|
|1023|03|14|−14| |1087|04|03|×3|
|1024|08|05|* J5| |1088|04|15|×15|
|1025|08|00|* S| |1089|09|01|* ST|
|1026|00|05|E5| |1090|02|15|+15|
|1027|08|01|* RE| |1091|09|00|* M|
|1028|04|03|×3| |1092|00|01|E1|
|1029|02|15|+15| |1093|08|01|* RE|
|1030|09|01|* ST| |1094|01|10|T10|
|1031|04|03|×3| |1095|06|07|ST7|
|1032|08|00|* S| |1096|08|01|* RE|
|1033|00|04|E4| |1097|01|11|T11|
|1034|09|00|* M| |1098|06|06|ST6|
|1035|00|05|E5| |1099|09|01|* ST|
|1036|08|01|* RE| |1100|03|02|−2|
|1037|04|05|×5| |1101|08|01|* RE|
|1038|02|15|+15| |1102|05|03|÷3|
|1039|09|01|* ST| |1103|06|08|ST8|
|1040|04|05|×5| |1104|10|02|f2|
|1041|09|00|* M| |1105|09|01|* ST|
|1042|00|04|E4| |1106|02|11|+11|
|1043|07|01|RE1| |1107|00|12|E12|
|1044|06|14|ST14| |1108|06|14|ST14|
|1045|08|04|* J4| |1109|07|07|RE7|
|1046|08|00|* S| |1110|02|14|+14|
|1047|00|06|E6| |1111|09|01|* ST|
|1048|06|03|ST3| |1112|02|12|+12|
|1049|11|14|F14| |1113|07|00|RE0|
|1050|08|01|* RE| |1114|06|14|ST14|
|1051|02|06|+6| |1115|08|01|* RE|
|1052|06|14|ST14| |1116|02|11|+11|
|1053|07|04|RE4| |1117|02|14|+14|
|1054|05|14|÷14| |1118|10|02|f2|
|1055|07|07|RE7| |1119|06|14|ST14|
|1056|05|14|÷14| |1120|08|01|* RE|
|1057|09|01|* ST| |1121|04|07|×7|
|1058|04|04|×4| |1122|02|14|+14|
|1059|08|00|* S| |1123|08|01|* RE|
|1060|00|01|E1| |1124|04|08|×8|
|1061|09|00|* M| |1125|03|14|−14|
|1062|00|06|E6| |1126|09|01|* ST|
|1063|08|01|* RE| |1127|03|00|−0|
|1064|03|01|−1| |1128|00|12|E12|
|1065|06|14|ST14| |1129|06|14|ST14|
|1066|08|01|* RE| |1130|07|06|RE6|
|1067|02|15|+15| |1131|06|07|ST7|
|1068|02|14|+14| |1132|07|00|RE0|
|1069|15|13|D13| |1133|02|14|+14|
|1070|12|14|A14| |1134|08|01|* RE|
|1071|07|07|RE7| |1135|04|07|×7|
|1072|09|04|* J4| |1136|02|14|+14|
|1073|08|00|* S| |1137|10|02|f2|
|1074|00|01|E1| |1138|09|01|* ST|
|1075|00|00|E0| |1139|02|14|+14|
|1076|06|03|ST3| |1140|07|06|RE6|
|1077|11|14|F14| |1141|06|14|ST14|
|1078|10|10|f10| |1142|08|01|* RE|
|1079|08|01|* RE| |1143|02|11|+11|
|1080|04|05|×5| |1144|03|14|−14|
|1081|04|15|×15| |1145|10|02|f2|
|1082|09|01|* ST| |1146|09|01|* ST|
|1083|03|01|−1| |1147|02|13|+13|

| | | | |
|---|---|---|---|
| 1148 | 00 | 12 | E12 |
| 1149 | 06 | 14 | ST14 |
| 1150 | 07 | 06 | RE6 |
| 1151 | 02 | 14 | +14 |
| 1152 | 07 | 06 | RE6 |
| 1153 | 06 | 15 | ST15 |
| 1154 | 08 | 01 | * RE |
| 1155 | 02 | 14 | +14 |
| 1156 | 03 | 15 | -15 |
| 1157 | 04 | 14 | ×14 |
| 1158 | 09 | 04 | * J. |
| 1159 | 08 | 00 | * S |
| 1160 | 00 | 00 | E0 |
| 1161 | 00 | 04 | E4 |
| 1162 | 00 | 04 | E4 |
| 1163 | 06 | 05 | ST5 |
| 1164 | 00 | 00 | E0 |
| 1165 | 06 | 15 | ST15 |
| 1166 | 09 | 00 | * M |
| 1167 | 03 | 08 | -8 |
| 1168 | 00 | 01 | E1 |
| 1169 | 02 | 05 | +5 |
| 1170 | 15 | 11 | D11 |
| 1171 | 07 | 05 | RE5 |
| 1172 | 02 | 15 | +15 |
| 1173 | 06 | 14 | ST14 |
| 1174 | 07 | 06 | RE6 |
| 1175 | 03 | 14 | -14 |
| 1176 | 08 | 05 | * J. |
| 1177 | 08 | 00 | * S |
| 1178 | 03 | 08 | -8 |
| 1179 | 15 | 11 | D11 |
| 1180 | 03 | 05 | -5 |
| 1181 | 09 | 00 | * M |
| 1182 | 04 | 08 | ×8 |
| 1183 | 00 | 05 | E5 |
| 1184 | 00 | 01 | E1 |
| 1185 | 06 | 14 | ST14 |
| 1186 | 00 | 01 | E1 |
| 1187 | 02 | 05 | +5 |
| 1188 | 03 | 14 | -14 |
| 1189 | 09 | 04 | * J. |
| 1190 | 08 | 03 | * Go |
| 1191 | 10 | 00 | f0 |
| 1192 | 00 | 00 | E0 |
| 1193 | 15 | 11 | D11 |
| 1194 | 06 | 05 | ST5 |
| 1195 | 08 | 00 | * S |
| 1196 | 04 | 08 | ×8 |
| 1197 | 09 | 00 | * M |
| 1198 | 10 | 03 | f3 |
| 1199 | 00 | 03 | E3 |
| 1200 | 00 | 00 | E0 |
| 1201 | 06 | 02 | ST2 |
| 1202 | 07 | 00 | RE0 |
| 1203 | 08 | 02 | * W |
| 1204 | 04 | 02 | ×2 |
| 1205 | 08 | 01 | * RE |
| 1206 | 05 | 03 | ÷3 |
| 1207 | 08 | 02 | * W |
| 1208 | 04 | 02 | ×2 |
| 1209 | 07 | 06 | RE6 |
| 1210 | 08 | 02 | * W |
| 1211 | 06 | 02 | ST2 |
| 1212 | 08 | 01 | * RE |
| 1213 | 05 | 00 | ÷0 |
| 1214 | 08 | 02 | * W |
| 1215 | 05 | 02 | ÷2 |
| 1216 | 08 | 01 | * RE |
| 1217 | 03 | 01 | -1 |
| 1218 | 06 | 14 | ST14 |
| 1219 | 08 | 01 | * RE |
| 1220 | 02 | 15 | +15 |
| 1221 | 02 | 14 | +14 |
| 1222 | 08 | 02 | * W |
| 1223 | 00 | 02 | E2 |
| 1224 | 08 | 01 | * RE |
| 1225 | 04 | 13 | ×13 |
| 1226 | 06 | 14 | ST14 |
| 1227 | 08 | 01 | * RE |
| 1228 | 04 | 06 | ×6 |
| 1229 | 04 | 14 | ×14 |
| 1230 | 08 | 02 | * W |
| 1231 | 08 | 02 | * W |
| 1232 | 07 | 05 | RE5 |
| 1233 | 08 | 02 | * W |
| 1234 | 07 | 02 | RE2 |
| 1235 | 07 | 10 | RE10 |
| 1236 | 08 | 02 | * W |
| 1237 | 10 | 02 | f2 |
| 1238 | 08 | 02 | * W |
| 1239 | 10 | 15 | f15 |
| 1240 | 09 | 15 | * RI |
| 1241 | 09 | 00 | * M |
| 1242 | 10 | 08 | f8 |
| 1243 | 06 | 15 | ST15 |
| 1244 | 08 | 01 | * RE |
| 1245 | 15 | 06 | D6 |
| 1246 | 08 | 02 | * W |
| 1247 | 02 | 09 | +9 |
| 1248 | 10 | 03 | f3 |
| 1249 | 00 | 09 | E9 |
| 1250 | 09 | 01 | * ST |
| 1251 | 05 | 00 | ÷0 |
| 1252 | 09 | 01 | * ST |
| 1253 | 05 | 01 | ÷1 |
| 1254 | 15 | 11 | D11 |
| 1255 | 00 | 15 | E15 |
| 1256 | 15 | 14 | D14 |
| 1257 | 12 | 14 | A14 |
| 1258 | 10 | 00 | f0 |
| 1259 | 15 | 14 | D14 |
| 1260 | 12 | 10 | A10 |
| 1261 | 10 | 00 | f0 |
| 1262 | 15 | 14 | D14 |
| 1263 | 12 | 15 | A15 |
| 1264 | 10 | 00 | f0 |
| 1265 | 09 | 14 | * LP |

The present invention may thus be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. In an apparatus for simulating the circulating of a fluid in the circulation system of an oil well extending from the surface of the earth to a point intersecting an underground formation, which apparatus is used in conjunction with a programmable digital calculator programmed to calculate fluid pressure at a plurality of points in the circulation system, wherein the apparatus includes:

manually adjustable means for indicating the pump rate of a pump in the circulation system;

manually adjustable means for indicating the density of the fluid being pumped;

manually adjustable means for indicating the relative opening of a choke in the circulation system;

manually adjustable means for indicating the opened and closed positions of a blowout preventer in the circulation system;

manually adjustable means for indicating the opened and closed positions of a valve controlling fluid communication between the choke and the oil well annulus in the circulation system; and, display means for displaying a plurality of fluid pressures calculated by the programmable calculator in response to the indicated pump rate, density of the fluid being pumped, the relative opening of the choke, the position of the blowout preventer, and the position of the valve, wherein the display includes at least the fluid pressure in a standpipe and the fluid pressure in an oil well casing in the circulation system; the improvement comprising:

first circuit means, responsive to changes in the manually adjustable pump rate indicating means, for providing to the digital programmable calculator at least periodically a digital representation of the pump rate and a digital repesentation of a sum of pumping strokes for the pump in the circulation system; and, second circuit means, responsive to changes in the manufally adjustable relative choke opening indicating means, for providing to the digital programmable calculator at least periodically a digital representation of the choke opening.

2. The apparatus of claim 1 wherein said first circuit means comprises:

first signal generating means responsive to said manually adjustable pump rate indicator means for generating an electrical signal whose amplitude varies with the adjustment of said manually adjustable pump rate indicating means;

second signal generating means responsive to said first signal generating means for generating a train of electrical pulses whose frequency varies with the amplitude of the electrical signal from said first signal generating means, wherein each pulse represents a stroke of the pump in said circulating system;

first electrical counting means, responsive to said train of electrical pulses, for counting the pulses from said second signal generating means; and, said apparatus includes:

output transmission circuit means, responsive to control signals from said programmable calculator, for transmitting a digital representation of the number of pulses counted by said electrical counting means to said programmable calculator in response to a control signal from said programmable calculator.

3. The apparatus of claim 2 wherein said first circuit means further comprises:

second electrical counting means, responsive to said train of electrical pulses, for periodically counting the pulses from said second signal generating means; and wherein said transmission circuit means additionally transmits to said calculator a digital representation of the pulses counted during said period by said second electrical counting means.

4. The apparatus of claim 2 wherein said first circuit means further comprises:

a plurality of serially connected dividing circuit means for dividing the number of the pulses from said second signal generating means; and, selective circuit means for selectively connecting one of said dividing circuit means to said first electrical counting means, thereby counting the divided number of pulses from said selected dividing circuit means.

5. The apparatus of claim 4 wherein said first counting means include a reset means for resetting the counting means to zero.

6. The apparatus of claim 5 wherein said first circuit means further comprises thumper circuit means for generating an audio sound responsive to each pulse from the last of said serially connected dividing circuit means.

7. The apparatus of claim 2 wherein said apparatus further comprises:

sensing means, responsive to the display of standpipe pressure of said display means, for providing an electrical signal proportional to the magnitude of the standpipe pressure being displayed; and, wherein said second signal generating means of said first circuit means is additionally responsive to the electrical signal of said sensing means for varying the frequency of said train of pulses inversely proportionally to the amplitude of the electrical signal of said sensing means.

8. The apparatus of claim 1 wherein said second circuit means comprises:

third signal generating means, responsive to said manually adjustable choke opening indicating means, for generating an electrical signal whose amplitude varies with the adjustment of said manually adjustable choke opening indicating means;

fourth signal generating means, responsive to the signal from said thrid signal generating means, for generating a train of electrical pulses whose frequency varies with the amplitude of the electrical signal from said first signal generating means;

third electrical means, including a manually adjustable switch, responsive to the train of electrical pulses from said fourth signal generating means, for counting up in response to the pulses from said fourth signal generating means thereby representing an incremental increase in the opening of the choke when said switch is in a first position, and for counting down in response to the pulses from said fourth signal generating means when said switch is in a second position, thereby representing an incremental decrease in the opening of the choke in the circulation system; and, wherein said output transmission circuit means additionally transmits a digital representation of the number of pulses counted by said third electrical counting means.

9. The apparatus of claim 8 wherein said third electrical counting means comprises:

up and down counting means having an up counting terminal and a down counting terminal, wherein pulses received at said up counting terminal cause said counting means to count up and pulses received at said down counting terminal cause said counting means to count down;

a pair of gate means having a gate control terminal and a data terminal for passing data appearing at said data terminal concurrently with the appearance of a control signal at said control terminal, one of said gate means being connected to said up counting terminal and the other of said gate means being connected to said down counting terminal;

data conducting means for providing data communication between said fourth signal generating means and each of said data terminals of said gate means;

a pair of normally open signal shaping circuit means, one connected to each of said gate control terminals of said gate means, for supplying a control signal to the control gate of said gate means when said normally open circuit means is closed; and, siwtch means having at least two positions for closing one normally open circuit means when said switch is in a first position, and for closing the other normally open circuit means when said switch is in a second position, thereby causing said pulses from said fourth signal generating means to count up and down dependent on the position of said switch means.

10. The apparatus of claim 1 further comprising:

input transmission circuit means for transmitting a digital representation of said fluid pressures from said digital calculator to said apparatus;

digital-to-analog means, connected to said input transmission circuit means, for converting said digital representations to an electrical signal whose amplitude varies responsive to said digital representation; and, smoothing circuit means, responsive to said electrical signal, for smoothing the change of said electrical signal from one amplitude to another.

11. The apparatus of claim 1 further comprising:

a first delay circuit means, controlled by said blowout preventer position indicating means, for delaying the indication from one position to the second position of said manually adjustable preventer position means until a predetermined period after the changing of said manually adjustable preventer position means; and a second delay circuit means, controlled by said valve position indicating means, for delaying the indication from one position to the second position of said manually adjustable valve position means until a predetermined period after the changing of said manually adjustable valve position means.

12. The apparatus of claim 11 wherein said second delay circuit interrupts said display of the casing pressure and causes said second circuit means to provide to the digital programmable calculator a digital representation indicating the choke is fully closed.

13. An apparatus for simulating the circulating of a fluid in a circulation system for an oil well extending from the surface of the earth to a point intersecting an underground formation comprising:

manually adjustable means for indicating the pump rate of a pump in the circulation system;

manually adjustable means for indicating the density of the fluid being pumped;

manually adjustable means for indicating the relative opening of a choke in the circulation system;

manually adjustable means for indicating the opened and closed positions of a blowout preventer in the circulation system;

manually adjustable means for indicating the opened and closed positions of a valve controlling fluid communication between the choke and the oil well annulus in the circulation system;

a programmable digital calculator means for receiving signals from said pump rate indicating means, said fluid density indicating means, said relative opening of choke indicating means, said blowout preventer position indicating means, said valve position indicating means, and for generating digital signals, responsive to said received signals, representative of the value of fluid pressure at a plurality of points in the circulation system;

digital calculating means, in said programmable digital calculator for subtracting a value of a fluid pressure for the bottom of the oil well, which is generated by said programmable digital calculator responsive to said received signals, from a value representing the pressure of the formation, and for multiplying the resultant times the product of a value representing the rate of penetration of a bit in the oil well and the number 10 raised to the power of −4, thereby determining the value of fluid volume invading the well bore, and for providing a digital signal representing a value of pressure in a standpipe and a casing in the oil well responsive to said received signals and said determined value of invading fluid volume; and, display means, responsive to said digital signals for displaying said fluid pressure values, including at least the fluid pressure in said standpipe and the fluid pressure in said casing of the oil well circulation system.

14. The apparatus of claim 13 wherein said digital calculating means further provides for summing the value of fluid pressure for the bottom of the oil well, which is generated by said programmable digital calculator responsive to said received signals, with a selected fractional portion of an unrelated, time dependent real number, thereby determining a value of the pressure of the formation.

15. The apparatus of claim 14 wherein said unrelated, time dependent real number is a value of a fluid pressure generated by said programmable calculator responsive to said received signals.

16. The apparatus of claim 15 wherein said digital calculating means further provides for determining said real number in accordance with the equation:

$$(P+2)^{1/i} - INT(P+2)^{1/i};$$

where:

$P$ is said value of fluid pressure;

$INT$ indicates that portion of the value in the expression to the left of the decimal point; and, $i$ is a small number.

17. The apparatus of claim 16 wherein said value of pressure is the value of pressure in the standpipe displayed by sais display means.

18. The apparatus of claim 13 wherein said digital calculating means further provides for summing a value of a flow rate determined from the signal of said pump rate indicating means, with the product of said volume of invading fluid raised to the power of $1/n$, and adding the resultant sum with the number ten; where $n$ is a number in the range of 2 to 10, thereby determining the flow rate of the fluid flowing from said oil well.

19. The apparatus of claim 13 wherein said digital calculating means further provides for summing a value of circulating pressure losses in the annulus, a value of circulating pressure losses in a drill string in the oil well, and a value of circulating pressure losses across a bit in the oil well, all generated by said programmable digital calculator responsive to said received signal; and, for multiplying said sum by 1.02, thereby determining a value representative of circulating pressure losses in surface equipment of said circulation system.

20. The apparatus of claim 13 wherein said pump rate indicating means comprises first circuit means, responsive to the adjustment of said pump rate indicating means, for providing to said digital programmable calculator at least periodically a digital representation of the pump rate and a digital representation of a sum of pumping strokes for the pump in the circulation system.

21. The apparatus of claim 20 wherein said first circuit means comprises:
  first signal generating means responsive to said manually adjustable pump rate indicator means for generating an electrical signal whose amplitude varies with the adjustment of said manually adjustable pump rate indicating means;
  second signal generating means responsive to said first signal generating means for generating a train of electrical pulses whose frequency varies with the amplitude of the electrical signal from said first signal generating means, wherein each pulse represents a stroke of the pump in said circulating system;
  first electrical counting means, responsive to said train of electrical pulses, for counting the pulses from said second signal generating means; and, said apparatus includes;
  output transmission circuit means, responsive to control signals from said programmable calculator, for transmitting a digital representation of the number of pulses counted by said electrical counting means to said programmable calculator in response to a control signal from said programmable calculator.

22. The apparatus of claim 21 wherein said first circuit means further comprises:
  second electrical counting means, responsive to said train of electrical pulses, for periodically counting the pulses from said second signal generating means; and,
  wherein said transmission circuit means additionally transmits to said calculator a digital representation of the pulses counted during said period by said second electrical counting means.

23. The apparatus of claim 21 wherein said first circuit means further comprises:
  a plurality of serially connected divided circuit means for dividing the number of the pulses from said second signal generating means; and,
  selective circuit means for selectively connecting one of said dividing circuit means to said first electrical counting means, thereby counting the divided number of pulses from said selected dividing circuit.

24. The apparatus of claim 23 wherein said first counting means includes a reset means for resetting the counting means to zero.

25. The apparatus of claim 24 wherein said first circuit means further comprises thumper circuit means for generating an audio sound responsive to each pulse from the last of said serially connected dividing circuit means.

26. The apparatus of claim 21 wherein said apparatus further comprises:
  sensing means, responsive to the display of standpipe pressure of said display means, for providing an electrical signal proportional to the magnitude of the standpipe pressure being displayed; and,
  wherein said second signal generating means of said first circuit means is additionally responsive to the electrical signal of said sensing means for varying the frequency of said train of pulses inversely proportionally to the amplitude of the electrical signal of said sensing means.

27. The apparatus of claim 13 wherein said relative opening of choke indicating means comprises second circuit means, responsive to the adjustment of said choke indicating means, for providing to the digital programmable calculator at least periodically a digital repesentation of the choke opening.

28. The apparatus of claim 27 wherein said second circuit means comprises:
  third signal generating means, responsive to said manually adjustable choke opening indicating means, for generating an electrical signal whose amplitude varies with the adjustment of said manually adjustable choke opening indicating means;
  fourth signal generating means, responsive to the signal from said third signal generating means, for generating a train of electrical pulses whose frequency varies with the amplitude of the electrical signal from said first signal generating means;
  third electrical counting means, including a manually adjustable switch, responsive to the train of electrical pulses from said fourth signal generating means, for counting up in response to the pulses from said fourth signal generating means thereby representing an incremental increase in the opening of the choke when said switch is in a first position, and for counting down in response to the pulses from said fourth signal generating means when said switch is in a second position, thereby representing an incremental decrease in the opening of the choke in the circulation system; and,
  wherein said output transmission circuit means additionally transmits a digital representation of the number of pulses counted by said third electrical counting means.

29. The apparatus of claim 28 wherein said third electrical counting means comprises:
  up and down counting means having an up counting terminal and a down counting terminal, wherein pulses received at said up counting terminal cause said counting means to count up and pulses received at said down counting terminal cause said counting means to count down;
  a pair of gate means having a gate control terminal and a data terminal for passing data appearing at said data terminal concurrently with the appearance of a control signal at said control terminal, one of said gate means being connected to said up counting terminal and the other of said gate means being connected to said down counting terminal;
  data conducting means for providing data communication between said fourth signal generating means and each of said data terminals of said gate means;
  a pair of normally open signal shaping circuit means, one connected to each of said gate control terminals of said gate means, for supplying a control signal to the control gate of said gate means when said normally open circuit means is closed; and,
  switch means having at least two positions for closing one normally open circuit means when said switch is in a first position, and for closing the other normally open circuit means when said switch is in a second position thereby causing said pulses from said fourth signal generating means to count up and down dependent on the position of said switch means.

30. The apparatus of claim 13 further comprising:
input transmission circuit means for transmitting a digital representation of said fluid pressures from said digital calculator to said apparatus;
digital-to-analog means, connected to said input transmission circuit means, for converting said digital representations to an electrical signal whose amplitude varies responsive to said digital representation; and,
smoothing circuit means, responsive to said electrical signal, for smoothing the change of said electrical signal from one amplitude to another.

31. The apparatus of claim 13 further comprising:
a first delay circuit means, controlled by said blowout preventer position indicating means, for delaying the indication from one position to the second position of said manually adjustable preventer position means until a predetermined period after the changing of said manually adjustable preventer position means; and
a second delay circuit means, controlled by said valve position indicating means, for delaying the indication from one position to the second position of said manually adjustable valve position means until a predetermined period after the changing of said manually adjustable valve position means.

32. The apparatus of claim 31 wherein said second delay circuit interrupts said display of the casing pressure and causes said second circuit means to provide to the digital programmable calculator a digital representation indicating the choke is fully closed.

33. An apparatus for simulating the circulation of fluids through a circulation system of an oil well extending from the surface of the earth to a point intersecting an underground formation comprising:
a plurality of data register means for storing digital values representing the volume of fluids in said oil well;
digital calculating means for determining and storing in one of said data register means a value representing the volume of formation fluid in said oil well determined responsively to a value of fluid pressure at the bottom of the oil well, a value of pressure of the formation and the depth of formation fluid;
manually adjustable pump rate indicating means for determining and storing in one of said data register means a value representing the volume of drilling fluid being introduced into said oil well responsive to the adjustment of said pump rate indicating means;
said digital calculating means further including means for determining a value representing the volume of fluid being displaced from said oil well by the values of said formation fluid volume and said introduced drilling fluid volume; and,
display means for displaying said volume of fluid displaced from said oil well by said formation fluid in said oil well thereby simulating the circulation of fluids through said oil well.

34. The apparatus of claim 33 wherein said plurality of data register means includes:

a VP1 data register for storing a value representing the volume of new drilling fluid in a drill string in the circulation system;
a VP2 data register for storing a value representing the volume of old drilling fluid in the drill string;
a VA2 data register for storing a value representing a first volume of formation fluid in the annulus of said oil well;
a VA4 data register for storing a value representing a second volume of formation fluid in the annulus;
a VA6 data register for storing a value representing the volume of new drilling fluid in the annulus below said invading fluid volumes;
a VA5 data register for storing a value representing the volume of old drilling fluid in the annulus below said invading fluid volumes;
a VA3 data register of storing a value representing the volume of drilling fluid in the annulus between said invading fluid volumes; and,
a VA1 data register for storing a value representing the volume of drilling fluid in the annulus above said invading fluid volumes.

35. The apparatus of claim 34 wherein said digital calculating means additionally provides for subtracting a migration value $\Delta M$ from the data register representing the drilling fluid above each formation fluid volume in the annulus, and adding said migration value to the data register representing the drilling fluid below each formation fluid volume;
wherein said migration value is calculated in accordance with the equation:

$$\Delta M = n(\rho'/6):$$

where:
$n$ is the power law flow behavior index for laminar flow; and,
$\rho'$ is the density in psi/ft. of the drilling fluid immediately above the formation fluid in the annulus, thereby simulating the migration of said formation fluid volumes in the annulus.

36. The apparatus of claim 35 wherein said digital calculating means additionally provides for determining the length of each value of volume in said plurality of data register means; and, said apparatus further comprising gas sound circuit means for generating an audio gas sound when said formation fluid volume representations stored in data registers VA2 and VA4 are at the earth's surface as determined by said determined lengths.

37. A method of simulating the circulating of a fluid in the circulation system of an oil well extending from the surface of the earth to a point intersecting an underground formation comprising the steps of:
generating a first train of pulses, responsive to a manually adjustable pump rate indicating means, whose frequency varies with the adjustment of said pump rate indicating means;
generating a second train of pulses, responsive to a manually adjustable choke opening and closing indicating means and a manually adjustable choke rate indicating means, wherein the frequency of said pulse train varies with the adjustment of said choke rate means and the sign of the pulses varies with the adjustment of said choke opening and closing means;
counting, during a set period of time, the pulses in said first train of pulses whereby the number counted represents the number of pulses generated during the period;

counting the pulses in said second pulse train whereby the number is increased when the pulses are of one sign, and the number is decreased when the pulses are of a second sign;

transmitting the numbers counted in said counting steps, at least periodically, to a programmable digital calculator programmed to calculate fluid pressures at a plurality of points in said circulation system responsive to said transmitted numbers;

transmitting from said programmable digital calculator to a display means at least the values of standpipe pressure and casing pressure calculated by said calculator responsive to said transmitted numbers; and, displaying the values of said standpipe pressure and said casing pressure.

38. The method of claim 37 further comprising the step of:

generating an audio pulse sound responsive to said manually adjustable pump indicating means thereby simulating the sound of a pump in the circulation system.

39. The method of claim 37 further comprising the step of additionally varying the frequency of said first train of pulses responsive to the value of standpipe pressure transmitted by said programmable digital calculator.

40. The method of claim 39 further comprising the steps of:

inhibiting the display of casing pressure a set period of time after changing a manually adjustable valve position indicating means for an open position to a closed position; and, inhibiting for a set period of time after changing said valve position indicating means from said open position to said closed position, the transmission of the number counted in the step of counting the second train of pulses.

41. The method of claim 37 further comprising the step of smoothing the change in successive values of said standpipe pressure and said casing pressure prior to the displaying step.

42. A method of simulating the circulation of fluids through a circulation system of an oil well extending from the surface of the earth to a point intersecting an underground formation comprising the steps of:

storing in a plurality of data register means, digital values representing the volume of fluids in said oil well;

determining a value representing the volume of formation fluid in said oil well, with a digital calculating means responsively to a value of fluid pressure at the bottom of the oil well, a value of pressure of the formation, and the depth of the formation fluid;

storing said value of formation fluid volume in one of said data register means;

determining a value representing the volume of drilling fluid being introduced into said oil well responsive to the adjustment of a manually adjustable pump rate indicating means;

storing said volume of drilling fluid in one of said data register means;

determining a value representing the volume of fluid being displaced from said oil well, with said digital calculating means responsive to said values of formation fluid volume and drilling fluid volume introduced in the well; and, displaying said volume of fluid displaced from said oil well by said formation fluid in said oil well, thereby simulating the circulation of fluids through said oil well.

43. The method of claim 42 further comprising the steps of:

subtracting a migration value $\Delta M$ from the value stored in one of said data register means representing the drilling fluid above a formation fluid volume in the annulus; and, adding said migration value to one of said data register means representing the drilling fluid below said formation fluid volume;

wherein said migration value is calculated in accordance with the equation:

$$\Delta M = n(\rho'/6);$$

where;

$n$ is the power law flow bahavior index for laminar flow, and $\pi'$ is the density in psi/ft of the drilling fluid immediately above the formation fluid in the annulus, thereby simulating the migration of said formation fluid volumes in the annulus.

44. The method of claim 43 further comprising the steps of:

determining, with said digital calculator means, the length of each value of volume in said plurality of data register means;

determining, with said digital calculator means responsive to said lengths, when said formation fluid volume representation stored in said data register means is at the earth's surface; and, generating an audio gas sound responsive to said determination of the formation fluid arriving at the earth's surface.

45. In an apparatus having a manually adjustable rate indicating means; manually adjustable polarity means; circuit means for generating a train of pulses whose frequency varies with the adjustment of said rate indicating means, and whose polarity varies with the adjustment of said polarity indicating means; the method of simulating a circulation system in an oil well comprising:

counting the pulses in said train of pulses by counting up when counting pulses of one polarity, and counting down when counting pulses of a second polarity; and, calculating the value of fluid pressure at a plurality of points responsive to the number counted in the counting step where said number counted by said counter represents one of; the relative opening of a choke in the circulation system, the relative position of a drill string in the circulation system, and the pump rate of a pump in the circulation.

* * * * *

UNITED STATES PATENT AND TRADEMARK OFFICE
CERTIFICATE OF CORRECTION

PATENT NO. : 3,971,926
DATED : July 27, 1976
INVENTOR(S) : Gerald S. Gau and Mario Zamora It is certified that error appears in the above-identified patent and that said Letters Patent are hereby corrected as shown below:

Column 8, line 29, delete the word "gates" and insert therefor the word --panel--;

Column 19, line 1, equation (10), the last expression in the numerator which reads as follows: "(1+a(i)/2" should read: --(1+a(i)/2)--;

Column 19, line 49, equation (14), the expression in the numerator which reads as follows: "$(20.67\ KR_u(i)^n)$" should read: --$(20.67\ KR_p(i)^n)$--;

Column 19, line 66, equation (15) which reads as follows: "$b = (1.75-\log_{10}n)7.0$" should read: --$b = (1.75-\log_{10}n)/7.0$--

Column 20, line 12, equation (18), the denominator which reads as follows: "$(\ell^{2/n}/n\ell^2)\ ((\ell^2-1)/(\ell^{2/n}-1)))$" should read: --$((\ell^{2/n}/n\ell^2)\ ((\ell^2-1)/(\ell^{2/n}-1)))$--;

Column 20, line 54, after the word during, delete "(CP)" and insert therefor the words --circulation through--;

Column 20, line 55, after the word losses, delete ") the D" and insert therefor the words --across the choke--;

UNITED STATES PATENT AND TRADEMARK OFFICE
CERTIFICATE OF CORRECTION

PATENT NO. : 3,971,926
DATED : July 27, 1976
INVENTOR(S) : Gerald S. Gau and Mario Zamora It is certified that error appears in the above-identified patent and that said Letters Patent are hereby corrected as shown below:

Column 21, line 39, after the word students, delete "+";

Column 21, line 49, equation (26), the limits of the summation which reads as follows: "$\big|_0^{De+}$" should read: $-\big|_0^{D_e}--$;

Column 21, line 51, the expression which reads as follows: "$(\xi H_a 30 \xi P_a)\big|_0^{D_e} = \ldots$" should read: $--(\xi H_a + \xi P_a)\big|_0^{D_e} = \ldots --$ Column 25, line 53, equation (40), the last expression which reads as follows: "$(\pi' + 0.04 + N/20)$" should read: $--(\rho' + 0.04 + N/20)--$;

Column 25, line 58, equation (40), delete the symbol "$\pi'$" and insert therefor $--\rho'--$;

Column 30, line 4, delete the number "176" and insert therefor --276--;

IN THE CLAIMS

Column 70, line 50 (claim 8) after the word electrical insert --counting--

Column 78, line 29, (claim 43) delete "$\pi'$" and insert therefor $--\rho'--$;

Signed and Sealed this

Twenty-sixth Day of October 1976

[SEAL]

Attest:

RUTH C. MASON
*Attesting Officer*

C. MARSHALL DANN
*Commissioner of Patents and Trademarks*